US012751044B2

(12) United States Patent
Castro et al.

(10) Patent No.: US 12,751,044 B2
(45) Date of Patent: Sep. 29, 2026

(54) THIN FILM TRANSISTORS AND RELATED FABRICATION TECHNIQUES

(71) Applicant: Micron Technology, Inc., Boise, ID (US)

(72) Inventors: Hernan A. Castro, Shingle Springs, CA (US); Stephen W. Russell, Boise, ID (US); Stephen H. Tang, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 421 days.

(21) Appl. No.: 18/417,830

(22) Filed: Jan. 19, 2024

(65) Prior Publication Data

US 2024/0237364 A1 Jul. 11, 2024

Related U.S. Application Data

(62) Division of application No. 17/332,640, filed on May 27, 2021, now Pat. No. 11,903,223, which is a (Continued)

(51) Int. Cl.
*H10D 30/67* (2025.01)
*H10D 30/01* (2025.01)
(Continued)

(52) U.S. Cl.
CPC ....... *H10D 30/6728* (2025.01); *H10D 30/031* (2025.01); *H10D 30/6729* (2025.01); (Continued)

(58) Field of Classification Search
CPC ........... H10D 30/6728; H10D 30/6729; H10D 30/673; H10D 30/031
See application file for complete search history.

(56) References Cited

U.S. PATENT DOCUMENTS 5,561,308 A 10/1996 Kamata et al.
6,174,763 B1 1/2001 Beilstein et al.
(Continued)

FOREIGN PATENT DOCUMENTS

CN 101179079 A 5/2008
CN 105264611 A 1/2016
(Continued)

OTHER PUBLICATIONS

Chinese patent office, "China Office Action," issued in connection with China Patent Application No. 201980083752.X dated Jul. 13, 2024 (13 pages) (4 pages of English Translation and 9 pages of Original Document).

(Continued)

*Primary Examiner* — Tuan A Hoang
(74) *Attorney, Agent, or Firm* — Holland & Hart LLP

(57) ABSTRACT

Methods and apparatuses for thin film transistors and related fabrication techniques are described. The thin film transistors may access two or more decks of memory cells disposed in a cross-point architecture. The fabrication techniques may use one or more patterns of vias formed at a top layer of a composite stack, which may facilitate building the thin film transistors within the composite stack while using a reduced number of processing steps. Different configurations of the thin film transistors may be built using the fabrication techniques by utilizing different groups of the vias. Further, circuits and components of a memory device (e.g., decoder circuitry, interconnects between aspects of one or more memory arrays) may be constructed using the thin film transistors as described herein along with related via-based fabrication techniques.

20 Claims, 47 Drawing Sheets

Related U.S. Application Data division of application No. 16/223,595, filed on Dec. 18, 2018, now Pat. No. 11,043,496.

(51) Int. Cl.

| | |
|---|---|
| ***H10D 64/01*** | (2025.01) |
| ***H10D 64/23*** | (2025.01) |
| *G11C 8/10* | (2006.01) |
| *G11C 8/12* | (2006.01) |
| *H10B 53/20* | (2023.01) |
| *H10B 53/40* | (2023.01) |
| *H10B 63/00* | (2023.01) |
| *H10P 50/00* | (2026.01) |
| *H10P 50/28* | (2026.01) |
| *H10P 76/20* | (2026.01) |

(52) U.S. Cl.

CPC ....... *H10D 30/673* (2025.01); *H10D 30/6757* (2025.01); *H10D 64/01* (2025.01); *H10D 64/252* (2025.01); *G11C 8/10* (2013.01); *G11C 8/12* (2013.01); *H10B 53/20* (2023.02); *H10B 53/40* (2023.02); *H10B 63/84* (2023.02); *H10P 50/283* (2026.01); *H10P 50/73* (2026.01); *H10P 76/2041* (2026.01)

(56) References Cited

U.S. PATENT DOCUMENTS

| | | | | |
|---|---|---|---|---|
| 8,325,528 | B1 | 12/2012 | Grossi et al. | |
| 8,507,995 | B2 | 8/2013 | Masuoka et al. | |
| 9,379,163 | B1 | 6/2016 | Arayashiki | |
| 9,620,512 | B1 | 4/2017 | Nishikawa et al. | |
| 9,842,651 | B2 | 12/2017 | Harari | |
| 9,892,800 | B2 | 2/2018 | Harari | |
| 10,056,289 | B1 | 8/2018 | Cheng et al. | |
| 10,079,267 | B1 | 9/2018 | Yeh et al. | |
| 2007/0007617 | A1 | 1/2007 | Nakamura et al. | |
| 2010/0096628 | A1 | 4/2010 | Song et al. | |
| 2011/0188309 | A1 | 8/2011 | Endo | |
| 2013/0328005 | A1 | 12/2013 | Shin et al. | |
| 2014/0284535 | A1 | 9/2014 | Saitoh et al. | |
| 2015/0017770 | A1 | 1/2015 | Lee et al. | |
| 2015/0069377 | A1 | 3/2015 | Rabkin et al. | |
| 2015/0295011 | A1 | 10/2015 | Zhang | |
| 2016/0043311 | A1 | 2/2016 | Saitoh et al. | |
| 2016/0093745 | A1* | 3/2016 | Diaz .................... | H10D 62/235 257/29 |
| 2016/0104717 | A1 | 4/2016 | Lu et al. | |
| 2016/0141003 | A1 | 5/2016 | Saitoh | |
| 2016/0204122 | A1 | 7/2016 | Shoji et al. | |
| 2016/0260732 | A1 | 9/2016 | Lue | |
| 2017/0062330 | A1 | 3/2017 | Kim et al. | |
| 2017/0098656 | A1 | 4/2017 | Son et al. | |
| 2017/0309486 | A1 | 10/2017 | Jung et al. | |
| 2018/0090373 | A1* | 3/2018 | Sharangpani ....... | H10W 20/057 |
| 2018/0151588 | A1 | 5/2018 | Tsutsumi et al. | |
| 2018/0254286 | A1 | 9/2018 | Lee et al. | |
| 2018/0277554 | A1 | 9/2018 | Kaneko | |
| 2018/0374529 | A1 | 12/2018 | Kimura et al. | |
| 2019/0080759 | A1 | 3/2019 | Otsuka et al. | |
| 2020/0044095 | A1 | 2/2020 | Wang et al. | |
| 2020/0105330 | A1 | 4/2020 | Kimura et al. | |
| 2020/0176473 | A1 | 6/2020 | Yamazaki et al. | |
| 2020/0219898 | A1 | 7/2020 | Kanamori et al. | |
| 2021/0343751 | A1 | 11/2021 | Yamazaki et al. | |

FOREIGN PATENT DOCUMENTS

| | | | |
|---|---|---|---|
| CN | 106206583 | A | 12/2016 |
| CN | 107359165 | A | 11/2017 |
| EP | 2172940 | A1 | 4/2010 |
| JP | 07-211792 | A | 8/1995 |
| JP | 2008-205168 | A | 9/2008 |
| JP | 2009-277770 | A | 11/2009 |
| JP | 2010-093261 | A | 4/2010 |
| JP | 2013-211537 | A | 10/2013 |
| JP | 2018-160593 | A | 10/2018 |
| KR | 10-2010-0038986 | A | 4/2010 |
| KR | 10-2010-0063385 | A | 6/2010 |
| KR | 10-2015-0136156 | A | 12/2015 |
| KR | 10-2016-0055106 | A | 5/2016 |
| TW | 200737360 | A | 10/2007 |
| TW | 201836072 | A | 10/2018 |
| TW | 201841160 | A | 11/2018 |

OTHER PUBLICATIONS

Chinese patent office, "China Office Action," issued in connection with China Patent Application No. 201980083373.0 dated Dec. 31, 2024 (15 pages) (5 pages of English Translation and 10 pages of Original Document).

European Patent Office, "Supplementary European search report and Search Opinion", issued in connection with European Patent Application No. 19900634.7 dated Nov. 2, 2022 (5 pages).

Intellectual Property Office, "Office Action," issued in connection with ROC (Taiwan) Patent Application No. 108143580, dated Jul. 23, 2020 (3 pages).

International Search Report and Written Opinion received for PCT Patent Application No. PCT/US19/64600, mailed on Mar. 24, 2020, 11 pages.

Japan Patent Office, "Notice of Rejection Ground", issued in connection with Japan Patent Application No. 2021-534643 dated Oct. 4, 2022 (11 pages).

Korean Patent Office, "Notice of Allowance," issued in connection with Korean Patent Application No. 10-2021-7022355 dated Jun. 26, 2023 (5 pages) (2 pages of English Translation and 3 pages of Original Document).

Korean Patent Office, "Office Action," issued in connection with Korean Patent Application No. 10-2021-7022355 dated Nov. 23, 2022 (13 pages) (7 pages of English Translation and 6 pages of Original Document).

Taiwanese Patent Office, "Office Action", issued in connection with Taiwanese Patent Application No. 110119358 dated May 27, 2022 (3 pages).

European Patent Office, "Supplementary European search report and Search Opinion", issued in connection with European Patent Application No. 19901376.4 dated Sep. 12, 2022 (7 pages).

Intellectual Property Office, "Office Action," issued in connection with ROC (Taiwan) Patent Application No. 108143581, dated Oct. 16, 2020 (3 pages).

International Search Report and Written Opinion received for PCT Patent Application No. PCT/US19/64599, mailed on Jun. 5, 2020, 8 pages.

Japan Patent Office, "Notice of Rejection Ground", issued in connection with Japan Patent Application No. 2021-534640 dated Sep. 20, 2022 (11 pages).

Taiwan Patent Office, "Office Action and Search Report", issued in connection with Taiwan Patent Application No. 110122058 dated Sep. 19, 2022 (7 pages).

* cited by examiner

THIN FILM TRANSISTORS AND RELATED FABRICATION TECHNIQUES

CROSS REFERENCE

The present application for patent is a divisional of U.S. patent application Ser. No. 17/332,640 by Castro et al., entitled "THIN FILM TRANSISTORS AND RELATED FABRICATION TECHNIQUES" and filed May 27, 2021, which is a divisional of U.S. patent application Ser. No. 16/223,595 by Castro et al., entitled "THIN FILM TRANSISTORS AND RELATED FABRICATION TECHNIQUES" filed Dec. 18, 2018, each of which is assigned to the assignee hereof and is expressly incorporated by reference in its entirety herein.

BACKGROUND

The following relates generally to forming a memory array and more specifically to thin film transistors and related fabrication techniques.

Memory devices are widely used to store information in various electronic devices such as computers, wireless communications devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may include volatile memory cells or non-volatile memory cells. Non-volatile memory cells may maintain their stored logic state for extended periods of time even in the absence of an external power source. Volatile memory cells may lose their stored state over time unless they are periodically refreshed by an external power source.

Improving memory devices, generally, may include increasing memory cell density, increasing read/write speeds, increasing reliability, increasing data retention, reducing power consumption, or reducing manufacturing costs, among other metrics. Building more memory cells per unit area may be desired to increase memory cell density and reduce per-bit costs without increasing a size of a memory device. Improved techniques for fabricating memory devices (e.g., faster, lower-cost), including memory devices with increased memory cell density or other beneficial features, may also be desired.

DETAILED DESCRIPTION

Figure 1:
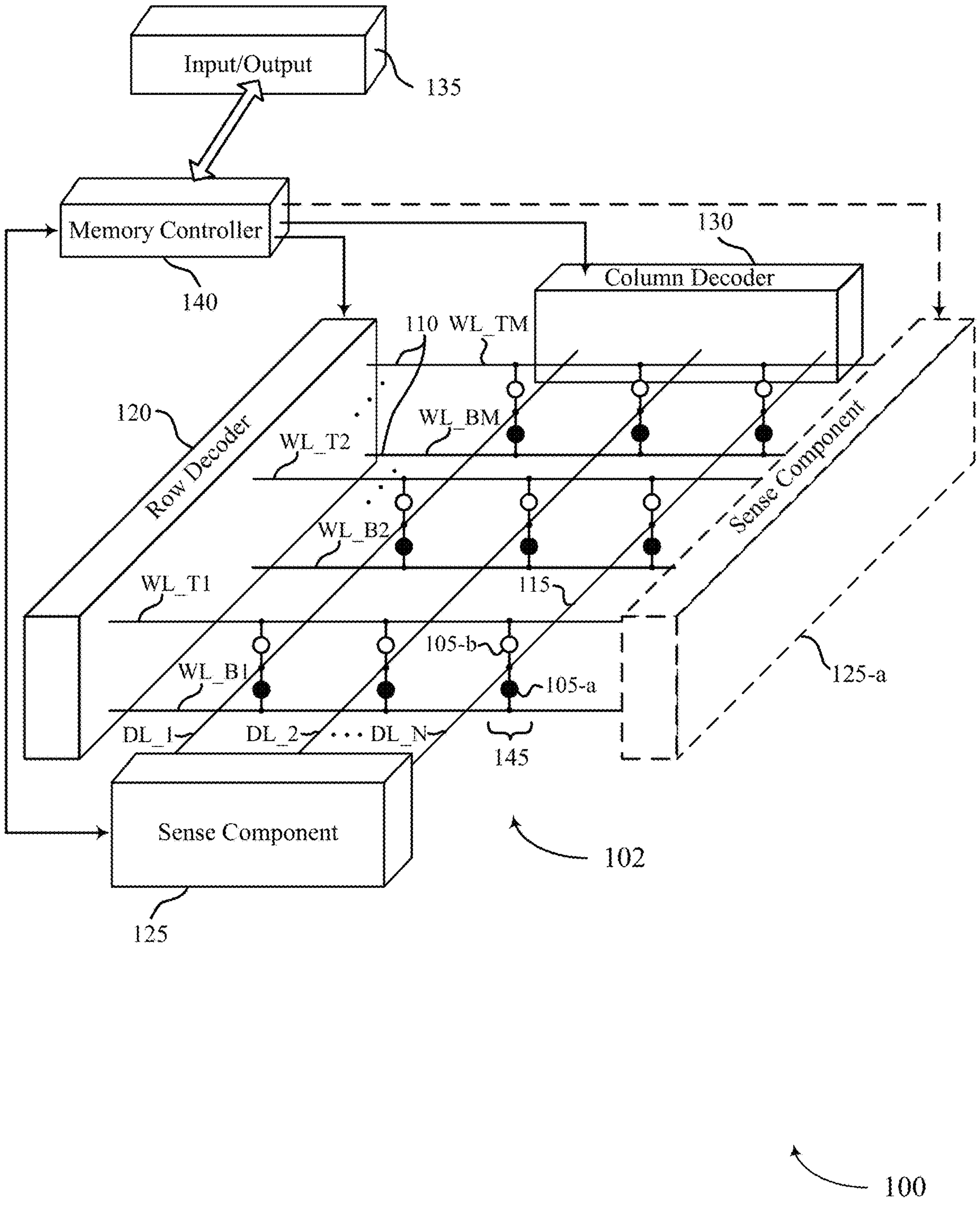
FIG. 1 illustrates an example memory device including a three-dimensional array of memory cells that supports thin film transistors and related fabrication techniques in accordance with embodiments of the present disclosure.

Building more memory cells per unit area may increase areal density of memory cells within a memory device. The increased areal density of memory cells may facilitate a lower per-bit-cost of the memory device and/or a greater memory capacity at a fixed cost. Three-dimensional (3D) integration of two or more two-dimensional (2D) arrays of memory cells may increase areal density while also alleviating difficulties that may be associated with shrinking various feature sizes of memory cells. In some cases, a 2D array of memory cells may be referred to as a deck of memory cells. In some cases, a memory device including multiple decks of memory cells may be referred to as a 3D memory device. Each deck of memory cells of a 3D memory device may be selected (e.g., activated) or inhibited (e.g., deactivated, unselected) by circuitry that may be configured to determine which deck to select and to perform access operations directed to one or more memory cells of the selected deck. In some cases, the circuitry may include complementary metal oxide semiconductor (CMOS) transistors formed in or on a substrate, and the 3D integrated decks of memory cells may be located above (e.g., fabricated on top of) the CMOS circuitry. In some cases, decks of memory cells and associated components that are located above the substrate may be included in a set of layers that may be collectively referred to as array layers.

The CMOS circuitry may determine a particular deck of the 3D memory device to select based on an access command from a host device—e.g., by decoding addresses of memory cells that are associated with the access command and included in a particular deck. In some implementations, as the number of decks in a 3D memory device increases (e.g., 4 decks, 8 decks, 16 decks, 32 decks) to increase areal density, the CMOS circuitry may increase in size to support decoding (e.g., determine which deck to select out of the increased number of decks) and driving the additional decks (e.g., provide a sufficient current to access memory cells of the selected deck). Such increase in the CMOS circuitry size (e.g., an increase in the substrate area occupied by the CMOS circuitry) may offset benefits otherwise associated with the 3D integration of two or more 2D arrays of memory cells.

The fabrication techniques, methods, and related devices described herein may facilitate the building of thin film transistors (TFTs) that may be located within decks of a 3D memory device (e.g., within array layers collectively including two or more decks of memory cells). In some cases, multiple sets of TFTs may be fabricated concurrently within the array layers (e.g., two or more array layers that each include a set of TFTs). The TFTs located within the array layers may be configured to select (e.g., activate) or inhibit (e.g., deactivate) the corresponding deck of memory cells. In some cases, the TFTs may be part of a memory deck decoder (which may also be referred to as a memory deck selector) that may be coupled with the CMOS circuitry in the substrate. As such, the TFTs may be coupled with the CMOS circuitry to facilitate the CMOS circuitry performing its function (e.g., determining a particular deck of the 3D integrated multiple decks to select and driving currents to access memory cells of the particular deck). In this manner, the TFTs located in the array layer may facilitate accommodating additional decks of memory cells of a 3D memory device while mitigating associated impact in terms of substrate area occupied by the CMOS circuitry. For example, in some cases, in conjunction with the TFTs, CMOS circuitry may support one or more additional decks of memory cells while occupying approximately the same area. In some cases, the TFTs located in the array layer may mitigate effects of various array parasitic components—e.g., leakage currents, parasitic capacitance.

In some cases, the TFTs may be configured to perform additional functions (e.g., functions in addition to selecting or inhibiting a deck of memory cells, such as a full decoding function) such that an area of the CMOS circuitry under the array layers may be reduced—e.g., by delegating at least some aspects of its decoding function to the TFTs located in the array layers. In addition, as the TFTs may provide for an individual deck being isolated from the rest of the decks (e.g., TFTs may select the individual deck while inhibiting remaining decks), thereby relaxing the current requirements (e.g., drive current requirements) during an access operation. The relaxed current requirements may have several benefits related to the CMOS circuitry when compared to an alternative approach, where the CMOS circuitry may be configured to provide currents to multiple decks during an access operation. For example, the relaxed current requirements may facilitate the CMOS circuitry occupying less area, using (having) a simpler circuit configuration, or providing one or more additional functionalities without increased footprint.

The fabrication techniques, methods, and related devices described herein may be based on techniques, methods, and related devices to facilitate the concurrent building of multiple decks of memory cells and associated array electrodes (e.g., a set of array layers that each include a deck of memory cells and associated array electrodes) using a pattern of vias (e.g., access vias), as described elsewhere. Namely, aspects of building multiple decks of memory cells and associated array electrodes are described in U.S. patent application Ser. No. 15/961,540 by Castro et al., entitled "Cross-Point Memory Array and Related Fabrication Techniques," U.S. patent application Ser. No. 15/961,547 by Castro et al., entitled "Cross-Point Memory Array and Related Fabrication Techniques," and U.S. patent application Ser. No. 15/961,550 by Castro et al., entitled "Buried Lines and Related Fabrication Techniques," each of which is expressly incorporated by reference in its entirety herein. The vias may be formed at a top layer of a composite stack that may be used to construct the multiple decks of memory cells and array electrodes in one region and to construct the TFTs in a different region. As used herein, a via may refer to an opening or an opening that may be used to form an associated via hole and other structures beneath the material (layer, surface) that includes the opening, including such an opening that has been later filled with a material, including a material that may not be conductive.

As such, the fabrication techniques, methods, and related devices described herein may facilitate a flexible sequence for constructing the TFTs relative to constructing the multiple decks of memory cells and array electrodes. Such flexibility may provide for optimizing process steps to mitigate various undesired factors associated with various processing conditions, such as thermal impacts to the memory cells, cross-contamination risks to a material (e.g., a chalcogenide material) used for the memory cells, and the like. As an example, the TFTs may be formed prior to constructing the memory cells to reduce a thermal budget (e.g., a sum of durations of processing steps at various temperatures) for the memory cells to sustain. In some cases, the fabrication techniques, methods, and related devices described herein may provide for reducing a cost of manufacturing a 3D memory device because the same composite stack of materials may be used for constructing the TFTs as well as for constructing the multiple decks of memory cells and array electrodes.

The fabrication techniques, methods, and related devices described herein may support selecting (or inhibiting) decks of memory cells disposed in a cross-point architecture. For example, each deck of memory cells in the cross-point architecture may include a set of first access lines (e.g., word lines, first array electrodes) in a first plane and a set of second access lines (e.g., bit lines, second array electrodes) in a second plane, the first access lines and the second access lines extending in different directions—e.g., first access lines may be substantially perpendicular to second access lines. Each topological cross-point of a first access line and a second access lines may correspond to a memory cell. Hence, a deck of memory cells in a cross-point architecture may include a memory array having a set of memory cells placed at topological cross-points of access lines (e.g., a 3D grid structure of access lines). As described herein, the TFTs (e.g., a memory deck selector/inhibitor) may be constructed in the array layers that include multiple decks of memory cells and array electrodes. As such, the TFTs may be coupled with the access lines (e.g., word lines, bit lines, first array electrodes, second array electrodes) and thus support selecting (and accessing) multiple decks of memory cells disposed in the cross-point architecture.

Further, the TFTs may support various cross-point architectures, such as a quilt architecture or its derivatives. A quilt architecture in a context of a memory device may refer to an array of memory cells that includes a set of memory tiles that each include similar configurations of components (e.g., word line decoders, bit line decoders, sense components, a subset of the array of memory cells) similar to the arrangement of patches in a patchwork quilt. The memory tiles may be considered as building blocks (e.g., modular building blocks) for the array of memory cells of the memory device employing the quilt architecture. In this manner, the array of memory cells of the memory device may be expanded or contracted by increasing or decreasing the number of memory tiles. In other words, a cross-point architecture may refer to a memory array including topological cross-points of first access lines and second access lines, where each topological cross-point corresponds to a memory cell, and a quilt architecture may refer to constructing an array of memory cells by arranging a set of memory tiles that each form a subset of the array.

The configuration of TFTs may be varied (e.g., associated geometries and structures may be varied) to satisfy a variety of constraints or requirements. In some cases, relevant constraints and requirements for TFTs may be based on a selection function and an inhibit (e.g., deselect) function to be provided by one or more TFTs. For example, the TFTs may be configured to provide a certain current drive capability when activated (e.g., a selection function). Additionally or alternatively, the TFTs may be configured to maintain an acceptably low leakage current when deactivated (e.g., an inhibit function). In some cases, multiple (e.g., two) sets of TFTs may be constructed for each array electrode within a deck of memory cells. For example, one set of TFTs may be configured to actively drive the array electrode of the deck of memory cells (e.g., provide a desired or required drive current) when the deck of memory cells is selected. Additionally or alternatively, the other set of TFTs may be configured to drive an inhibit level (e.g., maintain a low leakage current) when the deck of memory cells is inhibited (e.g., not being accessed, deselected). In some cases, multiple sets of TFTs present in a single device may be processed differently from one another to optimize for the current drive capability and a voltage range that the multiple sets of TFTs may collectively support (e.g., one set of TFTs may be optimized for the drive current capability while the other set of TFTs may be optimized for the low leakage current capability).

In some cases, control gates (e.g., gate electrodes) of the TFTs may be formed within the same layers in which memory elements (e.g., elements configurable to store information, such as chalcogenide elements) are formed. The control gates of the TFTs may determine a path for current flow within the TFTs between a first electrode (e.g., drain) of the TFTs and a second electrode (e.g., source) of the TFTs. In some cases, the path for current flow may be vertical, horizontal, or a combination of both, based on a manner for a channel of the TFT is formed relative to the gate electrodes, the first electrode, and the second electrode of the TFTs. In some cases, the channel of TFTs may be coupled with a bulk connection to a node of underlying CMOS circuitry to control electrical characteristics of the channel that may be different based on various functions that the TFTs may perform—e.g., selection function, inhibit function, or other functions.

Further, the fabrication techniques, methods, and related devices described herein may facilitate construction of one or more complex circuits, such as circuits including various combinations of TFTs (e.g., TFT-based decoder unit) within decks of array layers. For example, a TFT-based decoder unit may perform cluster-level decoding to activate (or deactivate) a particular tile within the cluster of tiles. Additionally or alternatively, another TFT-based decoder unit may perform tile-level decoding to activate a particular access line out of a set of access lines included in the tile. The fabrication techniques and methods described herein may also be used to construct cross-over regions where a first set of electrodes for a first group of TFTs may cross a second set of electrodes for a second group of TFTs without resulting in shorting between the first set of electrodes and the second set of electrodes.

Features of the disclosure introduced above are further described herein in the context of constructing various TFT structures and TFT-based circuits in a composite stack of materials that may also be used to construct a memory array in a cross-point architecture. Specific examples of structures and techniques for fabricating TFT structures and TFT-based circuits are then described. These and other features of the disclosure are further illustrated by and described with reference to apparatus diagrams, method of formation diagrams, and flowcharts that relate to TFTs and related fabrication techniques.

FIG. 1 illustrates an example memory device 100 including a three-dimensional array of memory cells that supports thin film transistors and related fabrication techniques in accordance with embodiments of the present disclosure. Memory device 100 may also be referred to as an electronic memory apparatus. FIG. 1 is an illustrative representation of various components and features of the memory device 100. As such, it should be appreciated that the components and features of the memory device 100 are shown to illustrate functional interrelationships, not their actual physical positions within the memory device 100.

In the illustrative example of FIG. 1, the memory device 100 includes a three-dimensional (3D) memory array 102. The 3D memory array 102 includes memory cells 105 that may be programmable to store different states. In some embodiments, each memory cell 105 may be programmable to store two states, denoted as a logic 0 and a logic 1. In some embodiments, a memory cell 105 may be configured to store more than two logic states (e.g., a multi-level cell). A memory cell 105 may, in some embodiments, include a self-selecting memory cell. It is to be understood that the memory cell 105 may also include a memory cell of another type—e.g., a 3D XPoint™ memory cell, a PCM cell that includes a storage component and a selection component, a conductive-bridge RAM (CBRAM) cell, or a FeRAM cell. Although some elements included in FIG. 1 are labeled with a numeric indicator, other corresponding elements are not labeled, though they are the same or would be understood to be similar, in an effort to increase the visibility and clarity of the depicted features.

The 3D memory array 102 may include two or more two-dimensional (2D) memory arrays formed on top of one another (e.g., array layers including two or more decks of memory cells and array electrodes). This may increase a number of memory cells that may be placed or created on a single die or substrate as compared with a single 2D array, which in turn may reduce production costs, or increase the performance of the memory device, or both. In the example depicted in FIG. 1, memory array 102 includes two levels of memory cells 105 (e.g., memory cell 105-*a* and memory cell 105-*b*) and may thus be considered a 3D memory array; however, the number of levels may not be limited to two, and other examples may include additional levels (e.g., 4 levels, 8 levels, 16 levels, 32 levels). Each level may be aligned or positioned so that memory cells 105 may be aligned (exactly, overlapping, or approximately) with one another across each level, thus forming memory cell stacks 145. In some cases, levels of memory cells may be referred to as decks of memory cells.

In some embodiments, each row of memory cells 105 is connected to a word line 110, and each column of memory cells 105 is connected to a bit line 115. Both word lines 110 and bit lines 115 may also be generically referred to as access lines. Further, an access line may function as a word line 110 for one or more memory cells 105 at one deck of the memory device 100 (e.g., for memory cells 105 below the access line) and as a bit line 115 for one or more memory cells 105 at another deck of the memory device (e.g., for memory cells 105 above the access line). Thus, references to word lines and bit lines, or their analogues, are interchangeable without loss of understanding or operation. Word lines 110 and bit lines 115 may be substantially perpendicular to one another and may support an array of memory cells.

In general, one memory cell 105 may be located at the intersection of two access lines such as a word line 110 and a bit line 115. This intersection may be referred to as the address of the memory cell 105. A target memory cell 105 may be a memory cell 105 located at the intersection of an energized (e.g., activated) word line 110 and an energized (e.g., activated) bit line 115; that is, a word line 110 and a bit line 115 may both be energized in order to read or write a memory cell 105 at their intersection. Other memory cells 105 that are in electronic communication with (e.g., connected to) the same word line 110 or bit line 115 may be referred to as untargeted memory cells 105.

As shown in FIG. 1, the two memory cells 105 in a memory cell stack 145 may share a common conductive line such as a bit line 115. That is, a bit line 115 may be coupled with the upper memory cell 105-*b* and the lower memory cell 105-*a*. Other configurations may be possible, for example, a third layer (not shown) may share a word line 110 with the upper memory cell 105-*b*.

In some cases, an electrode may couple a memory cell 105 to a word line 110 or a bit line 115. The term electrode may refer to an electrical conductor, and may include a trace, wire, conductive line, conductive layer, or the like that provides a conductive path between elements or components of memory device 100. Thus, the term electrode may refer in some cases to an access line, such as a word line 110 or a bit line 115, as well as in some cases to an additional conductive element employed as an electrical contact between an access line and a memory cell 105. In some embodiments, a memory cell 105 may comprise a chalcogenide material positioned between a first electrode and a second electrode. The first electrode may couple the chalcogenide material to a word line 110, and the second electrode couple the chalcogenide material to a bit line 115. The first electrode and the second electrode may be the same material (e.g., carbon) or different material. In other embodiments, a memory cell 105 may be coupled directly with one or more access lines, and electrodes other than the access lines may be omitted.

Operations such as reading and writing may be performed on memory cells 105 by activating or selecting word line 110 and digit line 115. Activating or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

In some architectures, the logic storing device of a cell (e.g., a resistive component in a CBRAM cell, a capacitive component in a FeRAM cell) may be electrically isolated from the digit line by a selection component. The word line 110 may be connected to and may control the selection component. For example, the selection component may be a transistor and the word line 110 may be connected to the gate of the transistor. Alternatively, the selection component may be a variable resistance component, which may comprise chalcogenide material. Activating the word line 110 may result in an electrical connection or closed circuit between the logic storing device of the memory cell 105 and its corresponding digit line 115. The digit line may then be accessed to either read or write the memory cell 105. Upon selecting a memory cell 105, the resulting signal may be used to determine the stored logic state. In some cases, a first logic state may correspond to no current or a negligibly small current through the memory cell 105, whereas a second logic state may correspond to a finite current.

In some cases, a memory cell 105 may include a self-selecting memory cell having two terminals and a separate selection component may be omitted. As such, one terminal of the self-selecting memory cell may be electrically connected to a word line 110 and the other terminal of the self-selecting memory cell may be electrically connected to a digit line 115.

Accessing memory cells 105 may be controlled through a row decoder 120 and a column decoder 130. For example, a row decoder 120 may receive a row address from the memory controller 140 and activate the appropriate word line 110 based on the received row address. In some cases, the row decoder 120 may include multiple sets of TFTs to select a particular deck of a 3D memory array 102. For example, the row decoder 120 may include a first set of TFTs associated with a lower deck (e.g., a memory deck including memory cell 105-*a*) to select the lower deck as well as a second set of TFTs associated with an upper deck (e.g., a memory deck including memory cell 105-*b*) to inhibit (e.g., deselect) the upper deck. In some cases, the TFTs may be co-located in array layers that include the 3D memory array 102. In some cases, the TFTs located in the array layers may be coupled with the row decoder 120 that may be located in a substrate, above which the 3D memory array 102 is located. Similarly, a column decoder 130 may receive a column address from the memory controller 140 and activate the appropriate digit line 115. In some cases, similar to the row decoder 120, the column decoder 130 may include another multiple sets of TFTs to select a particular deck of a 3D memory array 102. For example, memory array 102 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed.

Upon accessing, a memory cell 105 may be read, or sensed, by sense component 125 to determine the stored state of the memory cell 105. For example, a voltage may be applied to a memory cell 105 (using the corresponding word line 110 and bit line 115) and the presence of a resulting current through the memory cell 105 may depend on the applied voltage and the threshold voltage of the memory cell 105. In some cases, more than one voltage may be applied. Additionally, if an applied voltage does not result in current flow, other voltages may be applied until a current is detected by sense component 125. By assessing the voltage that resulted in current flow, the stored logic state of the memory cell 105 may be determined. In some cases, the voltage may be ramped up in magnitude until a current flow is detected. In other cases, predetermined voltages may be applied sequentially until a current is detected. Likewise, a current may be applied to a memory cell 105 and the magnitude of the voltage to create the current may depend on the electrical resistance or the threshold voltage of the memory cell 105.

In some cases, the memory cell 105 (e.g., a self-selecting memory cell) may comprise a chalcogenide material. The chalcogenide material of self-selecting memory cell may remain in an amorphous state during the self-selecting memory cell operation. In some cases, operating the self-selecting memory cell may include applying various shapes of programming pulses to the self-selecting memory cell to determine a particular threshold voltage of the self-selecting memory cell—that is, a threshold voltage of a self-selecting memory cell may be modified by changing a shape of a programming pulse, which may alter a local composition of the chalcogenide material in amorphous state. A particular threshold voltage of the self-selecting memory cell may be determined by applying various shapes of read pulses to the self-selecting memory cell. For example, when an applied voltage of a read pulse exceeds the particular threshold voltage of the self-selecting memory cell, a finite amount of current may flow through the self-selecting memory cell. Similarly, when the applied voltage of a read pulse is less than the particular threshold voltage of the self-selecting memory cell, no appreciable amount of current may flow through the self-selecting memory cell.

In some embodiments, sense component 125 may read information stored in a selected memory cell 105 by detecting the current flow or lack thereof through the memory cell 105. In this manner, the memory cell 105 (e.g., a self-selecting memory cell) may store one bit of data based on threshold voltage levels (e.g., two threshold voltage levels) associated with the chalcogenide material, with the threshold voltage levels at which current flows through the memory cell 105 indicative of a logic state stored by the memory cell 105. In some cases, the memory cell 105 may exhibit a certain number of different threshold voltage levels (e.g., three or more threshold voltage levels), thereby storing more than one bit of data.

Sense component 125 may include various transistors or amplifiers in order to detect and amplify a difference in the signals associated with a sensed memory cell 105, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. FIG. 1 also shows an alternative option of arranging sense component 125-*a* (in a dashed box). An ordinary person skilled in the art would appreciate that sense component 125 may be associated either with column decoder or row decoder without losing its functional purposes.

A memory cell 105 may be set or written by similarly activating the relevant word line 110 and digit line 115, and at least one logic value may be stored in the memory cell 105. Column decoder 130 or row decoder 120 may accept data, for example input/output 135, to be written to the memory cells 105.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state, so the logic state may be re-written after a sense operation. Additionally, in some memory architectures, activating a single word line 110 may result in the discharge of all memory cells in the row (e.g., coupled with the word line 110); thus, several or all memory cells 105 in the row may need to be re-written. But in non-volatile memory, such as self-selecting memory, PCM, CBRAM, FeRAM, or not-AND (NAND) memory, accessing the memory cell 105 may not destroy the logic state and, thus, the memory cell 105 may not require re-writing after accessing.

The memory controller 140 may control the operation (e.g., read, write, re-write, refresh, discharge) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and digit line 115. Memory controller 140 may also generate and control various voltages or currents used during the operation of memory device 100. In general, the amplitude, shape, polarity, and/or duration of an applied voltage or current discussed herein may be adjusted or varied and may be different for the various operations discussed in operating the memory device 100. Further, one, multiple, or all memory cells 105 within memory array 102 may be accessed simultaneously; for example, multiple or all cells of memory array 102 may be accessed simultaneously during a reset operation in which all memory cells 105, or a group of memory cells 105, are set to a single logic state.

In some cases, the lower word lines 110 (labeled in FIG. 1 as WL_B1), the upper word lines 110 (labeled in FIG. 1 as WL_T1), and word lines at any number of additional layers (not shown), may be formed concurrently. Further, both the lower word lines 110 and the upper word lines 110 may be disposed (formed) in layers initially comprising a same dielectric material, and a single via pattern may be used for one or more processing steps—e.g., removing portions of the dielectric material and replacing it with conductive material—that concurrently form the lower level word lines 110 and the upper level word lines 110 at their respective layers. Similarly, the lower memory cells 105 (e.g., memory cell 105-*a* illustrated in FIG. 1 as solid black circles) may be concurrently formed with the upper memory cells 105 (e.g., memory cell 105-*b* illustrated in FIG. 1 as white circles), as well as memory cells 105 at any number of additional decks of memory cells (not shown). In some cases, the 3D memory array 102 may be positioned above a substrate that includes various circuitry, such as the row decoder 120, the sense component 125, the column decoder 130, or the like.

Figure 2:
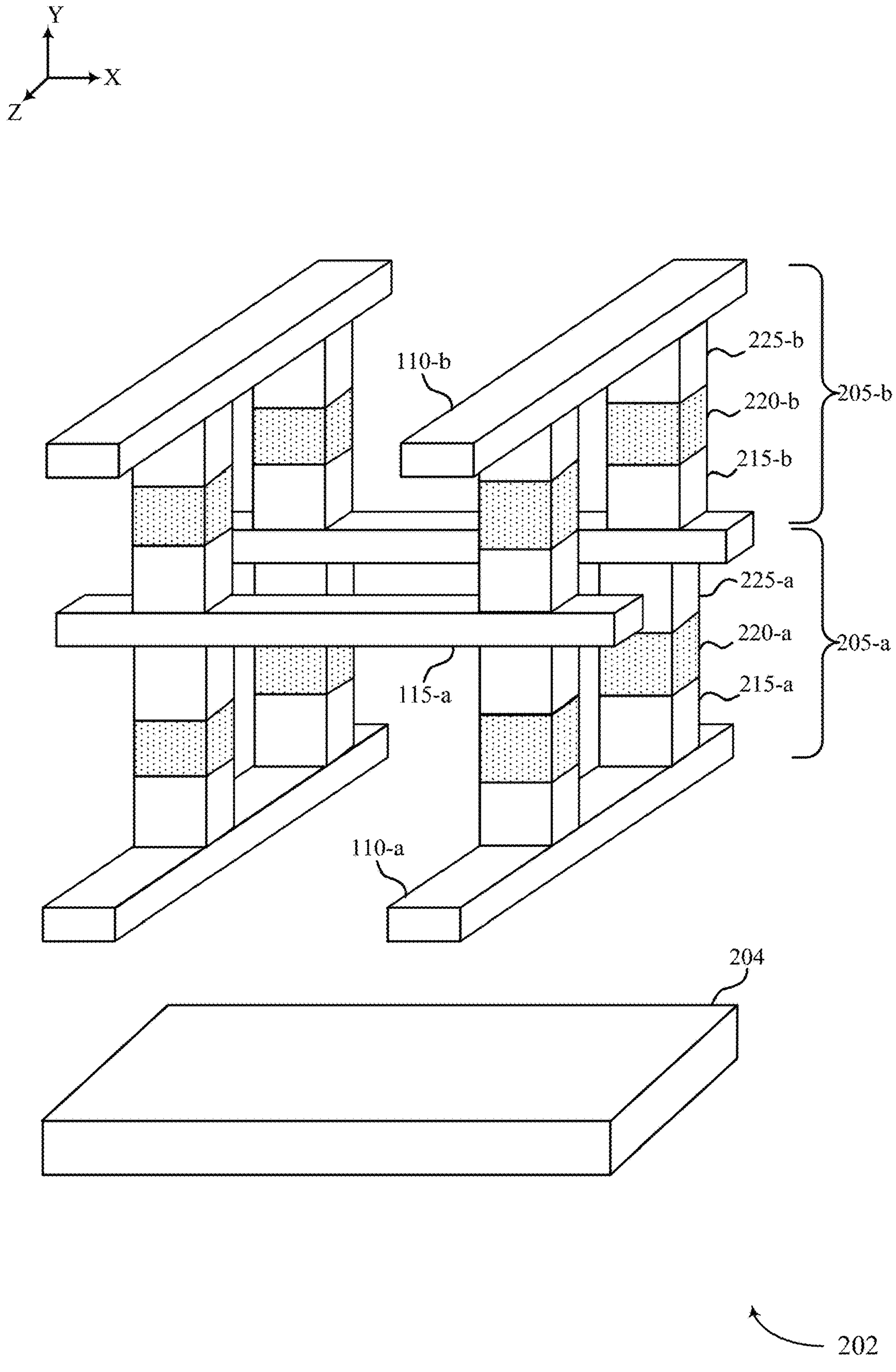
FIG. 2 illustrates an example of a three-dimensional memory array that supports thin film transistors and related fabrication techniques in accordance with embodiments of the present disclosure.

FIG. 2 illustrates an example of a 3D memory array 202 that supports thin film transistors and related fabrication techniques in accordance with embodiments of the present disclosure. 3D memory array 202 may be an example of portions of memory array 102 described with reference to FIG. 1 or a 3D memory device that includes two or more decks of memory cells. 3D memory array 202 may include a first array or deck 205-*a* of memory cells that is positioned above a substrate 204 and a second array or deck 205-*b* of memory cells on top of the first array or deck 205-*a*. 3D memory array 202 may also include word line 110-*a* and word line 110-*b*, and bit line 115-*a*, which may be examples of word lines 110 and a bit line 115, as described with reference to FIG. 1. As in the illustrative example depicted in FIG. 2, memory cells of the first deck 205-*a* and the second deck 205-*b* may each include a self-selecting memory cell. In some examples, memory cells of the first deck 205-*a* and the second deck 205-*b* may each include another type of memory cell that may be suitable for a cross-point architecture—e.g., a CBRAM cell or an FeRAM cell. Although some elements included in FIG. 2 are labeled with a numeric indicator, other corresponding elements are not labeled, though they are the same or would be understood to be similar, in an effort to increase the visibility and clarity of the depicted features.

In some cases, memory cells of the first deck 205-*a* may each include first electrode 215-*a*, chalcogenide material 220-*a*, and second electrode 225-*a*. In addition, memory cells of the second deck 205-*b* may each include first electrode 215-*b*, chalcogenide material 220-*b*, and second electrode 225-*b*. In some embodiments, access lines (e.g., word line 110, bit line 115) may include an electrode layer (e.g., a conformal layer), in lieu of electrodes 215 or 225 and thus may comprise multi-layered access lines. In such embodiments, the electrode layer of the access lines may interface with a memory material (e.g., chalcogenide material 220). In some embodiments, access lines (e.g., word line 110, bit line 115) may directly interface with a memory material (e.g., chalcogenide material 220) without an electrode layer or an electrode in-between.

The memory cells of the first deck 205-*a* and second deck 205-*b* may, in some embodiments, have common conductive lines such that corresponding (e.g., vertically aligned in y-direction) memory cells of each deck 205-*a* and 205-*b* may share bit lines 115 or word lines 110 as described with reference to FIG. 1. For example, first electrode 215-*b* of the second deck 205-*b* and second electrode 225-*a* of the first deck 205-*a* may both be coupled to bit line 115-*a* such that bit line 115-*a* is shared by vertically aligned and adjacent memory cells (in y-direction).

In some embodiments, 3D memory array 202 may include an additional bit line (not shown) such that the first electrode 215-*b* of the second deck 205-*b* may be coupled with the additional bit line and the second electrode 225-*a* of the first deck 205-*a* may be coupled with the bit line 115-*a*. The additional bit line may be electrically isolated from the bit line 115-*a* (e.g., an insulating material may be interposed between the additional bit line and the bit line 115-*a*). As a result, the first deck 205-*a* and the second deck 205-*b* may be separated and may operate independently of each other. In some cases, an access line (e.g., either word line 110 or bit line 115) may include a selection component (e.g., a two-terminal selector device, which may be configured as one or more thin-film materials integrated with the access line) for a respective memory cell at each cross-point. As such, the access line and the selection component may together form a composite layer of materials functioning as both an access line and a selection component.

The architecture of 3D memory array 202 may in some cases be referred to as an example of a cross-point architecture, as a memory cell may be formed at a topological cross-point between a word line 110 and a bit line 115 as illustrated in FIG. 2. Such a cross-point architecture may offer relatively high-density data storage with lower production costs compared to some other memory architectures. For example, a memory array with a cross-point architecture may have memory cells with a reduced area and, resultantly, may support an increased memory cell density compared to some other architectures. For example, a cross-point architecture may have a $4F^2$ memory cell area, where F is the smallest feature size (e.g., a minimum feature size), compared to other architectures with a $6F^2$ memory cell area, such as those with a three-terminal selection component. For example, a DRAM memory array may use a transistor (e.g., a thin-film transistor), which is a three-terminal device, as the selection component for each memory cell, and thus a DRAM memory array comprising a given number of memory cells may have a larger memory cell area compared to a memory array with a cross-point architecture comprising the same number of memory cells.

While the example of FIG. 2 shows two memory decks, other configurations may include any number of decks (e.g., 4 decks, 8 decks, 16 decks, 32 decks). In some embodiments, one or more of the memory decks may include self-selecting memory cells that include chalcogenide material 220. In other embodiments, one or more of the memory decks may include FeRAM cells that include a ferroelectric material. In yet another embodiments, one or more of the memory decks may include CBRAM cells that include a metallic oxide or a chalcogenide material. Chalcogenide materials 220 may, for example, include a chalcogenide glass such as, for example, an alloy of selenium (Se), tellurium (Te), arsenic (As), antimony (Sb), carbon (C), germanium (Ge), and silicon (Si). In some embodiment, a chalcogenide material having primarily selenium (Se), arsenic (As), and germanium (Ge) may be referred to as SAG-alloy.

In some cases, word line 110-*a*, word line 110-*b*, and bit line 115-*a* of 3D memory array 202 may be referred to as array electrodes. As described herein, a set of TFTs may be constructed in array layers such that a subset of the set of TFTs may be coupled with the array electrodes (e.g., word line 110, bit line 115) of a deck of memory arrays (e.g., first deck of memory cells 205-*a*, second deck of memory cells 205-*b*). In some cases, the set of TFTs may be coupled with circuitry in the substrate 204 (e.g., CMOS circuitry under the array layers) to facilitate various functions of the circuitry. For example, the set of TFTs may select a particular deck of memory arrays (e.g., selection function) and concurrently unselect two or more decks of memory array (e.g., inhibit function) based on inputs from the circuit (e.g., decoding outcomes associated with an access command). In some cases, the set of TFTs may perform more sophisticated functions (e.g., a full decoding function) to offload one or more functions that may otherwise be carried out by the circuitry.

FIGS. 3 through 6 illustrate various aspects of fabrication techniques of the present disclosure. For example, various cross-sectional diagrams may illustrate concurrent nature of creating certain structures of TFTs (e.g., source, drain, gate, and channel of TFTs) at one or more buried target layers of a composite stack, each target layer comprising a target material. As described herein, in some cases, vias (e.g., access vias) may be used to create the structures in the target material at a target buried layer. Various top-down diagrams may illustrate how a particular set of vias may be used to create various structures of TFTs. The fabrication techniques described herein may facilitate concurrent formation of like structures at different lower layers—e.g., sets of gate electrodes of TFTs or sets channel material elements of TFTs. As such, the fabrication techniques described herein may facilitate concurrent formation of a set of TFTs in array layers that include two or more decks of memory cells, each deck comprising a 3D cross-point structure of access lines (e.g., word lines, bit lines, array electrodes) and memory cells.

FIGS. 3A-3L illustrate exemplary fabrication techniques in accordance with the present disclosure. FIGS. 3A-3L describe aspects of several process steps for concurrently constructing two or more TFTs (e.g., TFTs that may be referred to as vertical TFTs and in which an electrical current flows in a vertical direction with respect to a horizontal substrate, when the TFT is activated). In some cases, such TFTs may be fabricated in a socket region of array layers. In some cases, TFTs may be referred to as array electrode drivers. A socket region may refer to a region of array layers where various interconnects may be formed—e.g., interconnects between TFTs and an underlying circuitry (e.g., logic circuitry, row decoder 120 in the substrate 204 described with reference to FIG. 2), interconnects between the TFTs and ends of array electrodes (e.g., word lines 110 and/or bit lines 115 described with reference to FIG. 2). FIGS. 3A-3L include top-down views of a portion of socket region (e.g., a layout of the socket region) to illustrate that different groups of vias may be used to concurrently construct various structures of the TFTs. FIGS. 3A-3L also include cross-sectional side views of the portion of socket region to illustrate aspects of process features during several process steps for concurrently constructing the TFTs.

Figure 3A:
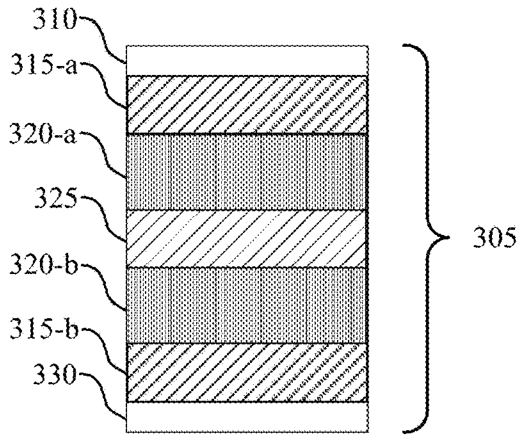
FIGS. 3A-3L illustrate exemplary fabrication techniques that support thin film transistors and related fabrication techniques in accordance with embodiments of the present disclosure.

FIG. 3A illustrates a cross-sectional side view of a stack 305 that may include a number of different layers of various materials. In some cases, the stack may be referred to as a composite stack. In some cases, the stack 305 may be located above a substrate (e.g., substrate 204 described with reference to FIG. 2). Specific materials of the stack 305 may be selected based on a number of factors—e.g., a desired kind of memory technology (e.g., self-selecting memory, FeRAM, CBRAM), a desired number of decks of memory cells (e.g., two or more decks of memory cells). As depicted in the illustrative example of FIG. 3A, the stack 305 may include an initial stack of layers suitable for fabricating two decks of memory cells—e.g., a first deck 205-*a* of memory cells that is positioned above a substrate 204 and a second array or deck 205-*b* of memory cells on top of the first array or deck 205-*a* as described with reference to FIG. 2.

Figure 3B:
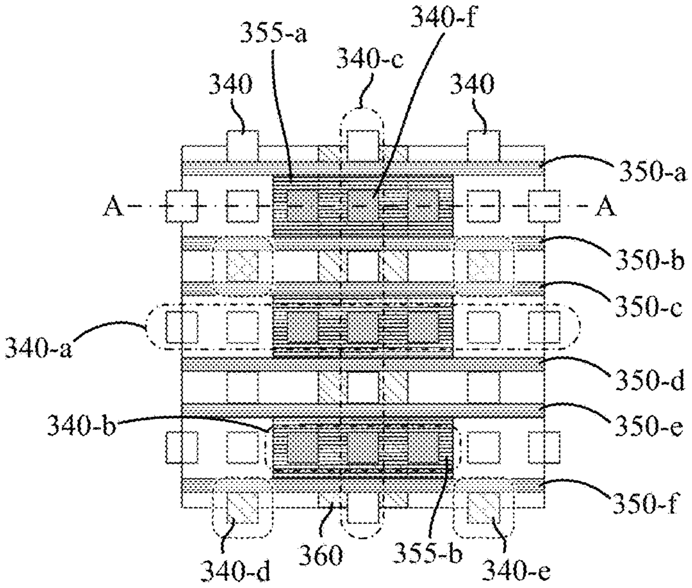

The stack 305 may include a layer 310, which may be a top layer of the stack 305. In some embodiments, the layer 310 includes a dielectric material. In some embodiments, the layer 310 includes a hardmask material such that the layer 310 may be referred to as a hardmask (HM) layer. A pattern of vias may be formed in the layer 310 as a result of, for example, a photolithography step. In some cases, such a photolithography step may form a first set of vias (e.g., a third group of vias 340-*c* as shown in FIG. 3B) and a second set of vias (e.g., a second group of vias 340-*b* as shown in FIG. 3B) through a top layer (e.g., layer 310) of the stack 305.

The stack 305 may also include layers 315. In the illustrative example of FIG. 3A, the stack 305 includes two layers 315, namely layer 315-*a* and layer 315-*b*, but any number of layers is possible. In some embodiments, the layers 315 may each include a first dielectric material (which may be also referred to as D1). As illustrated herein, each layer 315 may be modified to include a set of first array electrodes (e.g., electrode tabs or segments, conductive lines, access lines, word lines). In some cases, each layer 315 may be referred to as a first layer, a first electrode layer, or a D1 layer.

The stack 305 may also include layers 320. In the illustrative example of FIG. 3A, the stack 305 includes two layers 320, namely layer 320-*a* and layer 320-*b*, but any number of layers 320 is possible. In some embodiments, each layer 320 may comprise a placeholder material, which may later be partially removed and replaced by a desired material (e.g., memory material, gate electrode material, semiconductor material). In some embodiments, each layer 320 may initially comprise a memory material, which may be processes so as to form one or more memory elements. In some cases, a layer 320 may be referred to as a second layer, a memory layer, or a DM layer.

The stack 305 may also include a layer 325. In the illustrative example of FIG. 3A, the stack 305 includes a single layer 325, but any number of layers 325 is possible. In some embodiments, each layer 325 may include a second dielectric material (which may be also referred to as D2). As illustrated herein, the layer 325 may be modified to include a set of second array electrodes (e.g., electrode tabs, conductive lines, access lines, bit lines). In some cases, each layer 325 may be referred to as a third layer, a second electrode layer, or a D2 layer.

The stack 305 may include a layer 330. In some cases, the layer 330 may include an etch-stop material to withstand various etch processes described herein. The layer 330 may include the same hardmask material as the layer 310 in some cases, or may include a different material. In some cases, the layer 330 may provide a buffer layer with respect to circuits or other structures formed in a substrate (e.g., substrate 204 described with reference to FIG. 2) or other layers (not shown), which may be below layer 330. In some cases, the layer 330 may provide a buffer layer with respect to one or more decks of memory cells fabricated in earlier processing steps.

FIG. 3B illustrates a top-down view of the stack 305 where a socket region including two or more TFTs (e.g., vertical TFTs) may be constructed as described herein. FIG. 3B illustrates a set of vias 340 (depicted as white, gray, or cross-hatched squares) in an array pattern. FIG. 3B also illustrates various structures that may be concurrently formed within the stack 305 using a different groups of vias (e.g., first group of vias 340-*a*, second group of vias 340-*b*, third group of vias 340-*c*). For example, FIG. 3B illustrates a set of array electrodes 350, a set of electrode tabs 355 (depicted as dark-shaded rectangles), and a set of gate electrodes 360 (one of them depicted in the top-down view), each of which may be formed at different junctures of process sequence to construct the TFTs.

As described elsewhere, the set of array electrodes 350 (e.g., array electrodes 350-*c* and 350-*d*) may be constructed using a first subset of vias (e.g., a first group of vias 340-*a*). Also, the set of electrode tabs (e.g., electrode tab 355-*b*) may be constructed using a second subset of vias (e.g., a second group of vias 340-*b* depicted as gray squares). In some cases, an electrode tab 355-*b* may be a second electrode (e.g., drain) for a TFT at a first layer 315-*a*. In some cases, the electrode tabs may be constructed by forming a channel (e.g., a series of merged cavities in a row) at the first layer (e.g., D1 layer 315-*a*, D1 layer 315-*b*) using the second group of vias 340-*b*—e.g., the channel is aligned with the second group of vias 340-*b*. The channel at the first layer may be filled with an electrode material (e.g., a conductive material). Subsequently, a set of dielectric plugs corresponding to the second group of vias 340-*b* may be formed to separate an electrode tab within D1 layer 315-*a* from another electrode tab within D1 layer 315-*b*. The dielectric plugs may extend through the electrode material that filled the channel at the first layer.

Additionally, the set of gate electrodes 360 may be constructed using a third subset of vias (e.g., a third group of vias 340-*c*) as described herein with reference to FIGS. 3C through 3F. Further, array electrodes (e.g., array electrode 350-*f*) may be severed into two or more segments using one or more vias (e.g., vias depicted as cross-hatched squares including via 340-*d*, via 340-*e*). In some cases, an electrode tab (e.g., electrode tab 355-*b*) may be coupled with a single array electrode (e.g., array electrode 350-*e*) as a result. In some cases, an electrode tab (thus one or more TFTs constructed therein) may be located in between two ends of the single array electrode. For example, an electrode tab (e.g., electrode tab 355-*b*) may be located approximately in a middle region of the single array electrode (e.g., array electrode 350-*c*).

In some cases, array electrodes 350 may be or may be part of access lines (e.g., word lines, bit lines, conductive lines) coupled with a set of memory cells in an active array region of array layers. An active region may refer to a region of the array layers where the access lines and the set of memory cells form an array of memory cells. In some cases, the array of memory cells (e.g., access lines and the set of memory cells) may be constructed according to a cross-point architecture in the active array region. In this manner, a set of TFTs formed in the socket region of the array layers may be coupled with array electrodes 350 (and thus the set of memory cells associated with the array electrodes 350) in the active array region of the array layers.

FIGS. 3C through 3F illustrates fabrication techniques for forming the set of gate electrodes 360 for the TFTs within the stack 305 using the third group of vias 340-*c*. In some cases, the set of array electrodes 350 and the set of electrode tabs 355 may have been formed within the stack 305, prior to forming the set of gate electrodes 360 at layers 320.

Figure 3C:
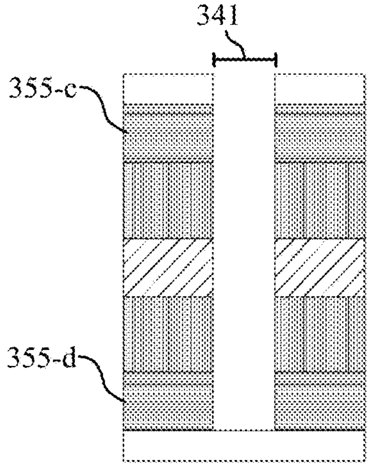

FIG. 3C illustrates a cross-sectional side view of the stack 305 across an imaginary line AA shown in FIG. 3B after via holes are formed using the third group of vias 340-*c*. The cross-sectional side view may correspond to a portion of an electrode tab (e.g., electrode tab 355-*a* as shown in FIG. 3B) including the via 340-*f*. The electrode tab depicted in FIG. 3C (e.g., electrode tabs 355-*c* and 355-*d* as shown in FIG. 3C) may have been previously formed in D1 layers. The electrode tabs 355-*c* and 355-*d* of FIG. 3C are depicted with a different shading pattern than the original D1 layers (e.g., layer 315-*a*, layer 315-*b*) of FIG. 3A so as to indicate that the portion of D1 layers shown in FIG. 3C have been replaced with an electrode material that forms the set of electrode tabs 355. FIG. 3C also illustrates an opening 341 that may correspond to a cross-sectional side view of a via hole (e.g., a via hole corresponding to via 340-*f* that is included in the third group of vias 340-*c*).

In some cases, a photolithography step may transfer a shape of via 340 onto the stack 305. In some examples, the photolithography step may include forming a photoresist layer (not shown) having a shape of via 340 (e.g., defined by lack of the photoresist material inside of the via 340) on top of the layer 310. In some examples, an etch processing step may follow the photolithography step to transfer the shape of via 340 onto layer 310 such that the shape of via 340 established within the layer 310 may be repeatedly used as an access via during subsequent processing steps—namely, layer 310 including the shape of via 340 may function as a hardmask layer providing an access via in the shape of via 340 for the subsequent processing steps.

In some cases, an anisotropic etch process step may form the opening 341 through the stack 305 and the width of opening 341 may be substantially same as the width of a via (e.g., via 340-*f*). An anisotropic etch step may remove a target material in one direction (e.g., an orthogonal direction with respect to a substrate) by applying an etchant (e.g., a mixture of one or more chemical elements) to the target material. Also, the etchant may exhibit a selectivity (e.g., a chemical selectivity) directed to remove only the target material (e.g., a hardmask material at layer 310) while preserving other materials (e.g., photoresist) exposed to the etchant. An anisotropic etch step may use one or more etchants during a single anisotropic etch step when removing one or more layers of materials (e.g., first dielectric material at D1 layers 315, placeholder materials at DM layers 320, second dielectric material at D2 layer 325). In some cases, an anisotropic etch step may use an etchant exhibiting a selectivity targeted to remove a group of materials (e.g., oxides and nitrides) while preserving other groups of materials (e.g., metals) exposed to the etchant.

Figure 3D:
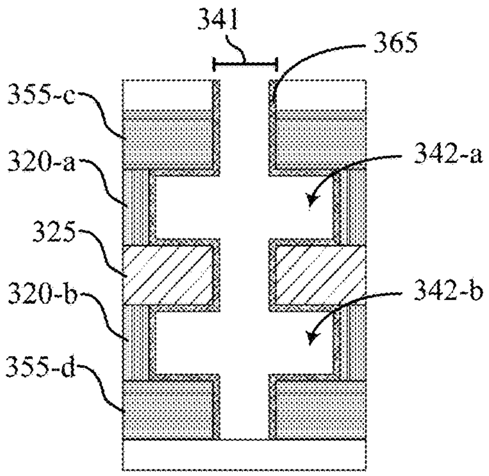

FIG. 3D illustrates a cross-sectional side view of the stack 305 across the imaginary line AA after at least an etch process step and a deposition process step are performed using the via holes (e.g., the opening 341) that have been formed within the stack 305 as described with reference to FIG. 3C.

In some cases, the etch process step may include an isotropic etch step that may remove a target material in all directions. In some cases, an isotropic etch step may apply an etchant (e.g., a mixture of one or more chemical elements) exhibiting a selectivity (e.g., a chemical selectivity) directed to remove only a target material (e.g., a placeholder material in the DM layers 320) while preserving other materials (e.g., electrode material of the electrode tabs 355-*c* or 355-*d*, second dielectric material of D2 layer, hardmask material of HM layer) exposed to the etchant. An isotropic etch step may employ different etchant(s) during a single isotropic etch step when removing one or more layers of materials. In some cases, an isotropic etchant (e.g., an etchant used in an isotropic etch step) may be chemically selective between a first dielectric material and at least one other material in the stack. In this manner, the etch process step may form a series of cavities within each DM layers—e.g., a series of cavities 342 that corresponds to the third group of vias 340-*c*. When congruent cavities (e.g., adjacent cavities such as cavity 342-*a* and the next cavity (not shown) within a DM layer 320-*a*) sufficiently overlap, the congruent cavities may merge to form channels at the DM layers. In this manner, a channel may be formed at the second layer (e.g., layer 320-*a*, layer 320-*b*) that may be aligned with the first set of vias (e.g., third group of vias 340-*c* as shown in FIG. 3B).

Still referring to FIG. 3D, the deposition process step may follow the etch process step to form a layer of insulating material (e.g., an insulating layer 365) on the surface of cavities 342 (hence a channel) and via holes (e.g., opening 341). In some cases, the insulating layer 365 may be conformal (e.g., maintaining a substantially same thickness) to the uneven surface across at least two layers (e.g., across the electrode tab 355-*c* and recessed DM layer 320-*a* and then D2 layer 325). In some cases, the insulating layer 365 may facilitate formation of a cross-over region as described herein. In some cases, the deposition process step may form an insulating layer 365 that conforms to the channel.

Figure 3E:
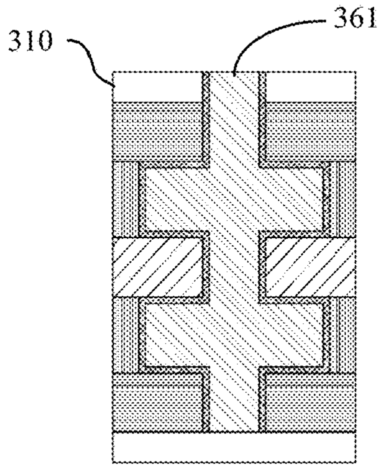

FIG. 3E illustrates a cross-sectional side view of the stack 305 across the imaginary line AA after at least a deposition process step is completed. The deposition process step may fill the channels that have been formed at DM layers (e.g., DM layers 320-*a* and 320-*b*) based on forming the insulating layer 365 using the via holes (e.g., the opening 341 that has been partially filled with the insulating layer 365 described with reference to FIG. 3D). In some cases, the deposition process step may deposit an electrode material 361. The electrode material 361 may form the set of gate electrodes 360. In some cases, the electrode material 361 may include poly-silicon, refractory metallic elements (e.g., tungsten, titanium, tantalum) or their nitrides, or a combination thereof. In some cases, excessive electrode material 361 that may be present above the HM layer 310 may be removed by using a chemical mechanical polish (CMP) process step or an etch-back process step.

Figure 3F:
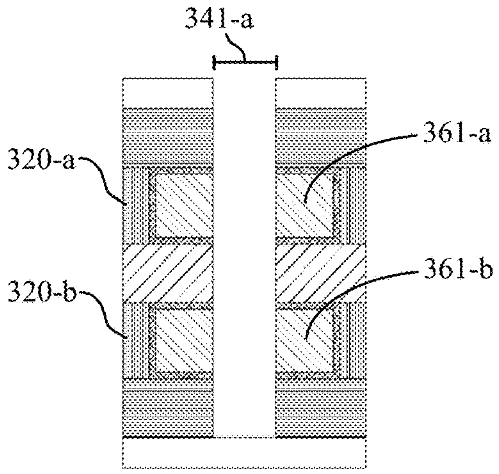

FIG. 3F illustrates a cross-sectional side view of the stack 305 across the imaginary line AA after at least an etch process step that removes the electrode material 361 from the via holes using the third group of vias 340-*c*. FIG. 3F also illustrates an opening 341-*a* that may correspond to a cross-sectional side view of a via hole (e.g., a via hole corresponding to via 340-*f* that is included in the third group of vias 340-*c*). In some cases, an anisotropic etch process step may form the opening 341-*a* and the width of opening 341-*a* may be substantially same as the width of a via (e.g., via 340-*f*). As a result of the anisotropic etch process step removing the electrode material 361 from the via holes, the electrode material within a DM layer (e.g., electrode material 361-*a* within DM layer 320-*a*) may be separated from the electrode material within another DM layer (e.g., electrode material 361-*b* within DM layer 320-*b*). In this manner, two or more gate electrodes (e.g., a set of gate electrodes 360) may be concurrently formed within the stack 305.

Figure 3G:
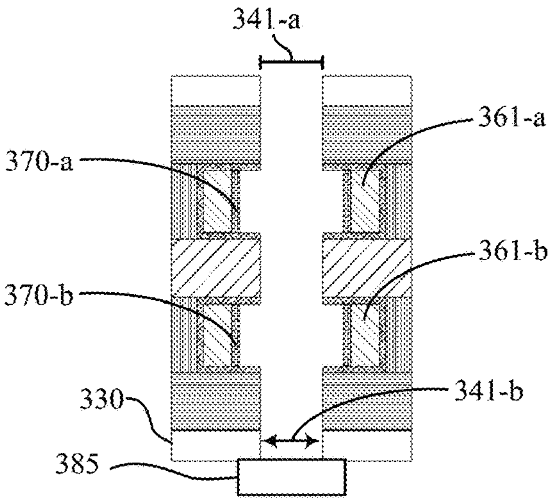

FIG. 3G illustrates a cross-sectional side view of the stack 305 across the imaginary line AA after at least an etch process step and a deposition process step are performed using the via holes (e.g., the opening 341-*a*) that have been formed within the stack 305 as described with reference to FIG. 3F.

In some cases, the etch process step may include a selective, isotropic etch step that may selectively remove the electrode material 361 while preserving the rest of the stack 305 exposed to the isotropic etch process. As a result of the isotropic etch step, the electrode material 361 within DM layers (e.g., the electrode material 361-*a* and 361-*b*) may be recessed as shown in FIG. 3G. In some cases, the isotropic etch may remove a portion of the gate electrode (e.g., the gate electrode 360 comprising the electrode material 361) to form a cavity at the second layer (e.g., layer 320). In some cases, the etch process step may also include an anisotropic etch step that selectively removes a portion of the layer 330 (e.g., hardmask material at the layer 330) to create a hole through the layer 330 (e.g., opening 341-*b* at layer 330). In some cases, a width of opening 341-*b* may be substantially same as the width of opening 341-*a*. The opening 341-*b* may be coupled with a conductive element 385 that may be part of a layer of logic circuitry. For example, the conductive element 385 may represent a node of a circuitry in a substrate (e.g., row decoder 120 constructed in a substrate 204). In another example, the conductive element 385 may be coupled with a node (e.g., a node at which a select signal is present) of row decoder 120 to activate one or more decks of array layers.

Still referring to FIG. 3G, the deposition step may form an oxide material 370 over the exposed surface of the electrode material 361 using the via (e.g., the via hole 341-*a*). In this manner, the oxide material 370 may be formed in the cavity at the second layer (e.g., layer 320), where the oxide material 370 may be in contact with the gate electrode 360 comprising the electrode material 361. In some cases, the oxide material 370 may be referred to as a gate oxide that may be present between a gate electrode and an active channel region of a TFT. The deposition step may be a kind of selective oxidation step or selective deposition step that may be configured to form the oxide material 370 over the exposed surface of the electrode material 361 only.

Figure 3H:
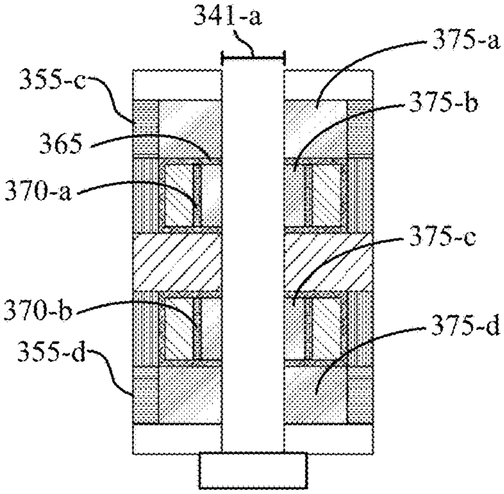

FIG. 3H illustrates a cross-sectional side view of the stack 305 across the imaginary line AA after at least a first etch process step, a deposition process step, and a second etch process step are performed using the via holes (e.g., the opening 341-*a*) that have been formed within the stack 305 as described with reference to FIG. 3G. The first etch process step may include an isotropic etch step that removes a portion of the electrode tabs 355 (e.g., a second electrode for TFTs)—e.g., selectively removing the exposed electrode material of the electrode tabs 355 within the via hole 341-*a*. The isotropic etch step may form one or more cavities at the first layer (e.g., layer 315).

Subsequently, an ohmic material 375 may be formed to fill the via hole 341-*a* as well as spaces (e.g., cavities) associated with the via hole 341-*a*—e.g., the cavities at the D1 layers (e.g., layer 315) generated by removing portions of the electrode tabs 355, the space at the DM layers (e.g., layer 320) generated by removing the electrode material 361. Thus, the ohmic material 375 may be in contact with the second electrode (e.g., the electrode tabs 355). In some cases, the ohmic material 375 may provide an ohmic contact between the electrode material (e.g., electrode tabs 355-*c* or 355-*d*) and a semiconductor material to be formed later (e.g., a semiconductor material 380 described with reference to FIG. 3I).

The ohmic material may be a material configured to provide a current path between a conductive material (e.g., electrode tabs 355-*c* or 355-*d*) and a semiconductor material (e.g., semiconductor material 380) that has an electrical resistance that is bidirectionally uniform or at least substantially uniform. That is, a current path from the conductive material to the semiconductor material by way of the ohmic material may exhibit the same or at least substantially the same electrical resistance as a current path from the semiconductor material to the ohmic material by way of the transition material. Thus, the ohmic material may avoid a rectifying junction or other non-ohmic or directional contact or current path between the conductive material (e.g., electrode tabs 355-*c* or 355-*d*) and the semiconductor material (e.g., semiconductor material 380). In some cases, the ohmic material 375 may be referred to as a transition material. The ohmic material 375 may include various compounds including transition metal elements (e.g., titanium, cobalt, nickel, copper, tungsten, tantalum). The second etch process step may include an anisotropic etch step that removes the ohmic material 375 in a vertical direction within the via holes using the opening 341-*a*. In this manner, the ohmic materials outside of the via holes (e.g., ohmic material 375-*a*, ohmic material 375-*b*) may remain intact.

Figure 3I:
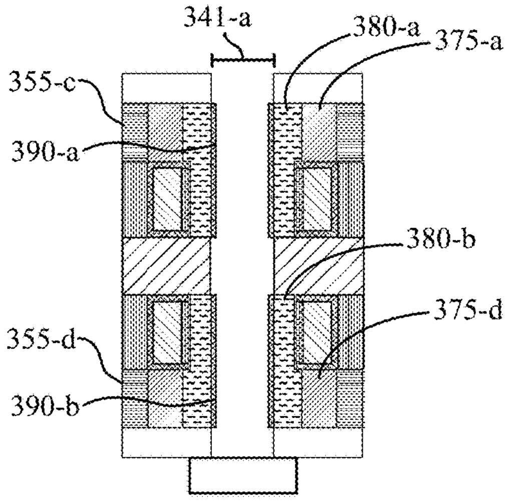

FIG. 3I illustrates a cross-sectional side view of the stack 305 across the imaginary line AA after at least a first etch process step, a first deposition process step, a second etch process step, and a second deposition step are performed using the via holes (e.g., the opening 341-*a*) that have been formed within the stack 305 described with reference to FIG. 3H. The first etch process step may include an isotropic etch step that selectively removes portions of the ohmic material 375 exposed within the opening 341-*a* (e.g., a portion of ohmic material 375-*a* at the D1 layers, ohmic material 375-*b* at the DM layers. In this manner, the isotropic etch step may form a cavity that spans the first layer (e.g., layer 315) and the second layer (e.g., layer 320). The first etch process step may also include an etch step that selectively removes exposed insulating layer 365 as a result of removing the portions of ohmic material 375. The first deposition process step may fill the via holes (e.g., the opening 341-*a*) as well as spaces (e.g., cavities that spans the first layer and the second layer) created by the first etch process step with a semiconductor material 380. The second etch process step may remove the semiconductor material 380 in a vertical direction in the via holes using the opening 341-*a*. The second deposition step may selectively form an insulating material 390 over the exposed surface of semiconductor material 380 within the via holes such that the insulating material 390 may be in contact with the semiconductor material 380. In some cases, a thickness of the insulating material 390 may be determined based on a second gate effect (e.g., to avoid a second gate effect).

Figure 3J:
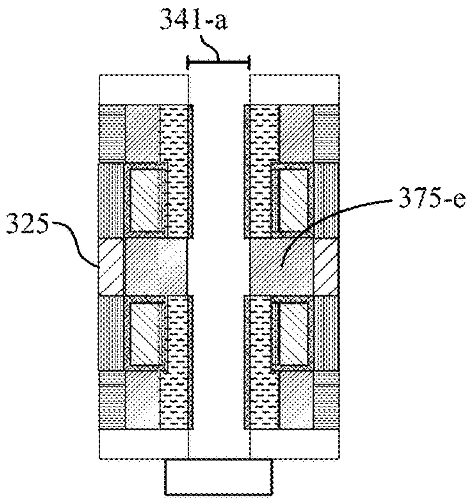

FIG. 3J illustrates a cross-sectional side view of the stack 305 across the imaginary line AA after at least a first etch process step, a deposition process step, and a second etch process step are performed using the via holes (e.g., the opening 341-*a*) that have been formed within the stack 305 as described with reference to FIG. 3I. The first etch process step may include an anisotropic etch step that selectively removes a portion of the third layer (e.g., layer 325, D2 layer) to create cavities therein. Subsequently, the deposition process step may fill the via hole and the cavities with the ohmic material 375 (e.g., ohmic material 375-*c*). The second etch process step may remove the ohmic material 375 in a vertical direction from the via holes such that the ohmic material (e.g., ohmic material 375-*c*) remains in the cavity at the third layer. The remaining ohmic material (e.g., ohmic material 375-*c*) at the third layer may be in contact with a third electrode (e.g., a conductive plug 396 described with reference to FIGS. 3K and 3L).

Figure 3K:
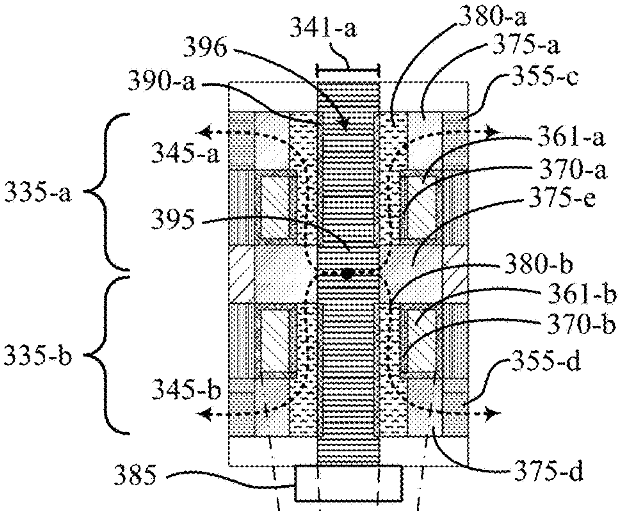

FIG. 3K illustrates a cross-sectional side view of the stack 305 across the imaginary line AA after at least a deposition process step is performed using the via holes (e.g., the opening 341-*a*) that have been formed within the stack 305 as described with reference to FIG. 3J. The deposition process step may fill the via hole with an electrode material 395. In some cases, the electrode material 395 may be the same electrode material of the electrode tabs 355 or the array electrodes 350. As a result of filling the via hole with the electrode material 395 (e.g., forming a conductive plug 396), the conductive element 385 (e.g., a node associated with a layer of logic circuitry) may be coupled with the ohmic material 375-*e* that is in contact with the semiconductor material 380-*a*. The semiconductor material 380-*a* that is further coupled with the electrode material 361-*a* of the gate electrode 360 through the oxide material 370-*a* (e.g., the gate electrode 360 in contact with the oxide material 370-*a*) may form an active channel for a current to flow based on a voltage applied to the gate electrode 360. Additionally, the semiconductor material 380-*a* is in contact with the ohmic material 375-*a* that is in contact with the electrode tab 355-*c*.

As such, FIG. 3K may illustrate a cross-section side view of TFTs (e.g., two vertical TFTs 335-*a* and 335-*b*) constructed in a socket region of array layers comprising the stack 305. A conductive plug 396 (e.g., the via hole filled with an electrode material 395) may function as a common source for the TFTs—e.g., a third electrode that extends through the third layer (e.g., layer 325). The conductive plug 396 may be further coupled with a conductive element 385 (e.g., a node associated with a logic circuit). The semiconductor material 380-*a* that surrounds the conductive plug 396 may function as an active channel for an upper TFT 335-*a*. Similarly, the semiconductor material 380-*b* that surrounds the conductive plug 396 may function as an active channel for a lower TFT 335-*b*. The electrode tab 355-*c* that is coupled with the semiconductor material 380-*a* (e.g., through ohmic material 375-*a*) may function as a drain for the upper TFT 335-*a*. Similarly, the electrode tab 355-*d* that is coupled with the semiconductor material 380-*b* (e.g., through ohmic material 375-*d*) may function as a drain for the lower TFT 335-*b*.

In some cases, FIG. 3K (in view of FIG. 3L) depicts an ohmic material 375-*a* at the first layer (e.g., D1 layer 315), where the ohmic material 375-*a* surrounds and in contact with the semiconductor material 380-*a* at the first layer. FIG. 3K also depicts an insulating material 390-*a* interposed between the conductive plug 396 and the semiconductor material 380-*a*. Further, FIG. 3K depicts a portion of ohmic material (e.g., ohmic material 375-*c*) at the third layer (e.g., D2 layer 325), where the ohmic material 375-*e* is in contact with the semiconductor material 380-*a* such that the conductive plug 396 may be coupled with the semiconductor material 380-*a*. In some cases, the ohmic material 375-*e* may surround the conductive plug 396.

FIG. 3K depicts current paths 345 to illustrate some operational aspects of the TFTs. For example, a first signal (e.g., a select signal from a logic circuitry) at the conductive element 385 may provide a first voltage (e.g., 0 V) to the conductive plug (e.g., common source of both upper TFT 335-*a* and lower TFT 335-*b*). Further, a second voltage (e.g., 1 V) applied to one of the gate electrodes (e.g., upper gate electrode 360 including the electrode material 361-*a*) may be greater than a threshold voltage (e.g., 0.2 V) of the TFTs to form a conductive path (e.g., active channel region) within the semiconductor material 380-*a*. Further, a third voltage (e.g., 0.5 V) may be applied to the electrode tab 355-*c* (e.g., drain of upper TFT 335-*a*) such that an electrical current may flow from the source of TFT (e.g., the conductive plug 396 that is coupled with a node of a logic circuitry) to the drain of TFT (e.g., the electrode tab 355-*c* that is coupled with an array electrode, i.e., word line) as indicated as an upper current path 345-*a*. Similarly, a lower current path 345-*b* may be established when the second voltage is applied to lower gate electrode including the electrode material 361-*b* and the third voltage is applied to the electrode tab 355-*d* (e.g., drain of lower TFT 335-*b*). In some cases, the voltages associated with the TFTs (e.g., first voltage, second voltage, third voltage) may not be independent of each other—e.g., during the TFTs performing decoding function or selection function. In other cases, the voltage associated with the TFTs may be independent of each other if a separate circuit is present—e.g., a circuit driving a voltage to the TFTs, an activated memory cell conducting a current.

The TFTs illustrated in FIG. 3K may depict a word line socket region because the electrode tabs 355 in D1 layers may be coupled with array electrodes built in D1 layers (e.g., word lines). Further, the TFTs illustrated in FIG. 3K may operate to activate or deactivate one of the two decks of memory cells in an active cell region of the array layers comprising the stack 305. In some cases, the drains of the TFTs (e.g., drain of upper TFT 335-*a* connected to the electrode tab 355-*c*) may be driven to a voltage that may be related to the voltage present at the conductive element 385 through the conductive path (e.g., active channel region) as described herein.

Figure 3L:
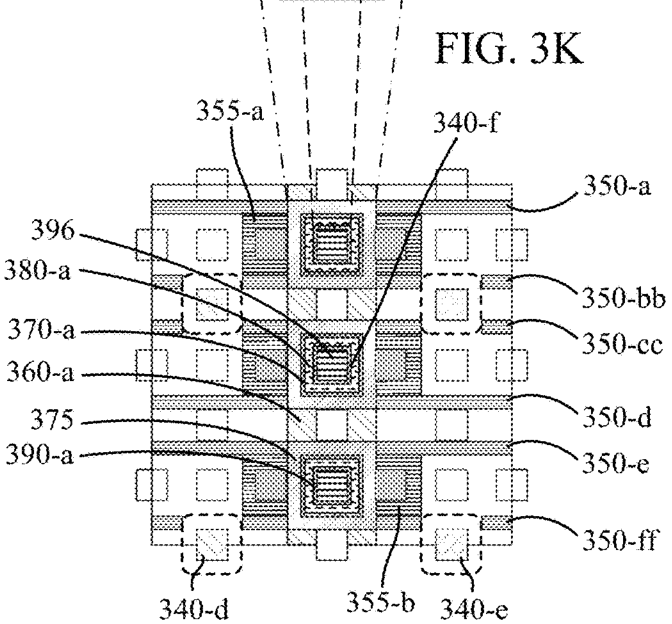

FIG. 3L illustrates a top-down view of the stack 305 including two or more TFTs (e.g., vertical TFTs) comprising gate, source, and drain electrodes completed. FIG. 3L also illustrates various structures that forms a socket region (e.g., word line socket region) of array layers. For example, FIG. 3L illustrates the set of array electrodes 350, the set of electrode tabs 355 (depicted as dark-shaded rectangles), and a set of gate electrodes 360 as described herein.

For example, FIG. 3L depicts a top-down view of a conductive plug 396 (e.g., the via hole 341-*a* filled with an electrode material 395) that extends through the stack 305 that comprises a first layer (e.g., D1 layer 315), a second layer (e.g., DM layer 320), and a third layer (e.g., D2 layer 325). The conductive plug 396 may be formed using a via that is common between two sets of vias (e.g., via 340-*f* that is common between the second group of vias 340-*b* and the third group of vias 340-*c* as described with reference to FIG. 3B). FIG. 3L further depicts a semiconductor material 380-*a* at the first layer (e.g., D1 layer 315) and the second layer (e.g., DM layer 320), where the semiconductor material 380-*a* surrounds the conductive plug 396. FIG. 3L also depicts an oxide material 370-*a* at the second layer (e.g., DM layer 320) and in contact with the semiconductor material 380-*a*. Additionally, FIG. 3L depicts a gate electrode 360-*a* at the second layer (e.g., DM layer 320). The gate electrode 360-*a* comprising the electrode material 361-*a* is in contact with the oxide material 370-*a* as also depicted in FIG. 3K. In some cases, a combination of the semiconductor material 380-*a*, the oxide material 370-*a*, and the electrode material 361-*a* may form an active channel within the semiconductor material 380-*a* for the TFT (e.g., vertical TFT), where an electrical current may flow through the active channel based on a voltage applied to the gate electrode 360-*a*.

In some cases, FIG. 3L depicts a portion of ohmic material (e.g., ohmic material 375-*a*) at the first layer (e.g., D1 layer 315), where the ohmic material 375-*a* is in contact with the semiconductor material 380-*a* and surrounds the conductive plug 396 as also shown in FIG. 3K. FIG. 3L also depicts an insulating material 390-*a* interposed between the conductive plug 396 and the semiconductor material 380-*a*.

Figure 4A:
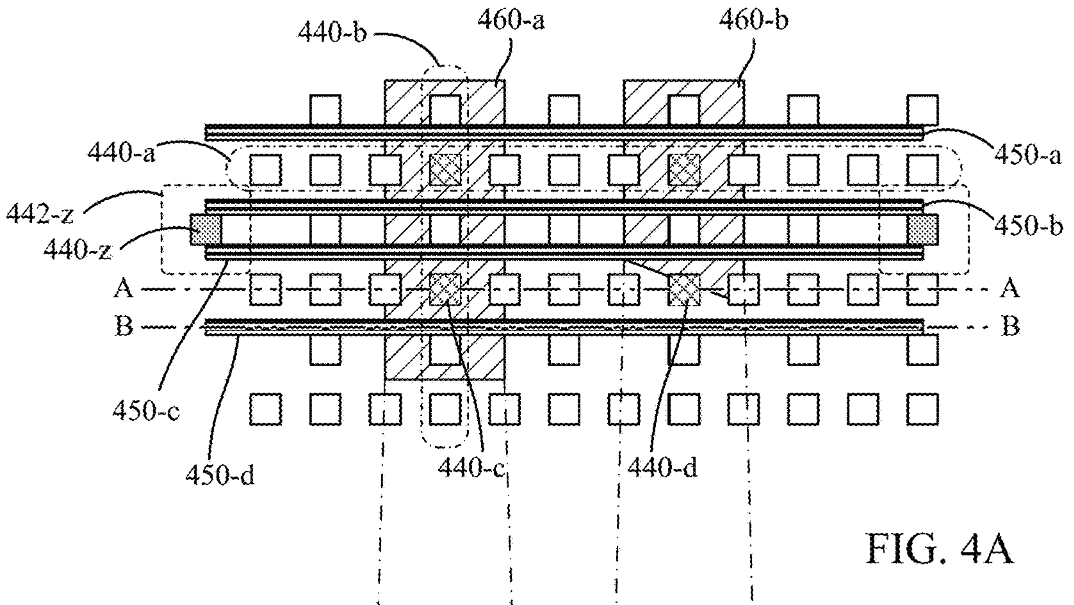
FIGS. 4A-4AA illustrate exemplary fabrication techniques that support thin film transistors and related fabrication techniques in accordance with embodiments of the present disclosure.

FIGS. 4A-4AA illustrate exemplary fabrication techniques in accordance with the present disclosure. FIGS. 4A-4AA describe aspects of several process steps for concurrently constructing two or more TFTs (e.g., TFTs that may be referred to as planar TFTs and in which an electrical current flows in a horizontal (parallel) direction with respect to a horizontal substrate, when the TFT is activated). In some cases, such TFTs may be fabricated in a socket region of array layers as described herein. In some cases, TFTs may be referred to as array electrode drivers. FIGS. 4A-4AA include top-down views of a portion of socket region (e.g., a layout of the socket region) to illustrate that different groups of vias may be used to concurrently construct various structures of the TFTs. FIGS. 4A-4AA also include cross-sectional side views of the portion of socket region to illustrate aspects of process features during several process steps for concurrently constructing the TFTs.

FIGS. 4A-4AA illustrate exemplary fabrication techniques to construct planar TFTs within a composite stack (e.g., the stack 305 for constructing the vertical TFTs as described with reference to FIGS. 3A-3L). As such, a composite stack may be used to construct vertical TFTs or planar TFTs, or both in a socket region of array layers. As described herein, the composite stack may also be used to construct a 3D cross-point array of memory cells and associated electrodes in an active array region of the array layers. In this manner, the composite stack may provide for constructing array layers that each include a deck of memory cells and electrodes, where the electrodes (thus memory cells) may be further coupled with the TFTs (e.g., vertical TFTs, horizontal TFTs, a combination of vertical TFTs and horizontal TFTs).

FIG. 4A illustrates a top-down view of a stack 405 where a socket region including two or more TFTs (e.g., horizontal TFTs) may be constructed as described herein. The stack 405 may be an example of the stack 305 described with reference to FIGS. 3A-3L. FIG. 4A illustrates a set of vias 440 (depicted as white, grey, or cross-hatched squares) in an array pattern. The set of vias 440 may be formed through a top layer (e.g., layer 310 of stack 305) of the stack 405 that includes a first layer (e.g., layer 315 of stack 305) and a second layer (e.g., layer 320 of stack 305). The set of vias 440 may be an example of the set of vias 340 described with reference to FIGS. 3A-3L. FIG. 4A also illustrates various structures that may be concurrently formed within the stack 405 using a different groups of vias (e.g., first group of vias 440-*a*, second group of vias 440-*b*). For example, FIG. 4A illustrates a set of array electrodes 450 (which may be examples of array electrodes 350 described with reference to FIGS. 3A-3L) and a set of gate electrodes 460 (which may be examples of gate electrodes 360 described with reference to FIGS. 3A-3L), each of which may be formed at different junctures of process sequence to construct the TFTs.

As described elsewhere, the set of array electrodes 450 (e.g., array electrodes 450-*a* and 450-*b*) may be constructed using a first subset of vias (e.g., a first group of vias 440-*a*). In some cases, the array electrodes may function as third electrodes for the TFTs. Additionally, the set of gate electrodes 460 (e.g., gate electrode 460-*a*) may be constructed using a second subset of vias (e.g., a second group of vias 440-*b*) as described herein with reference to FIGS. 3C through 3F.

In some cases, a subset of array electrodes 450 (e.g., array electrode 450-*b*, array electrode 450-*c*) may be severed into several segments using vias (e.g., vias depicted as grey squares that include via 440-2) that may form cavities (e.g., cavity 442-*z* that corresponds to via 440-*z*). Subsequently, an etch process step may remove portions of array electrodes 450 exposed within the cavities to sever the subset of array electrodes 450 into two or more segments. As described herein with reference to FIGS. 4Y, severing the subset of array electrodes may facilitate a subset of TFTs formed in the socket region to drive a single array electrode (e.g., array electrode 450-*a*, array electrode 450-*d*). In some cases, the subset of TFTs may be located in between two ends of the single array electrode. For example, the subset of TFTs may be located approximately in a middle region of the single array electrode.

Figure 4B:
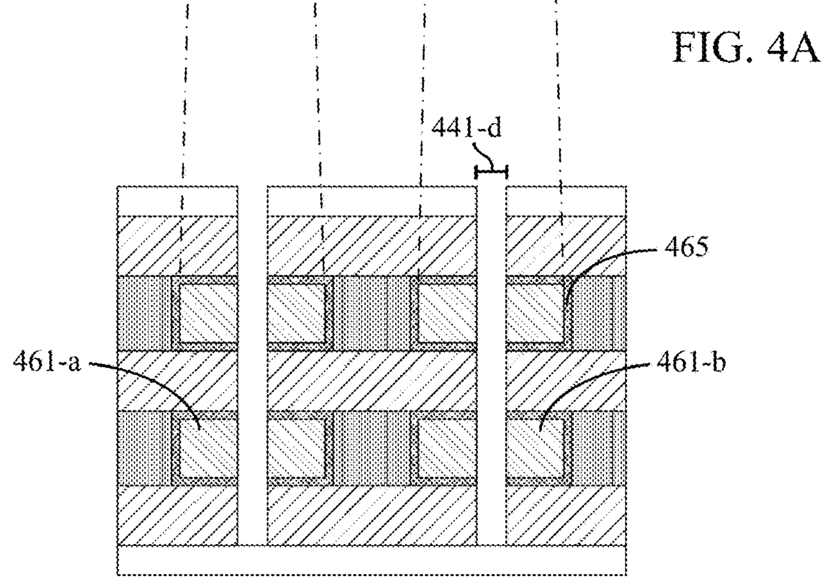

FIG. 4B illustrates a cross-sectional side view of the stack 405 across an imaginary line AA shown in FIG. 4A after via holes (e.g., opening 441-*d* corresponding to via 440-*d*) are formed using a third group of vias (e.g., vias depicted as cross-hatched squares in FIG. 4A that include via 440-*c* and via 440-*d*). The cross-sectional side view may correspond to a portion of the socket region that includes the gate electrodes 460-*a* and 460-*b*. Electrode material 461 (which may be an example of electrode material 361 described with reference to FIGS. 3A-3L) may have been previously formed in DM layers of the stack 405 as described herein. The electrode material 461 depicted in FIG. 4B corresponds to the gate electrodes 460 depicted in FIG. 4A—e.g., electrode material 461-*a* forming gate electrodes 460-*a*, electrode material 461-*b* forming gate electrode 460-*b*. FIG. 4B illustrates that an insulating layer 465 (which may be an example of the insulating layer 365 described with reference to FIGS. 3A-3L) partially surrounds electrode material 461. In some cases, an etch process (e.g., anisotropic etch process) may remove a portion of the insulating layer 465 that is exposed to the etch process that forms the via hole.

Figure 4C:
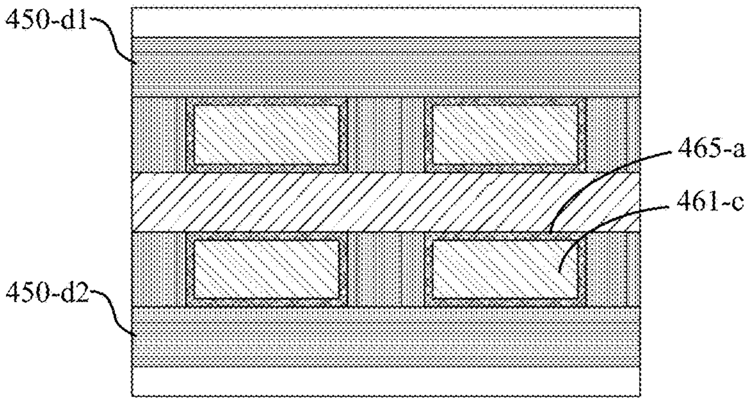

FIG. 4C illustrates a cross-sectional side view of the stack 405 across an imaginary line BB shown in FIG. 4A after via holes (e.g., opening 441-*d*) are formed using the third group of vias (e.g., vias depicted as cross-hatch squares in FIG. 4A that include via 440-*c* and via 440-*d*). FIG. 4C depicts a different cross-sectional side view of the stack 405 at the same process step as depicted in FIG. 4B so as to highlight various aspects of the fabrication techniques for forming the TFTs. The cross-sectional side view of FIG. 4C also correspond to the portion of the socket region that includes the gate electrodes 460-*a* and 460-*b*. FIG. 4C illustrates that the insulating layer (e.g., insulating layer 465-*a*) surrounds the electrode material 461-*c* (that may form gate electrode 460-*b*) because the insulating layer 465 captured in the cross-sectional side view of FIG. 4C remains intact while the via holes are formed—e.g., the anisotropic etch process may not reach the insulating layer 465-*a*. Further, FIG. 4C illustrates that array electrodes 450 may have been formed in D1 layers of the stack 405—e.g., array electrode 450-*d*1, array electrode 450-*d*2.

Figure 4D:
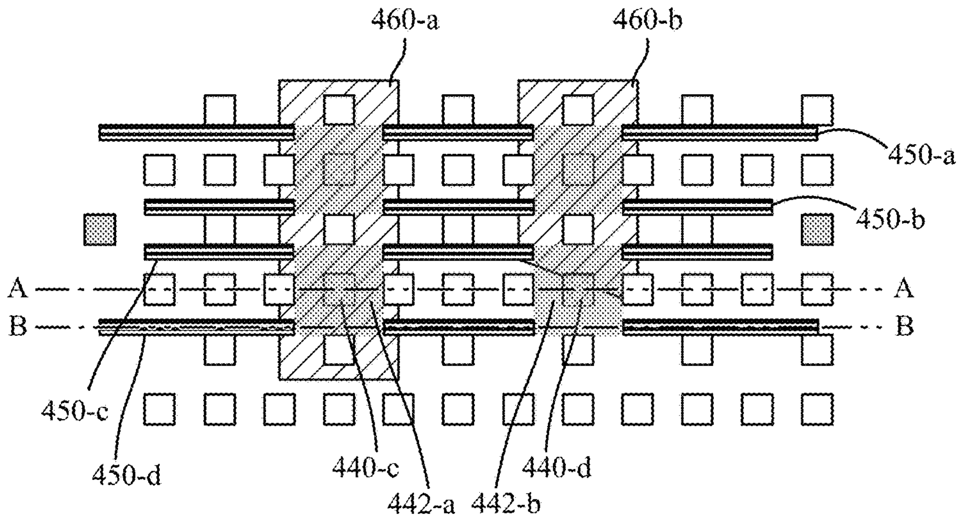

FIG. 4D illustrates a top-down view of the stack 405 after at least an etch process step and a deposition process step are performed using the via holes (e.g., the opening 441-*d*) that have been formed within the stack 405 as described with reference to FIGS. 4A and 4B. Additionally, FIG. 4D depicts that portions of array electrodes (e.g., array electrode 450-*b*, array electrode 450-*c*) have been removed using certain vias (e.g., via 440-*z* and corresponding cavity 442-*z* described with reference to FIG. 4A). As a result, some array electrodes (e.g., array electrode 450-*b*, array electrode 450-*c*) may be dissociated with array electrodes in an active array region of array layers.

Figure 4E:
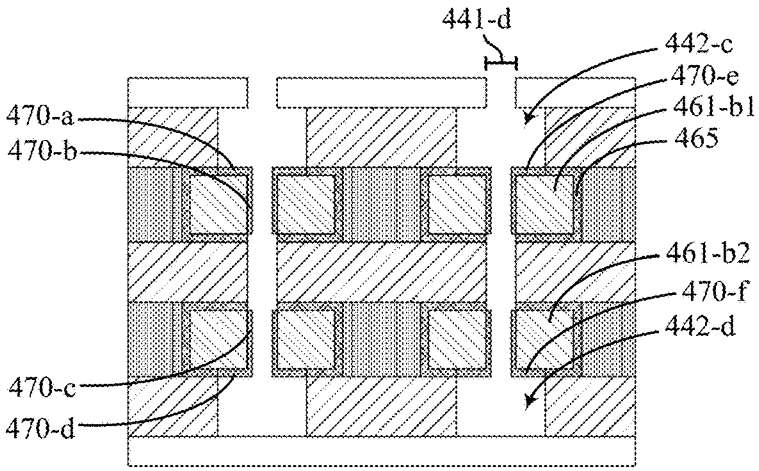
Figure 4F:
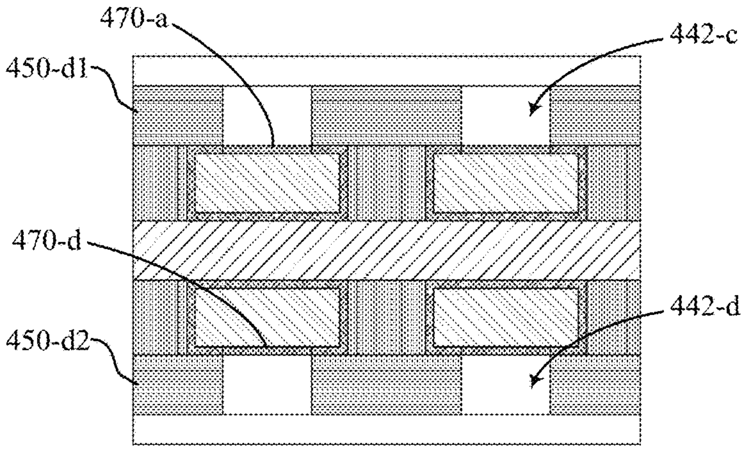

FIG. 4E illustrates a cross-sectional side view of the stack 405 across an imaginary line AA shown in FIG. 4D after the etch process step and the deposition process step. Similarly, FIG. 4F illustrates a cross-sectional side view of the stack 405 across an imaginary line BB shown in FIG. 4D after the etch process step and the deposition process step. In this manner, FIGS. 4D-4F illustrate various aspects of structural features formed within the stack 405 as a result of the etch process step and the deposition process step.

In some cases, the etch process step may include a first isotropic etch process that uses the via hole (e.g., opening 441-*d*) to reach layers that underlie a top layer (e.g., hardmask layer) of the stack 405. The first isotropic etch process may selectively remove a first dielectric material of D1 layers within the stack 405. The first isotropic etch process may leave other materials (e.g., materials other than the first dielectric material of D1 layers) exposed in the via hole substantially unchanged—e.g., insulating layer 465, electrode material 461, second dielectric material in D2 layer. As a result of the first isotropic etch process, via cavities 442 (e.g., via cavity 442-*b* that corresponds to via 440-*d* depicted in FIG. 4D, via cavity 442-*c* and via cavity 442-*d* that correspond to via 440-*d* depicted in FIGS. 4E and 4F) may form at D1 layers. FIG. 4D illustrates that via cavities (e.g., via cavity 442-*a* and via cavity 442-*b* depicted as a light-gray square in a top-down view) may reach to array electrodes 450 (e.g., array electrode 450-*c*, array electrode 450-*d*) to expose the array electrodes 450 at the D1 layers.

In some cases, the etch process may also include a second isotropic etch process that may selectively remove portions of the array electrode 450 at the D1 layers—e.g., the portions of array electrode 450 exposed to the second isotropic etch process as a result of the first isotropic etch process. The second isotropic etch process may leave other materials (e.g., materials other than the array electrode 450 at the D1 layers) exposed in the via hole and the via cavity substantially unchanged—e.g., insulating layer 465, electrode material 461, first dielectric material in D1 layers, second dielectric material in D2 layer. As a result of the second isotropic etch process, FIG. 4F illustrates that a portion of array electrodes 450 (e.g., array electrode 450-*d*1, array electrode 450-*d*2) has been removed to form (e.g., expand) the via cavities (e.g., via cavity 442-*c*, via cavity 442-*d*). In addition, FIG. 4D illustrates that the second isotropic etch process may remove portions of array electrodes, for example, overlap areas between the via cavities (e.g., via cavity 442-*a*) and the array electrodes (e.g., array electrode 450-*c*, array electrode 450-*d*).

In some cases, the etch process may also include a third isotropic etch process that may selectively remove the insulating layer 465 at the DM layers that are exposed in the via hole and the via cavity. The third isotropic etch process may leave other materials (e.g., materials other than the insulating layer 465) exposed in the via hole and the via cavity substantially unchanged—e.g., electrode material 461, first dielectric material in D1 layers, second dielectric material in D2 layer, array electrode 450 at D1 layers. As a result of the third isotropic etch process, portions of electrode material 461 may become exposed to the deposition process.

In some cases, the deposition process step may selectively form oxide material 470 (which may be an example of oxide material 370 as described with reference to FIGS. 3A-3L) over the exposed surface of the electrode material 461. In some cases, the oxide material 470 may function as a gate oxide of the TFT.

In some cases, the second isotropic etch process, using a via (e.g., via 440-*d*) of the second group of vias 440-*b* that has been used to form the gate electrode (e.g., gate electrode 460-*b*) for the TFTs, may form a cavity at the first layer (e.g., cavity 442-*c*, cavity 442-*d*) to expose a portion of gate electrode (e.g., electrode material 461-*b*1, electrode material 461-*b*2). The deposition process step, using the via (e.g., via 440-*d*) may form an oxide material (e.g., oxide material 470-*c*, oxide material 470-*f*) in contact with the gate electrode (e.g., electrode material 461-*b*1, electrode material 461-*b*2).

Figure 4G:
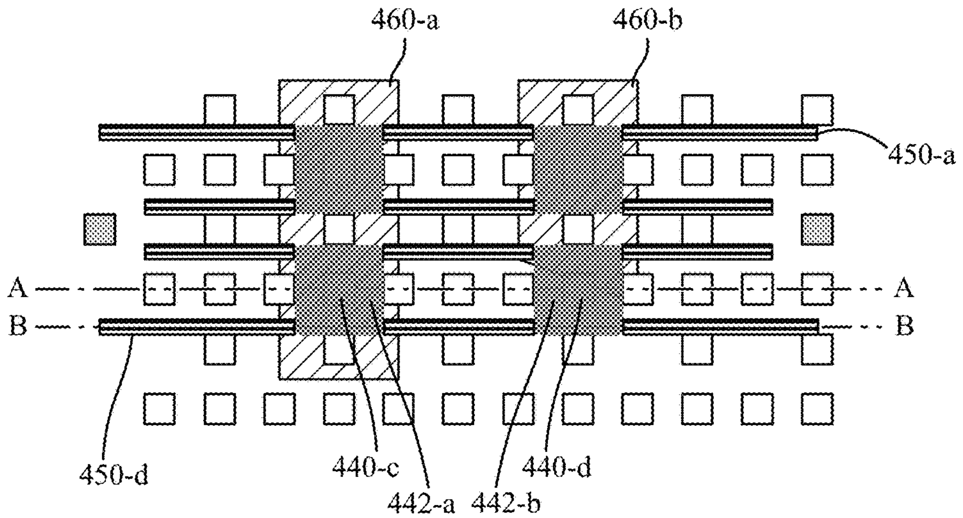
Figure 4H:
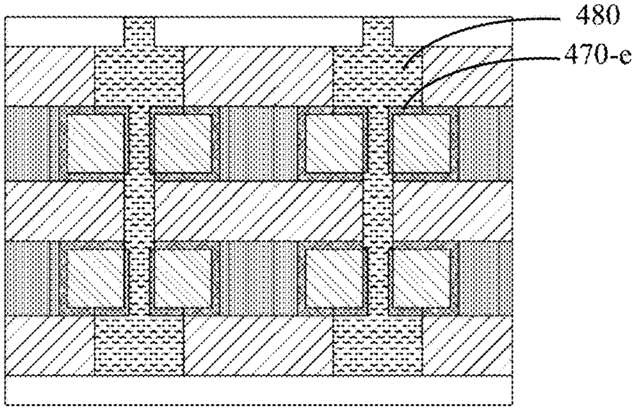
Figure 4I:
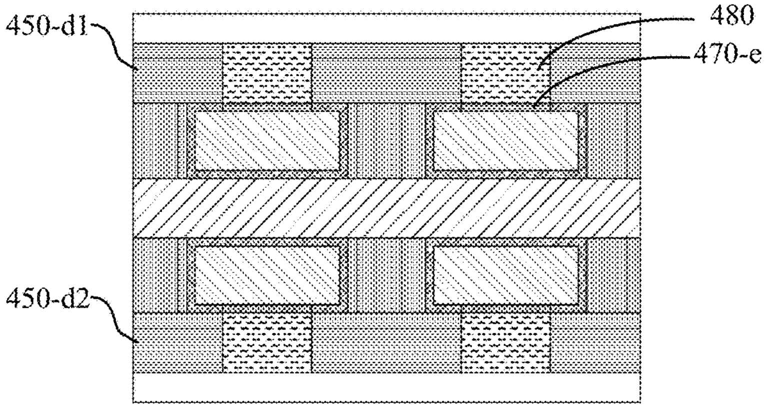

FIG. 4G illustrates a top-down view of the stack 405 after at least a deposition process step is performed using the via holes (e.g., opening 441-*d* as shown in FIG. 4E) and the via cavities (e.g., via cavity 442 as shown in FIGS. 4E and 4F) that have been formed within the stack 405 as described with reference to FIGS. 4D through 4F. FIG. 4H illustrates a cross-sectional side view of the stack 405 across an imaginary line AA shown in FIG. 4G after the deposition process step. Similarly, FIG. 4I illustrates a cross-sectional side view of the stack 405 across an imaginary line BB shown in FIG. 4G after the deposition process step.

In some cases, the deposition process step may fill the via holes and the via cavities with a semiconductor material 480 (which may be an example of semiconductor material 380 as described with reference to FIGS. 3A-3L). FIG. 4G depicts a top-down view of via cavities filled with the semiconductor material 480 (e.g., via cavity 442-*a* depicted as a dark-gray square). FIG. 4H depicts that the semiconductor material 480 may be in contact with the oxide material 470 (e.g., the gate oxide). FIG. 4I depicts that the semiconductor material 480 may fill the cavity and may be in contact with the oxide material 470 (e.g., the gate oxide).

In some cases, the deposition step, using the via (e.g., via 440-*d*) of the second group of vias 440-*b* that has been used to form the gate electrode (e.g., gate electrode 460-*b*) for the TFTs, may form a semiconductor material (e.g., semiconductor material 480) in the cavity (e.g., cavity 442-*c*, cavity 442-*d* as shown in FIGS. 4E and 4F) and the semiconductor material may be in contact with the oxide material (e.g., oxide material 470-*c*).

Figure 4J:
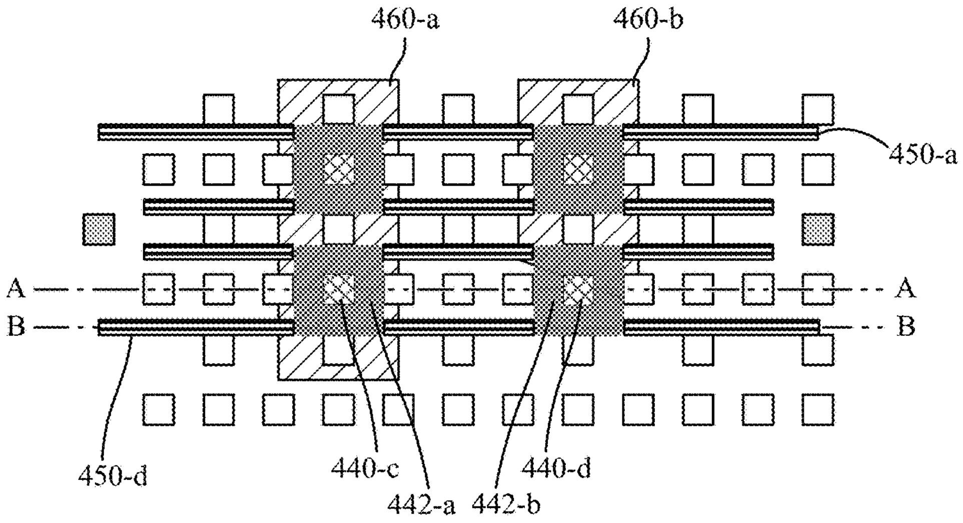
Figure 4K:
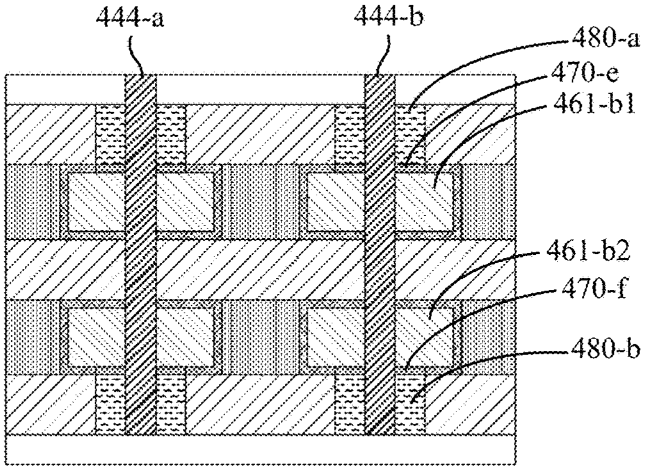
Figure 4L:
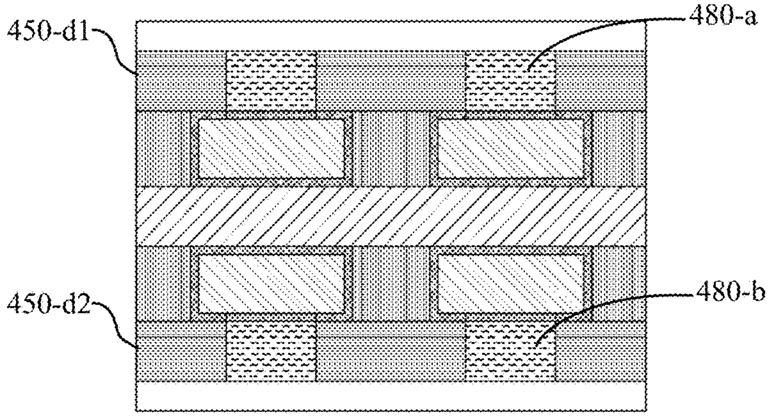

FIG. 4J illustrates a top-down view of the stack 405 after at least an etch process step and a deposition process step are performed for the third group of vias (e.g., vias depicted as cross-hatched squares in FIG. 4J that include via 440-*c* and via 440-*d*) that have been filled with the semiconductor material 480 as described with reference to FIGS. 4G through 4I. FIG. 4K illustrates a cross-sectional side view of the stack 405 across an imaginary line AA shown in FIG. 4J after the etch process step and the deposition process step. Similarly, FIG. 4L illustrates a cross-sectional side view of the stack 405 across an imaginary line BB shown in FIG. 4J after the deposition process step.

In some cases, the etch process may include a first anisotropic etch process that may selectively remove the semiconductor material 480 within via holes (e.g., via holes corresponding to the third group of vias) in a vertical direction (e.g., in a vertical direction with respect to a horizontal substrate). In some cases, the etch process may include a second anisotropic etch process that may selectively remove the oxide material 470 in the via holes. As a result of the etch process that removes the semiconductor material 480 in the via holes, the semiconductor material at the upper D1 layer (e.g., semiconductor material 480-*a*) may be separated from the semiconductor material at the lower D1 layer (e.g., semiconductor material 480-*b*) as shown in FIG. 4K.

In some cases, the deposition process step may include filling the via holes with a dielectric material (e.g., an insulating material). In some cases, excessive dielectric material on top of the stack 405 may be removed using a CMP process or an etch-back process. FIG. 4K depicts the via holes filled with the dielectric material (e.g., dielectric plug 444-*a*, dielectric plug 444-*b*) that separates the semiconductor material 480-*a* at the upper D1 layer and the semiconductor material 480-*b* at the lower D1 layer. The semiconductor material (e.g., semiconductor material 480-*a*) at the first layer (e.g., D1 layers of stack 405) may surround the dielectric plugs (e.g., dielectric plug 444-*b*). Further, the gate electrode (e.g., electrode material 461-*b*1, electrode material 461-*b*2) at the second layer (e.g., DM layer of stack 405) may surround the dielectric plugs (e.g., dielectric plug 444-*b*). Additionally, an oxide material (e.g., oxide material 470-*c*) may be between the semiconductor material (e.g., semiconductor material 480-*a*) and the gate electrode (e.g., electrode material 461-*b*1). Structural features depicted in FIG. 4L remains the same as the structural features depicted in FIG. 4I because the structural features depicted in FIG. 4L are located away from the via holes—e.g., the etch process step and the deposition process step may not affect the structural features depicted in FIG. 4L.

Figure 4M:
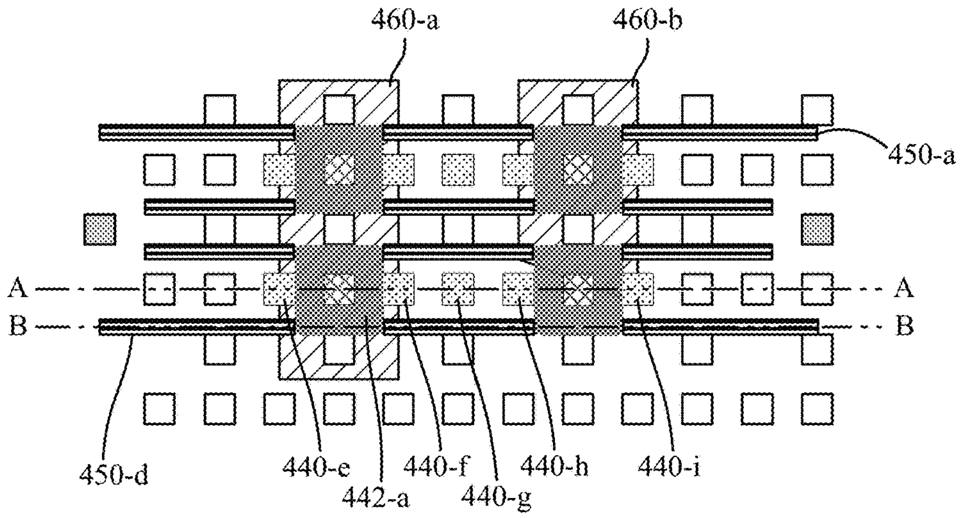
Figure 4N:
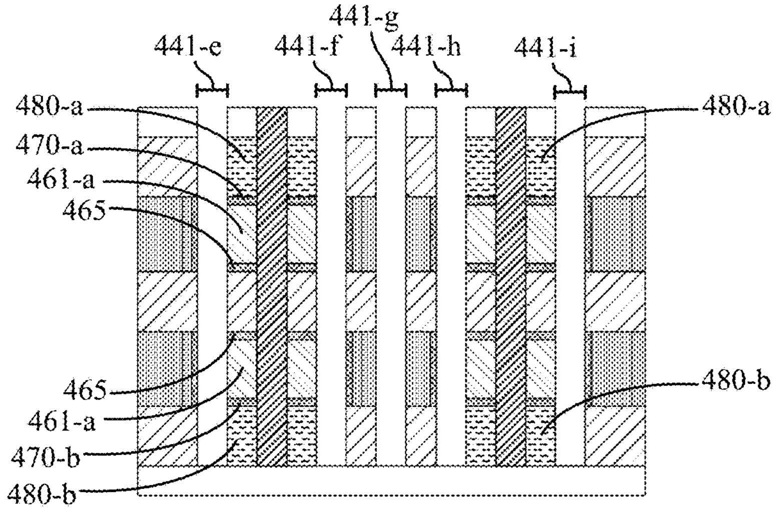
Figure 4O:
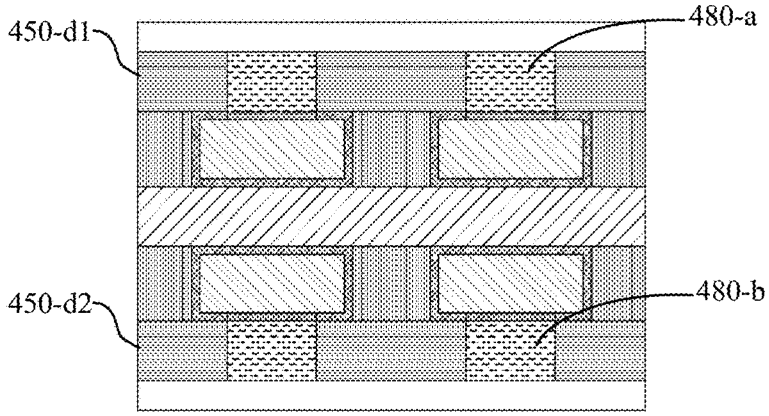

FIG. 4M illustrates a top-down view of the stack 405 after at least an etch process step is performed for a fourth group of vias (e.g., vias depicted as dot-filled squares in FIG. 4M that include via 440-*c* through via 440-*i*). Some of the vias of the fourth group (e.g., via 440-*c* and via 440-*f*) are next to the via cavity filled with the semiconductor material (e.g., via cavity 442-*a* that has been filled with the semiconductor material 480) as described with reference to FIGS. 4J through 4L. FIG. 4N illustrates a cross-sectional side view of the stack 405 across an imaginary line AA shown in FIG. 4M after the etch process step. Similarly, FIG. 4O illustrates a cross-sectional side view of the stack 405 across an imaginary line BB shown in FIG. 4M after the etch process step.

In some cases, the etch process may include an anisotropic etch process that may remove various materials in a vertical direction (e.g., in a vertical direction with respect to a horizontal substrate) to form via holes that correspond to the fourth group of vias—e.g., via holes 441-*e* through 441-*i* that each correspond to via 440-*e* through 440-*i*, respectively. In some cases, the various materials that the anisotropic etch process may remove include HM layer (top layer) and D1 layer of the stack 405, insulating layer 465, electrode material 461, D2 layer of the stack 405. In some cases, the anisotropic etch process may stop at the bottom layer of the stack 405 as shown in FIG. 4N. Structural features depicted in FIG. 4O remains the same as the structural features depicted in FIG. 4L because the structural features depicted in FIG. 4O are located away from the third group of via holes (e.g., via holes 441-*c* through 441-*i*)—e.g., the anisotropic etch process may not affect the structural features depicted in FIG. 4O.

Figure 4P:
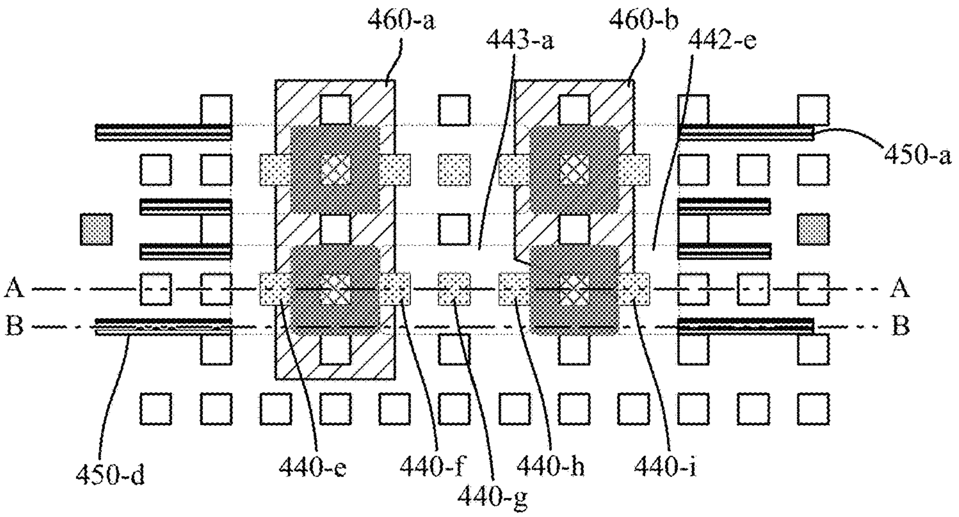
Figure 4Q:
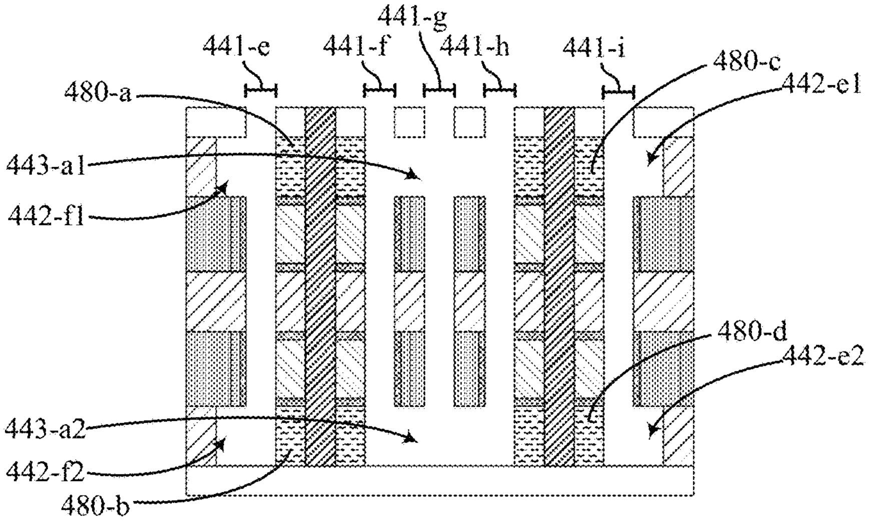
Figure 4R:
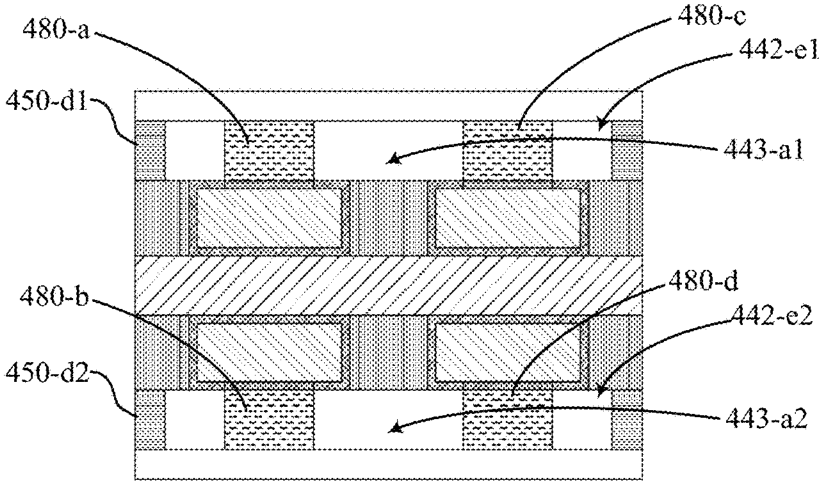

FIG. 4P illustrates a top-down view of the stack 405 after at least an etch process step is performed to the stack 405 using the via holes (e.g., via holes 441-*e* through 441-*i*) corresponding to the fourth group of vias (e.g., vias depicted as dot-filled squares in FIG. 4P that include via 440-*c* through via 440-*i*) as described with reference to FIGS. 4M and 4N. FIG. 4Q illustrates a cross-sectional side view of the stack 405 across an imaginary line AA shown in FIG. 4P after the etch process step. Similarly, FIG. 4R illustrates a cross-sectional side view of the stack 405 across an imaginary line BB shown in FIG. 4P after the etch process step.

In some cases, the etch process step may include a first isotropic etch process. The first isotropic etch process may selectively remove a portion of the first dielectric materials at D1 layers to create cavities (e.g., cavity 442-*e*, cavity 442-*f*) such that the cavities may expose the array electrodes 450 at D1 layers as shown in FIGS. 4P and 4R. Also, FIGS. 4P through 4R depict that two or more cavities may adjoin to form a channel (e.g., channel 443-*a*). In some cases, the etch process may include a second isotropic etch process. The second isotropic etch process may selectively remove the exposed array electrode 450 at D1 layers (e.g., array electrode 450-*d*1, array electrode 450-*d*2) as depicted in FIGS. 4P and 4R.

In some cases, the etch process step may remove any exposed oxide material 470 (e.g., gate oxide) while removing the portion of dielectric materials at D1 layers or the exposed array electrode 450 at D2 layers. The etch process may preserve the semiconductor material substantially intact (e.g., semiconductor material 480). Additionally, the etch process may preserve a second dielectric materials of D2 layer of the stack 405 substantially intact. FIG. 4R depicts that the etch process step extends the cavities to reach the array electrodes 450 at D1 layers and remove a portion of the array electrodes (e.g., array electrode 450-*d*1, array electrode 450-*d*2 while the semiconductor material remains substantially intact.

Figure 4S:
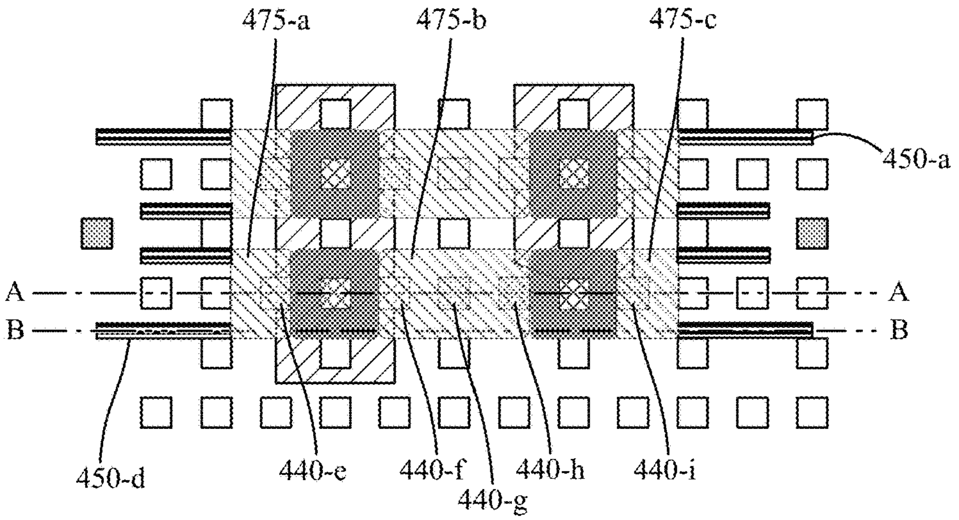
Figure 4T:
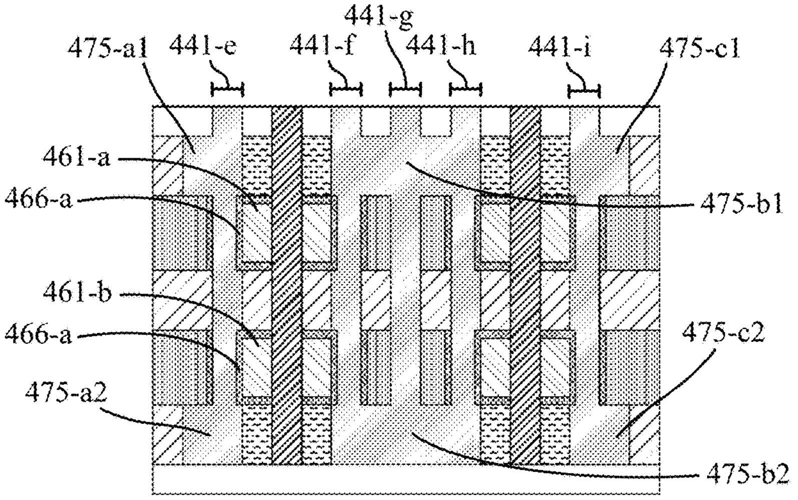
Figure 4U:
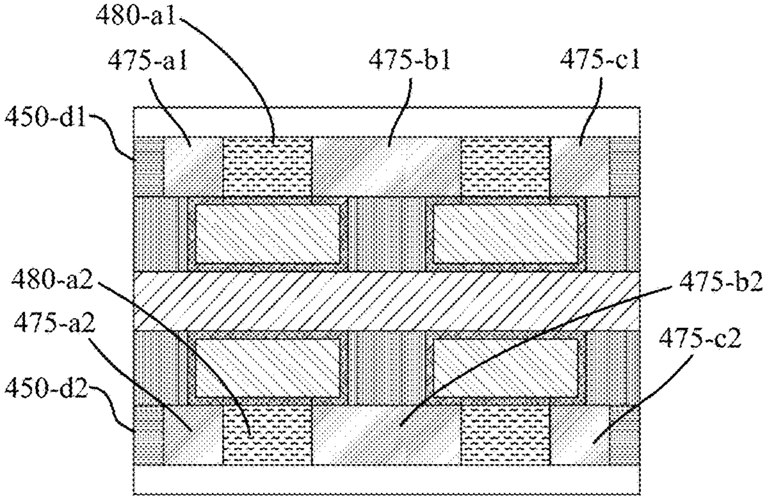
Figure 4V:
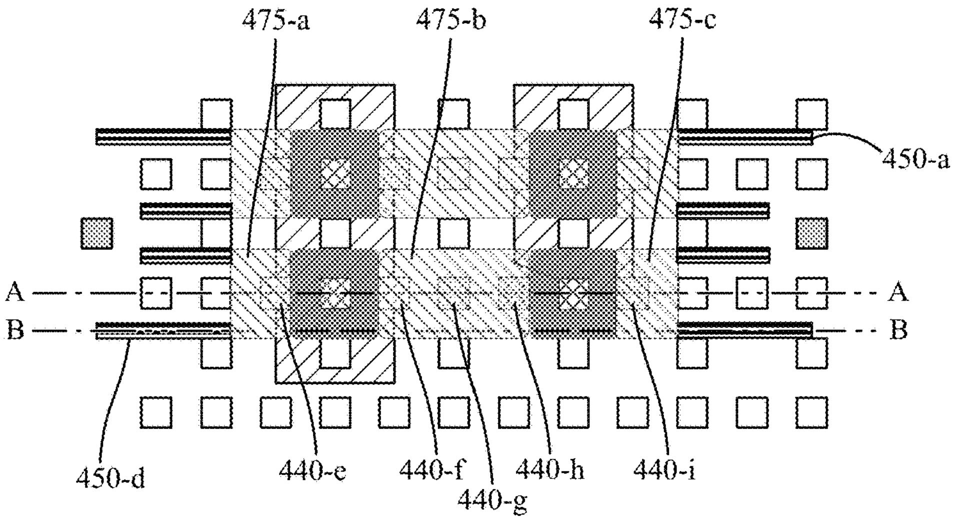
Figure 4W:
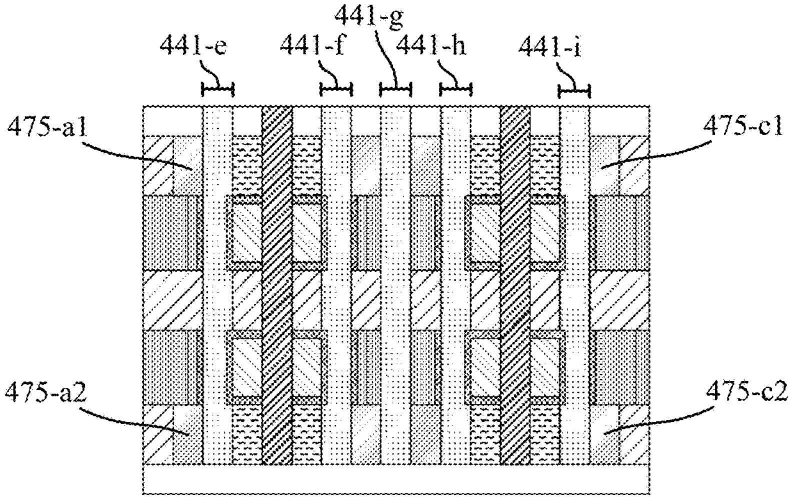
Figure 4X:
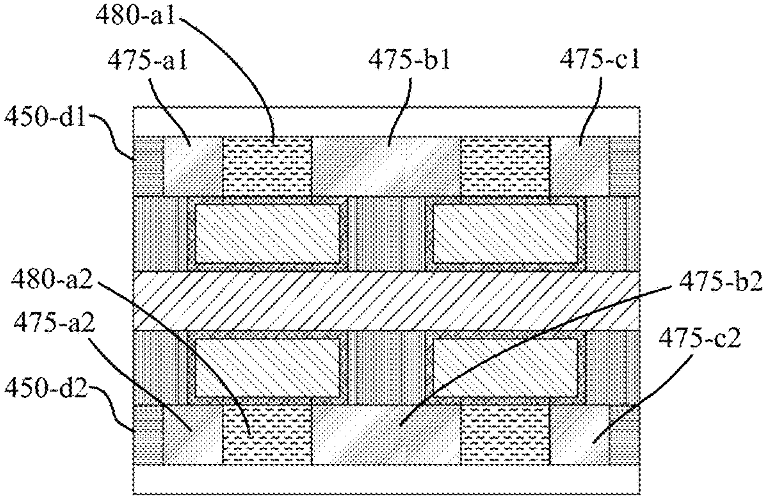
Figure 4Y:
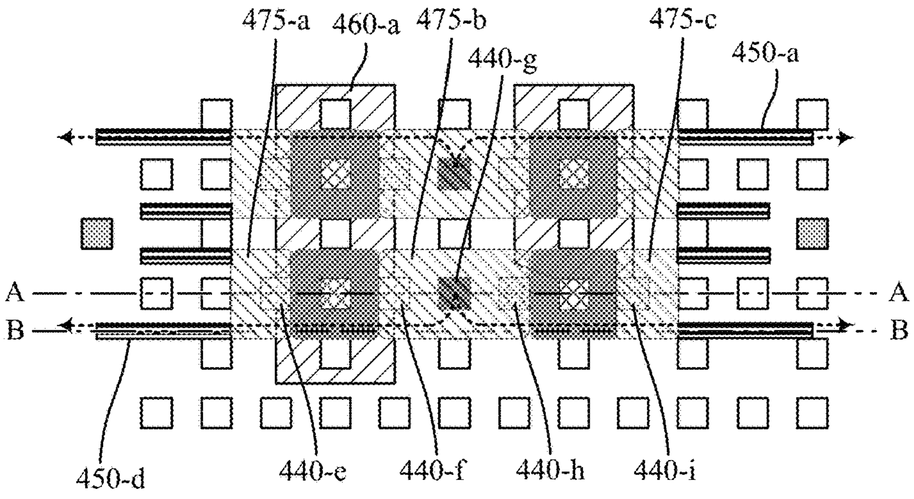

In some cases, the etch process step (e.g., the first isotropic etch process), using at least via 440-*g* (which may be used to form a second electrode for the transistor as described in FIGS. 4Y-4AA) may form a second cavity (e.g., channel 443-*a*1) at the first layer (e.g., D1 layers) such that part of the third electrode (e.g., electrode 450-*d*) and the semiconductor material (e.g., semiconductor material 480-*a*, semiconductor material 480-*c*) may be exposed. Additionally, the etch process step (e.g., the first isotropic etch process), using at least the third via (e.g., via 440-*i*), may form a third cavity (e.g., cavity 442-*e*1) at the first layer such that the semiconductor material (e.g., semiconductor material 480-*c*) may be exposed.

FIG. 4S illustrates a top-down view of the stack 405 after at least a first deposition process step and a second deposition process step are performed using the via holes (e.g., via holes 441-*e* through 441-*i*) corresponding to the fourth group of vias (e.g., vias depicted as dot-filled squares in FIG. 4S that include via 440-*e* through via 440-*i*) as described with reference to FIGS. 4P through 4R. FIG. 4T illustrates a cross-sectional side view of the stack 405 across an imaginary line AA shown in FIG. 4S after the first deposition process step and the second deposition step. Similarly, FIG. 4U illustrates a cross-sectional side view of the stack 405 across an imaginary line BB shown in FIG. 4S after the first deposition process step and the second deposition step.

In some cases, the first deposition process step may include selective formation of an insulating layer 466 over the exposed surface of the electrode material 461 as shown in FIGS. 4N and 4Q. In some cases, the insulating layer 466 may be an example of insulating layer 365 described with reference to FIGS. 3A-3L. The insulating layer 466 may provide an electrical isolation between the electrode material 461 (e.g., upper deck gate electrode 460 including electrode material 461-*a*1, lower deck gate electrode 460 including electrode material 461-*a*2) and an ohmic material to be deposited during the second deposition process step.

In some cases, the second deposition process step may include filling the cavities and channels formed in the stack 405 (e.g., cavities 442 and channel 443 described with reference to FIGS. 4P-4R) with an ohmic material 475 (which may be an example of ohmic material 375 described with reference to FIGS. 3A-3L). FIG. 4S illustrates a top-down view of the cavities and the channel that are filled with the ohmic material 475 (e.g., ohmic material 475-*a*, ohmic material 475-*b*, ohmic material 475-*c*). FIGS. 4T and 4U illustrate a cross-sectional side view of the cavities and the channels filled with the ohmic material 475 (e.g., ohmic material 475-*a*, ohmic material 475-*b*, ohmic material 475-*c*). Further, FIG. 4U illustrates that the semiconductor material (e.g., semiconductor material 480-*a*1) is in contact with the ohmic material (e.g., ohmic material 475-*a*1) that is in contact with the array electrode (e.g., array electrode 450-*d*1). As will be described herein with reference to FIGS. 4Y and 4Z, the combination of the semiconductor material, the ohmic material, and the array electrode may form a current path of the TFTs, when the TFTs are fully constructed, and the current path is in a horizontal direction (e.g., a parallel direction with respect to a horizontal substrate).

In some cases, the second deposition process step may fill the second cavity (e.g., channel 443-*a*1 described with reference to FIGS. 4Q and 4R) and the third cavity (e.g., cavity 442-*e*1 described with reference to FIGS. 4Q and 4R) at the first layer (e.g., D1 layers) with an ohmic material (e.g., ohmic material 475-*b*1, ohmic material 475-*c*1).

FIG. 4V illustrates a top-down view of the stack 405 after at least an etch process step and a deposition process step are performed for the fourth group of vias (e.g., vias depicted as dot-filled squares in FIG. 4V that include via 440-*e* through via 440-*i*) that have been filled with an ohmic material as described with reference to FIGS. 4S through 4U. FIG. 4W illustrates a cross-sectional side view of the stack 405 across an imaginary line AA shown in FIG. 4V after the etch process step and the deposition process step. Similarly, FIG. 4X illustrates a cross-sectional side view of the stack 405 across an imaginary line BB shown in FIG. 4V after the etch process step and the deposition process step.

In some cases, the etch process may include an anisotropic etch process that removes the ohmic material in a vertical direction (e.g., a vertical direction with respect to a horizontal substrate). As a result of the etch process that removes the ohmic material, the via holes (e.g., via holes 441-*e* through 441-*i* corresponding to vias 440-*e* through 440-*i*, respectively) may be formed to separate the ohmic material at the upper D1 layer (e.g., ohmic material 475-*a*1, ohmic material 475-*c*1) from the ohmic material at the lower D1 layer (e.g., ohmic material 475-*a*2, ohmic material 475-*c*2). Subsequently, the deposition process may fill the via holes with a dielectric material. FIG. 4W illustrates the via holes (e.g., via holes 441-*c* through 441-*i*) filled with the dielectric material. Excessive dielectric material above the HM layer of the stack 405 may be removed by a CMP process or an etch-back process. Structural features depicted in FIG. 4X remains the same as the structural features depicted in FIG. 4U because the structural features depicted in FIG. 4X are located away from the third group of via holes (e.g., via holes 441-*e* through 441-*i*)—e.g., the anisotropic etch process and subsequent deposition process may not affect the structural features depicted in FIG. 4X.

Figure 4Z:
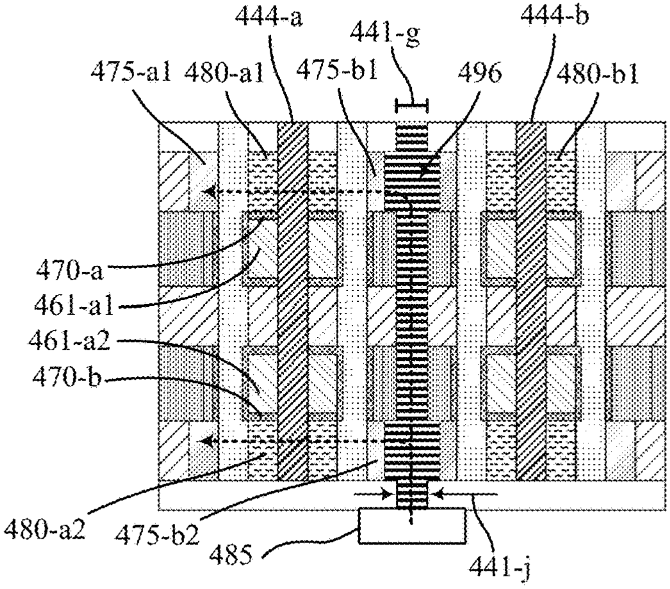
Figure 4A:
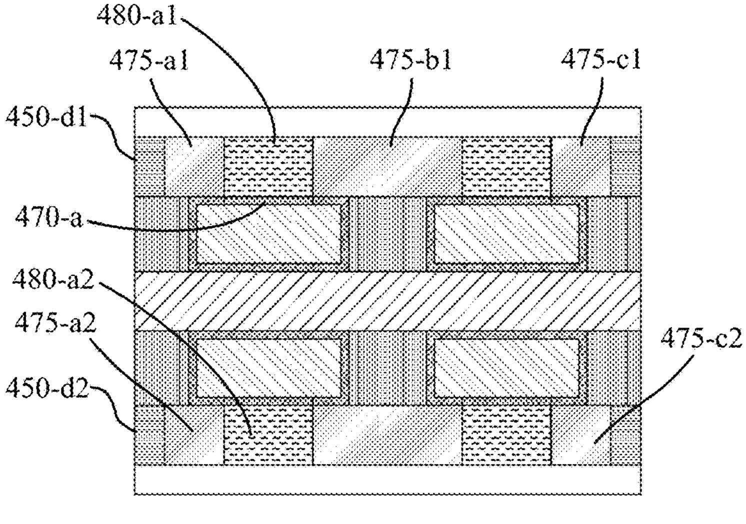

FIG. 4Y illustrates a top-down view of the stack 405 after at least an etch process step and a deposition process step are performed for a fifth group of vias (e.g., vias depicted as dark-gray squares that include via 440-*g*) that have been filled with a dielectric material as described with reference to FIGS. 4V through 4X. FIG. 4Z illustrates a cross-sectional side view of the stack 405 across an imaginary line AA shown in FIG. 4Y after the etch process step and the deposition process step. Similarly, FIG. 4AA illustrates a cross-sectional side view of the stack 405 across an imaginary line BB shown in FIG. 4Y after the etch process step and the deposition process step.

In some cases, the etch process step may include an anisotropic etch process. The anisotropic etch process may remove the dielectric material from the via hole (e.g., via hole 441-*g* corresponding to via 440-*g*). Further, the anisotropic etch process may selectively remove a portion of the bottom layer (e.g., an etch-stop layer, HM layer) of the stack 405 to form a hole (e.g., opening 441-*j*) through the bottom layer of the stack 405. In some cases, a width of opening 441-*j* may be substantially same as the width of opening 441-*g*. The opening 441-*j* may be coupled with a conductive element 485 that may be part of a layer of logic circuitry. For example, the conductive element 485 may represent a node of a circuitry in a substrate (e.g., row decoder 120 constructed in a substrate 204). In another example, the conductive element 485 may be coupled with a node (e.g., a node at which a select signal is present) of row decoder 120 to activate one or more decks of array layers. In some cases, the etch process step may include an isotropic etch process that may follow the anisotropic etch. The isotropic etch process may selectively remove the ohmic material exposed within the via hole—e.g., recess etch the ohmic material at D1 layers (e.g., ohmic material 475-*b*1, ohmic material 475-*b*2).

In some cases, the deposition process may fill the via holes (e.g., via hole 441-*g*) with an electrode material 495 (which may be an example of electrode material 395 described with reference to FIGS. 3A-3L). Excessive electrode material 495 over the top layer (e.g., HM layer) of the stack 405 may be removed by a CMP process or an etch-back process. As a result of filling the via hole with the electrode material 495 (e.g., forming a conductive plug 496), the conductive element 485 (e.g., a node associated with a layer of logic circuitry) may be coupled with the ohmic material (e.g., ohmic material 475-*b*1) as shown in FIG. 4Z. In some cases, the conductive plug 496 (e.g., via hole 441-*g* corresponding to via 440-*g*, which has been filled with the electrode material 495) may function as a second electrode for the TFTs. Structural features depicted in FIG. 4AA remains the same as the structural features depicted in FIG. 4X because the structural features depicted in FIG. 4AA are located away from the fifth group of vias—e.g., the etch process and subsequent deposition process may not affect the structural features depicted in FIG. 4AA.

As illustrated herein with reference to FIGS. 4Y through 4AA, the conductive element 485 may be coupled with the ohmic material (e.g., ohmic material 475-*b*1, ohmic material 475-*b*2) that is in contact with the semiconductor material (e.g., semiconductor material 480-*a*1, semiconductor material 480-*a*2). The semiconductor material (e.g., semiconductor material 480-*a*1, semiconductor material 480-*a*2) is in contact with the ohmic material (e.g., ohmic material 475-*a*1, ohmic material 475-*b*2) that is in contact with an array electrode (e.g., array electrode 450-*d*1, array electrode 450-*d*2) as shown in FIG. 4AA. In this manner, a current path between the conductive element 485 and the array electrode (e.g., array electrode 450-*d*1, array electrode 450-*d*2) may be established based on a voltage applied to the gate electrode (e.g., upper deck gate electrode 460 including electrode material 461-*a*1, lower deck gate electrode 460 including electrode material 461-*a*2) to form an active channel within the semiconductor material (e.g., semiconductor material 480-*a*1, semiconductor material 480-*a*1) for a current to flow as indicated dotted arrows in FIGS. 4Y and 4Z.

FIGS. 4Y through 4AA illustrate various feature of the planar TFTs. For example, the planar TFTs depicted in FIG. 4Z may include a dielectric plug (e.g., dielectric plug 444-*a*, dielectric plug 444-*b*) that extends through a stack that comprises a first layer and a second layer (e.g., stack 405 that includes D1 layers and DM layers). The planar TFTs may also include a semiconductor material (e.g., semiconductor material 480-*a*1) at the first layer that surrounds the dielectric plug (e.g., dielectric plug 444-*a*). Further, the planar TFTs may include a gate electrode (e.g., electrode material 461-*a*1 that forms gate electrode 460-*a*) at the second layer that surrounds the dielectric plug (e.g., dielectric plug 444-*a*). Additionally, the planar TFTs may include an oxide material (e.g., oxide material 470-*a*) between the semiconductor material 480-*a*1 and the gate electrode (e.g., electrode material 461-*a*1 that forms gate electrode 460-*a*).

The planar TFTs depicted in FIG. 4Z may include a conductive plug (e.g., conductive plug 496) that extends through the stack and an ohmic material (e.g., ohmic material 475-*b*1, ohmic material 475-*b*2) at the first layer that surrounds the conductive plug. The ohmic material (e.g., ohmic material 475-*b*1) that surrounds the conductive plug contacts the semiconductor material (e.g., semiconductor material 480-*a*1) that surrounds the dielectric plug (e.g., dielectric plug 444-*a*) as depicted in FIGS. 4Y-4AA. The planar TFT may also include a second dielectric plug (e.g., dielectric plug 444-*b*) that extends through the stack and the semiconductor material (e.g., semiconductor material 480-*a*1) at the first layer that surrounds the dielectric plug (e.g., dielectric plug 444-*a*) comprises a first segment of the semiconductor material and the ohmic material (e.g., ohmic material 475-*b*1) that surrounds the conductive plug (e.g., conductive plug 496) is in contact with a second segment of the semiconductor material (e.g., semiconductor material 480-*b*1) that surrounds the second dielectric plug (e.g., dielectric plug 444-*b*) as depicted in FIGS. 4Y-4AA.

Figure 5A:
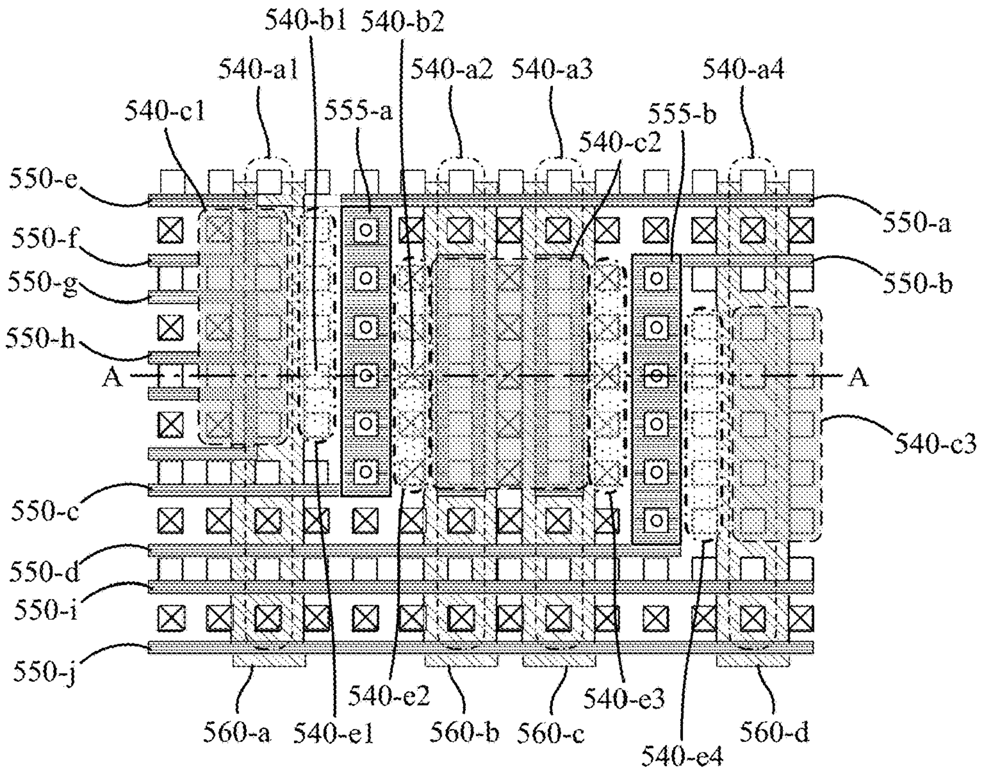
FIGS. 5A-5N illustrate exemplary fabrication techniques that support thin film transistors and related fabrication techniques in accordance with embodiments of the present disclosure.
Figure 5B:
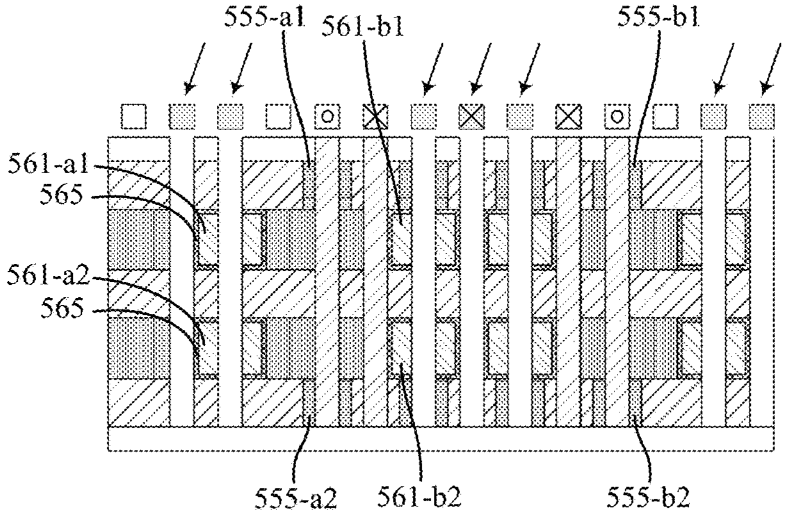
Figure 5C:
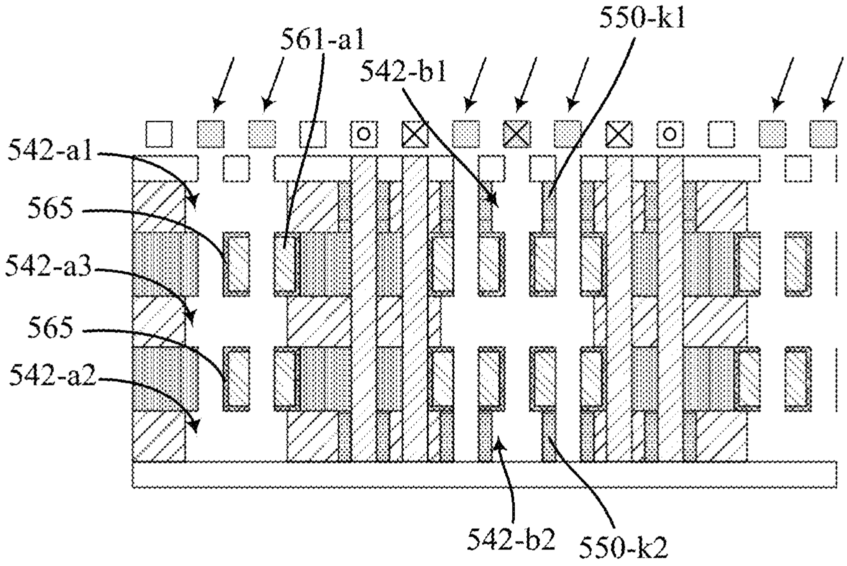
Figure 5D:
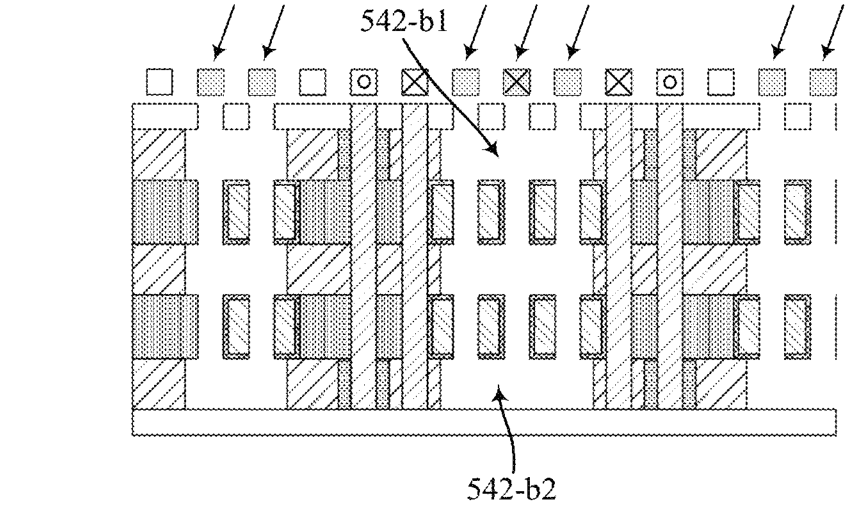
Figure 5E:
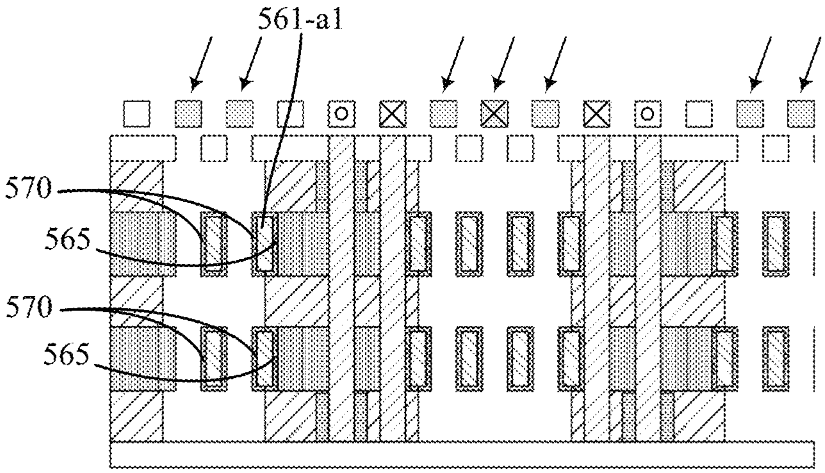
Figure 5F:
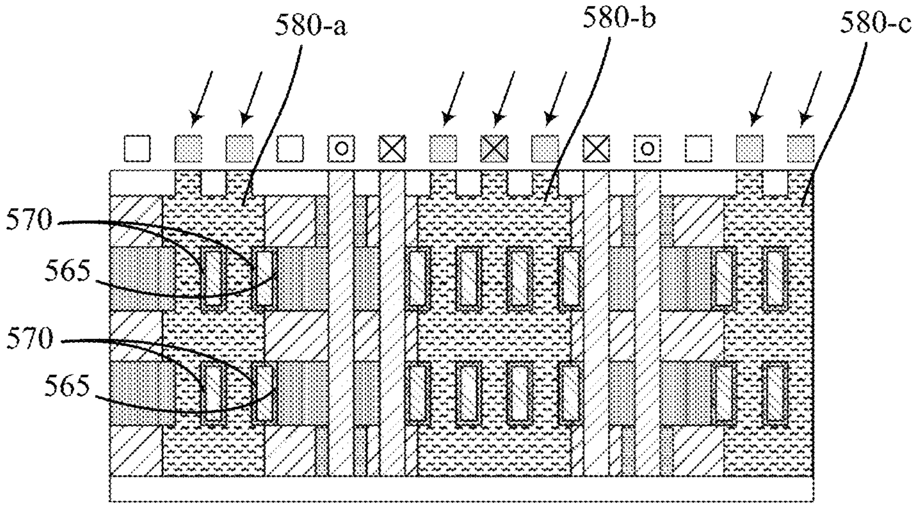
Figure 5G:
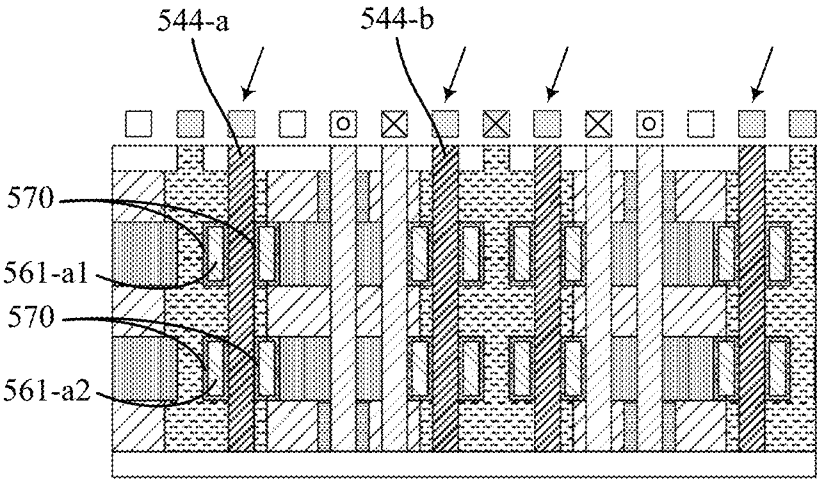
Figure 5H:
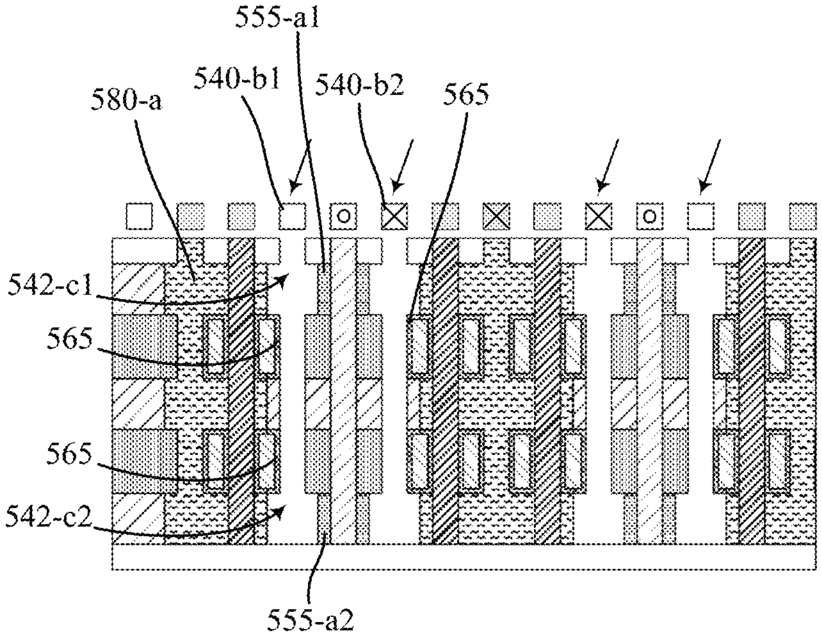
Figure 5I:
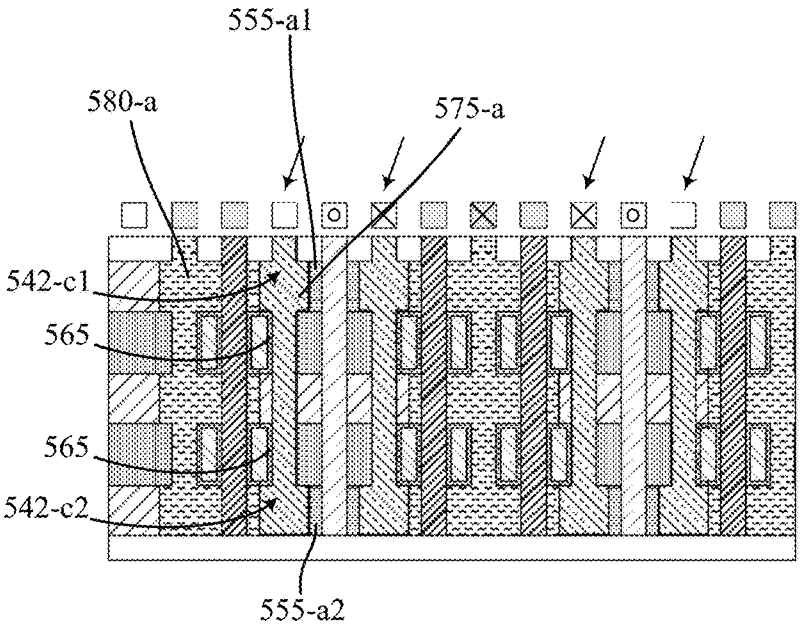
Figure 5J:
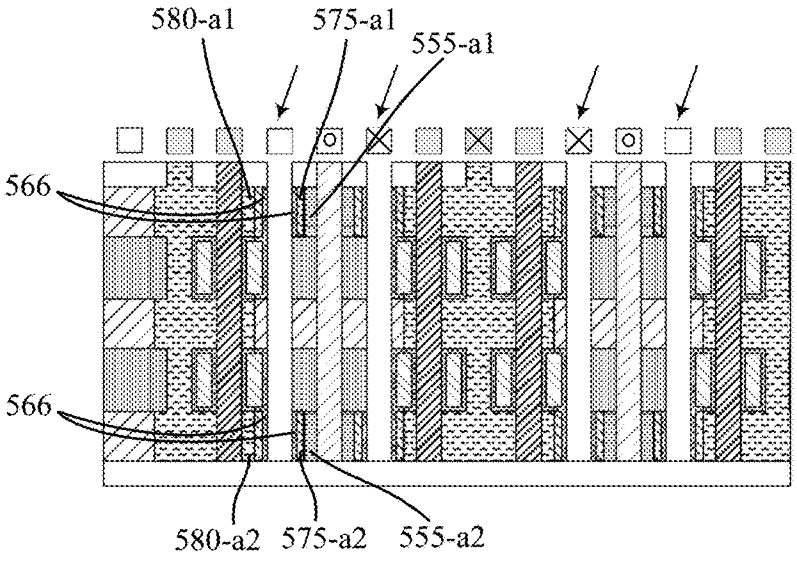
Figure 5K:
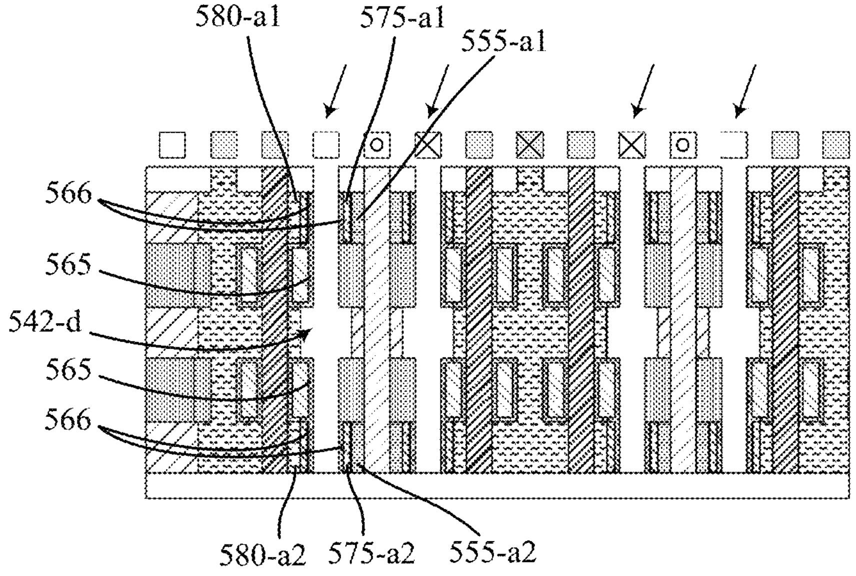
Figure 5L:
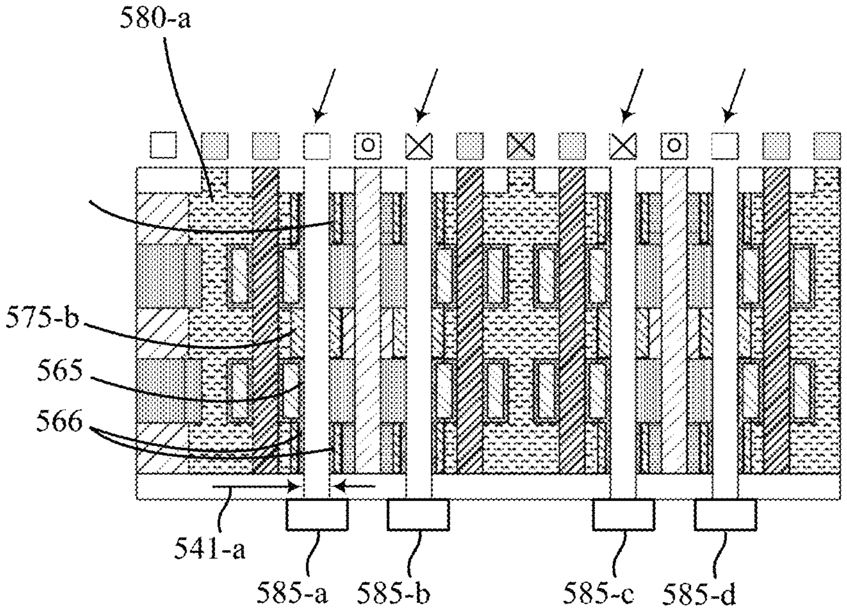
Figure 5M:
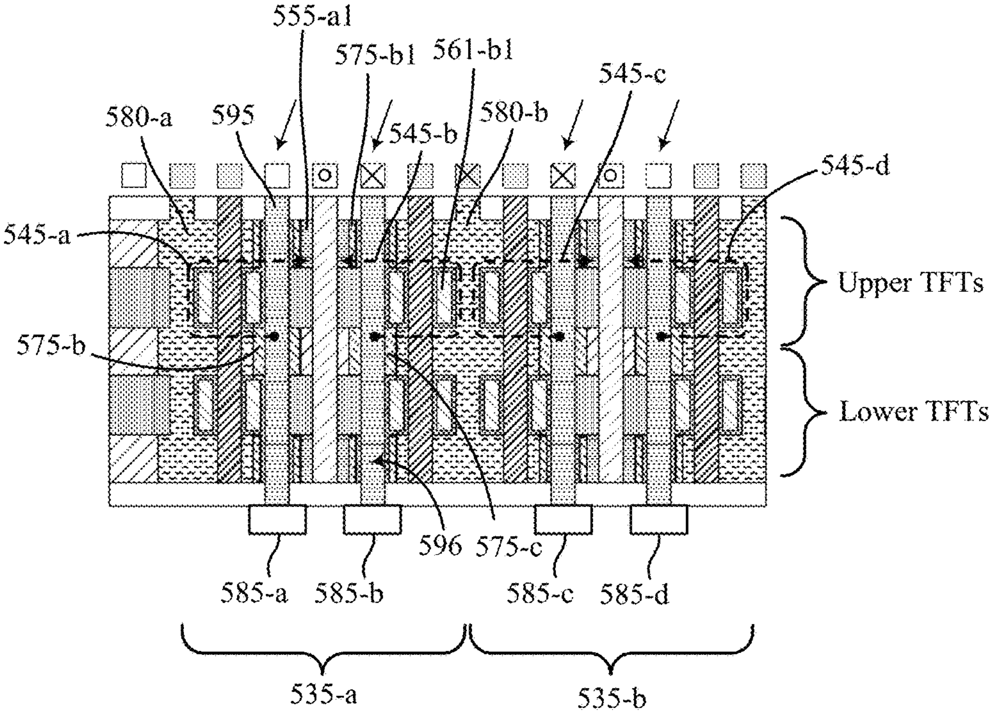
Figure 5N:
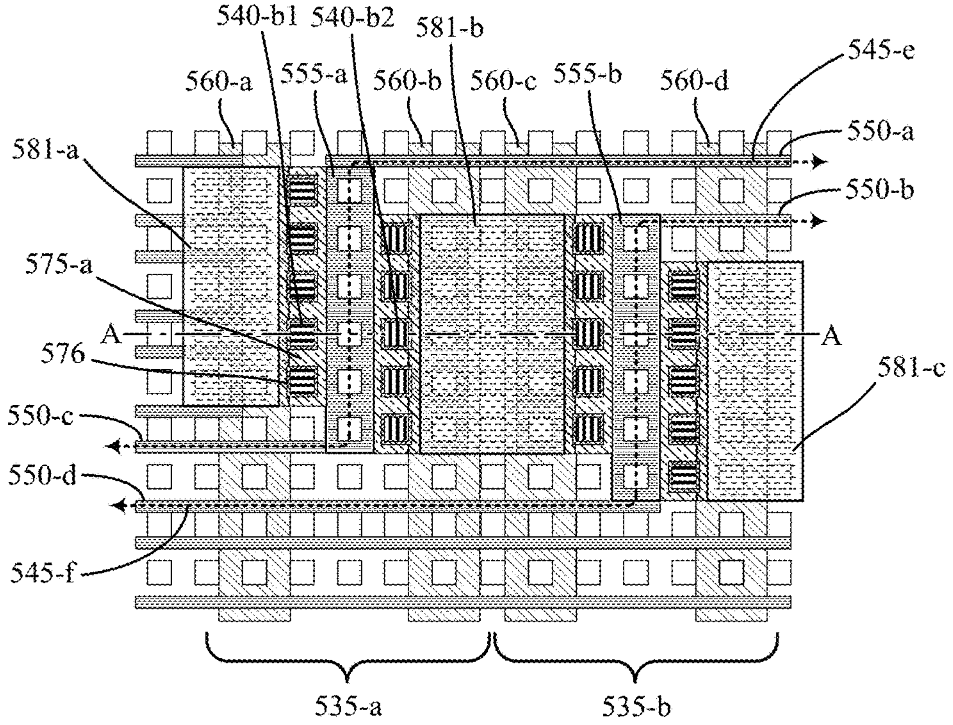

FIGS. 5A-5N illustrate exemplary fabrication techniques in accordance with the present disclosure. FIGS. 5A-5N describe aspects of several process steps for concurrently constructing two or more TFTs (e.g., TFTs that may be referred to as wrap-around TFTs and in which an electrical current flows in a direction along an outer surface of a gate electrode, when the TFT is activated). In some cases, such TFTs may be fabricated in a socket region of array layers as described herein. FIGS. 5A-5N include top-down views of a portion of socket region (e.g., a layout of the socket region) to illustrate that different groups of vias may be used to concurrently construct various structures of the TFTs. FIGS. 5A-5N also include cross-sectional side views of the portion of socket region to illustrate aspects of process features during several process steps for concurrently constructing the TFTs.

FIGS. 5A-5N illustrate exemplary fabrication techniques to construct wrap-around TFTs within a composite stack (e.g., the stack 305 for constructing the vertical TFTs as described with reference to FIGS. 3A-3L, the stack 405 for constructing the planar TFTs as described with reference to FIGS. 4A-4AA). As such, a composite stack may be used to construct vertical TFTs, planar TFTs, wrap-around TFTs, or any combinations thereof in a socket region of array layers. As described herein, the composite stack may also be used to construct a 3D cross-point array of memory cells and associated electrodes in an active array region of the array layers. In this manner, the composite stack may provide for constructing array layers that each include a deck of memory cells and electrodes, where the electrodes (thus memory cells) may be further coupled with the TFTs (e.g., vertical TFTs, horizontal TFTs, wrap-around TFTs, or any combinations thereof).

FIG. 5A illustrates a top-down view of a stack 505 where a socket region including two or more TFTs (e.g., wrap-around TFTs) may be constructed as described herein. As an example, FIG. 5A illustrates two sets of TFTs that each include two subsets of TFTs. Each set of TFTs may drive a single set of array electrodes. Further, each set of TFTs may include a first subset of TFTs coupled with a first node associated with a layer of logic circuitry and a second subset of TFTs coupled with a second node associated with the layer of logic circuitry. In some cases, the first node may correspond to a node of a first circuit configured to supply an electrical current to an activated deck of memory cells. As such, the first node may be referred to as a select node and the first circuit may be referred to as a select driver. In some cases, the second node may correspond to a node of a second circuit configured to maintain a leakage current associated with one or more deactivated decks of memory cells below a threshold. As such, the second node may be referred to as an inhibit node and the second circuit may be referred to as an inhibit driver. FIG. 5N describes further aspects of the TFT operations.

The stack 505 may be an example of the stack 305 described with reference to FIGS. 3A-3L. FIG. 5A illustrates a set of vias 540 (depicted as white squares, squares with x, squares with o) in an array pattern. The set of vias 540 may be formed through a top layer (e.g., layer 310 of stack 305, HM layer) of the stack 505 that includes a first layer (e.g., layer 315 of stack 305, D1 layer), a second layer (e.g., layer 320 of stack 305, DM layer), and a third layer (e.g., layer 325 of stack 305, D2 layer). The set of vias 540 may be examples of the set of vias 340 described with reference to FIGS. 3A-3L. FIG. 5A also illustrates various structures that may be concurrently formed within the stack 505 using a different groups of vias. For example, FIG. 5A illustrates a set of gate electrodes 560 (which may be examples of gate electrodes 360 described with reference to FIGS. 3A-3L) for TFTs, a set of array electrodes 550 (which may be examples of array electrodes 350 described with reference to FIGS. 3A-3L), each of which may be formed at different junctures of process sequence to construct the TFTs.

The set of gate electrodes 560 (e.g., gate electrode 560-*a* through gate electrode 560-*d*) may be constructed using a first subset of vias (e.g., a first group of vias 540-*a*) as described herein with reference to FIGS. 3C through 3F. Also, as described elsewhere, the set of array electrodes 550 (e.g., array electrode 550-*a* through array electrode 550-*j*) may be constructed using the vias depicted as squares with x. Further, a set of electrode tabs (e.g., electrode tab 555-*a*, electrode tab 555-*b*) may be constructed using the vias depicted as squares with o. In some cases, a second set of vias may include the vias depicted as squares with x and the vias depicted as squares with o. As depicted in FIG. 5A, each electrode tab (e.g., electrode tab 555-*a*) may connect two array electrodes (e.g., electrode 550-*a* and electrode 550-*c*) and as such, the set of array electrodes may include the set of electrode tabs. In some cases, the array electrodes may function as second electrodes for the TFTs. Additionally, a conductive plug may be constructed using a third via (e.g., via 540-*b*1, via 540-*b*2) as described herein with reference to FIGS. 5L and 5M. In some cases, the conductive plug may function as a third electrode for TFTs and the conductive plug (e.g., the third electrode) may extend through at least the third layer (e.g., layer 325 of stack 305, D2 layer). FIG. 5A also illustrates a third group of vias (e.g., vias 540-*c*1, vias 540-*c*2, vias 540-*c*3) formed through the top layer of the stack 505.

Cross-sectional side views of FIGS. 5B through 5M may correspond to the socket region where an imaginary line AA in FIG. 5A extends through fourteen (14) vias. For example, FIG. 5B illustrates the fourteen vias (e.g., vias depicted as white or grey squares, vias depicted as squares with x, vias depicted as squares with o) above a cross-sectional side view of the stack 505 so as to match various structural features (e.g., via holes, via cavities, channels (i.e., adjoined via cavities), dielectric plugs, conductive plugs) formed within the stack 505 using one or more particular vias to form such structural features in the stack 505. In addition, arrows are added to indicate the one or more particular vias used at different junctures of process sequence to construct the TFTs.

FIG. 5B illustrates a cross-sectional side view of the stack 505 after via holes (e.g., via holes corresponding the vias indicated with arrows) are formed using the third group of vias (e.g., vias 540-*c*1, vias 540-*c*2, vias 540-*c*3). In some cases, an anisotropic etch process may form the via holes as described herein. FIG. 5B also illustrates that electrode material 561 (which may be an example of electrode material 361 described with reference to FIGS. 3A-3L) may have been previously formed in the second layer (e.g., DM layers) of the stack 505 as described herein with reference to FIGS. 3C-3F. The electrode material 561 depicted in FIG. 5B corresponds to the gate electrodes 560 depicted in FIG. 5A—e.g., electrode material 561-*a* forming gate electrodes 560-*a*, electrode material 561-*b* forming gate electrode 560-*b*. FIG. 5B illustrates that an insulating layer 565 (which may be an example of the insulating layer 365 described with reference to FIGS. 3A-3L) partially surrounds electrode material 561. FIG. 5B also illustrates that electrode tabs (e.g., electrode tab 555-*a*, electrode tab 555-*b*) may have been previously formed in the first layer (e.g., D1 layers) of the stack 505.

FIG. 5C illustrates a cross-sectional side view of the stack 505 after at least an etch process step is performed using the via holes (e.g., via holes corresponding to the vias indicated with arrows) that have been formed using the third group of vias (e.g., vias 540-*c*1, vias 540-*c*2, vias 540-*c*3) as described with reference to FIG. 5B. In some cases, the etch process step may include an isotropic etch process that selectively removes a first dielectric material at D1 layers and a second dielectric material at D2 layer. The isotropic etch may leave other materials (e.g., materials other than the first dielectric material at D1 layers and the second dielectric material at D2 layer) exposed in the via hole substantially unchanged—e.g., insulating layer 565, electrode material 561. As a result of the isotropic etch process, via cavities (e.g., via cavity 542-*a*1, via cavity 542-*a*2, via cavity 542-*a*3) may form. The via cavities 542 may span the first layer (e.g., D1 layers at which the array electrodes 550 are present), the second layer (e.g., DM layers at which the gate electrodes 560 are present), and the third layer (e.g., D2 layer). Further, the via cavities (e.g., via cavity 542-*b*1, via cavity 542-*b*2) may expose array electrodes (e.g., array electrode 550-*k*1, array electrode 550-*k*2). In addition, the via cavities 542 may expose the insulating layer 565 that is conformal with the gate electrodes 560.

FIG. 5D illustrates a cross-sectional side view of the stack 505 after at least an etch process step is performed using the third group of vias (e.g., vias 540-*c*1, vias 540-*c*2, vias 540-*c*3) and corresponding via holes as well as via cavities that have been formed as described with reference to FIG. 5C. In some cases, the etch process step may include an isotropic etch process that selectively removes array electrodes at D1 layers (e.g., array electrode 550-*k*1, array electrode 550-*k*2 described with reference to FIG. 5C) that are exposed to the isotropic etch process. The isotropic etch may leave other materials (e.g., materials other than the array electrode at D1 layers) exposed in the via holes and the via cavities substantially unchanged—e.g., insulating layer 565, electrode material 561, the first dielectric material at the first layer, the placeholder material at the second layer, the second dielectric material at the third layer.

FIG. 5E illustrates a cross-sectional side view of the stack 505 after at least an etch process step and a deposition process step are performed using the third group of vias (e.g., vias 540-*c*1, vias 540-*c*2, vias 540-*c*3) and corresponding the via holes as well as the via cavities that have been formed using as described with reference to FIG. 5D. In some cases, the etch process step may include an isotropic etch process that selectively removes a portion of the insulating layer 565 in contact with the gate electrode. The isotropic etch may leave other materials (e.g., materials other than the insulating material at DM layers) exposed in the via holes and the via cavities substantially unchanged—e.g., electrode material 561 that forms gate electrode 560, the first dielectric material at the first layer, the placeholder material at the second layer, the second dielectric material at the third layer. In some cases, the deposition process step may form an oxide material 570 (which may be an example of oxide material 370 described with reference to FIGS.

3A-3L) in contact with the gate electrode. In some cases, the oxide material may be referred to as a gate oxide for the TFTs.

FIG. 5F illustrates a cross-sectional side view of the stack 505 after at least a deposition process step is performed using the third group of vias (e.g., vias 540-*c*1, vias 540-*c*2, vias 540-*c*3) and corresponding the via holes as well as the via cavities that have been formed using as described with reference to FIG. 5D. In some cases, the deposition process step may fill the via holes and via cavities with a semiconductor material 580 (which may be an example of semiconductor material 380 described with reference to FIGS. 3A-3L) that may be in contact with the oxide material 570 that is in contact with the gate electrode as described with reference to FIG. 5E.

FIG. 5G illustrates a cross-sectional side view of the stack 505 after at least an etch process step and a deposition process step are performed using a fourth group of vias (e.g., the fourth set of vias including the vias indicated with arrows). Referring to FIG. 5A, the fourth group of vias may include vias that are common to the first group of vias (e.g., vias 540-*a*1, vias 540-*a*2, vias 540-*a*3, vias 540-*a*4) and the third group of vias (e.g., vias 540-*c*1, vias 540-*c*2, vias 540-*c*3). In some cases, the etch process step may include an anisotropic etch process that removes the semiconductor material 580 that has filled the via holes and via cavities as described with reference to FIG. 5F. The anisotropic etch process may remove the semiconductor material 580 in a vertical direction (e.g., a vertical direction with respect to a horizontal substrate) to form via holes (e.g., via holes to be filled with a dielectric material later) that correspond to the fourth group of vias. Removing the semiconductor material 580 within the via holes corresponding to the fourth group of vias may remove a parasitic current path having a shorter channel length for the TFTs such that primary current paths for the TFTs may have a longer channel length as described with reference to FIG. 5M. In some cases, the deposition process step may fill the via holes with a dielectric material. In some cases, the via holes filled with the dielectric material may be referred to as dielectric plugs (e.g., dielectric plug 544-*a*, dielectric plug 544-*b*) that extend through the gate electrodes (e.g., gate electrode 560-*a* that includes electrode material 561-*a*).

FIG. 5H illustrates a cross-sectional side view of the stack 505 after at least an etch process step is performed using a fifth group of vias (e.g., the fifth group of vias including the vias indicated with arrows). Referring to FIG. 5A, the fifth group of vias may include vias 540-*c* (e.g., vias 540-*e*1 including via 540-*b*1, vias 540-*e*2 including via 540-*b*2, vias 540-*e*3, vias 540-*c*4). In some cases, the etch process may include an anisotropic etch process that removes the first dielectric material of the first layer (e.g., D1 layers), the placeholder material of the second layer (e.g., DM layers), and the second dielectric material of the third layer (e.g., D2 layer)—e.g., forming a via hole corresponding to via 540-*b*1. The anisotropic etch process may also remove the dielectric material that has filled via holes used for forming the array electrodes (e.g., via holes corresponding to the vias depicted as squares with x including via 540-*b*2). The anisotropic etch process may leave other materials exposed in the via hole substantially unchanged—e.g., insulating layer 565.

In some cases, the etch process step may further include an isotropic etch process that selectively removes the first dielectric material of the first layer (e.g., D1 layer). The isotropic etch process may leave other materials exposed in the via hole substantially unchanged—e.g., the placeholder material of the second layer (e.g., DM layer), the second dielectric material of the third layer (e.g., D2 layer), insulating layer 565. The isotropic etch process using the fifth group of vias (e.g., the fifth group of vias including via 540-*b*1, via 540-*b*2) may form via cavities (e.g., via cavity 542-*c*1, via cavity 542-*c*2) to expose the semiconductor material (e.g., semiconductor material 580-*a*) and the second electrode (e.g., electrode tab 555-*a*1, electrode tab 555-*a*2) for the TFTs at the first layer (e.g., D1 layer).

FIG. 5I illustrates a cross-sectional side view of the stack 505 after at least a deposition process step is performed using the via holes formed based on the fifth set of vias (e.g., the fifth set of vias including the vias indicated with arrows). In some cases, the deposition process step may fill the via cavities described with reference to FIG. 5H (e.g., via cavity 542-*c*1, via cavity 542-*c*2) with an ohmic material 575 (which may be an example of ohmic material 375 described with reference to FIGS. 3A-3L) such that the ohmic material (e.g., ohmic material 575-*a*) may be in contact with the semiconductor material (e.g., semiconductor material 580-*a*) and the second electrode (e.g., array electrode 555-*a*1). Excessive ohmic material on top of the stack 405 may be removed using a CMP process or an etch-back process.

FIG. 5J illustrates a cross-sectional side view of the stack 505 after at least an etch process step and a deposition process step are performed using the fifth set of vias (e.g., the fifth set of vias including the vias indicated with arrows). In some cases, the etch process step may include an anisotropic etch process that may remove a portion of the ohmic material in a vertical direction (e.g., a vertical direction with respect to a horizontal substrate) to form via holes (e.g., via holes that correspond to the fifth set of vias). The anisotropic etch process may leave other materials exposed in the via hole substantially unchanged—e.g., the placeholder material of the second layer (e.g., DM layer), the second dielectric material of the third layer (e.g., D2 layer), insulating layer 565. In some cases, the deposition process step, using the via holes (e.g., the via holes corresponding to the fifth set of via) may form an insulating material 566 in contact with the ohmic material (e.g., ohmic material 575-*a*1, ohmic material 575-*a*2) that remains within the via cavities (e.g., via cavity 542-*c*1 that has been filled with the ohmic material as described with reference to FIG. 5I) after the anisotropic etch process. In some cases, the insulating material 566 may be an example of materials that may form insulting layer 365 described with reference to FIGS. 3A-3L. In some cases, the deposition process step may include a selective deposition process that may deposit the insulating material 566 only on the exposed surfaces of the ohmic material 575.

FIG. 5K illustrates a cross-sectional side view of the stack 505 after at least an etch process step is performed using the via holes formed based on the fifth set of vias (e.g., the fifth set of vias including the vias indicated with arrows) as described with reference to FIG. 5J. In some cases, the etch process step may include an isotropic etch process that may selectively remove the second dielectric material at the third layer (e.g., D2 layer). The isotropic etch process may leave other materials (e.g., materials other than the second dielectric material of D2 layer) exposed in the via hole substantially unchanged—e.g., insulating material 566, insulating layer 565, semiconductor material 580, placeholder material at the second layers (e.g., DM layers). As a result of the isotropic etch process, via cavities (e.g., via cavity 542-*d*) may form such that semiconductor material 580-*a* may be exposed to a subsequent process step.

FIG. 5L illustrates a cross-sectional side view of the stack 505 after at least a deposition process step and an etch process step are performed using the fifth set of vias (e.g., the fifth set of vias including the vias indicated with arrows). In some cases, the deposition process step may fill the via holes (e.g., the via holes corresponding to the fifth set of vias) with the ohmic material. The ohmic material may also fill the via cavities (e.g., via cavity 542-*d* described with reference to FIG. 5K) formed at the third layer (e.g., D2 layer) such that the ohmic material (e.g., ohmic material 575-*b*) may be in contact with the semiconductor material 580-*a*. In some cases, the etch process step may include an anisotropic etch process that may remove a portion of the ohmic material in a vertical direction (e.g., a vertical direction with respect to a horizontal substrate) from the via holes. In some cases, the anisotropic etch process may create holes (e.g., opening 541-*a*) at the bottom layer of the stack 505 (e.g., layer 330). The holes may be coupled with conductive elements (e.g., conductive element 585-*a* through conductive element 585-*d*) that may be a part of a layer of logic circuitry. In some cases, conductive element 585-*a* may be coupled with an inhibit node of an inhibit driver. In some cases, conductive element 585-*b* may be coupled with a select node of a select driver.

FIG. 5M illustrates a cross-sectional side view of the stack 505 after at least a deposition process step is performed using the fifth set of vias (e.g., the fifth set of vias including the vias indicated with arrows). In some cases, the deposition step may fill the via holes (e.g., via holes corresponding to the fifth sets of vias) and the holes (e.g., opening 541-*a* described with reference to FIG. 5L) at the bottom layer with electrode material 595. Excessive electrode material 595 on top of the stack may be removed using a CMP process or an etch-back process. The via holes filled with electrode material 595 may be referred to as conductive plugs (e.g., conductive plug 596). The conductive plugs may couple conductive elements 585 with the semiconductor material (e.g., semiconductor material 580-*a*) of the TFTs through ohmic materials (e.g., ohmic material 575-*b*) and may complete construction of TFTs.

In some cases, TFTs illustrated in FIG. 5M may include a conductive plug that extends through a stack that comprises a first layer, a second layer, and a third layer, a gate electrode at the second layer, a second electrode at the first layer, and a semiconductor material at the first layer and the second layer, the semiconductor material coupled with the second electrode via a first segment of ohmic material at the first layer and coupled with the conductive plug via a second segment of ohmic material at the third layer. In some cases, the semiconductor material at the first layer and the second layer extends into the third layer. In some cases, the TFTs may include a dielectric plug that extends through the gate electrode.

FIG. 5M illustrates two sets of TFTs (e.g., first set of TFTs 535-*a*, second set of TFTs 535-*b*). Each set of TFTs may include a first subset of TFTs (e.g., a subset of TFTs including an upper TFT and a lower TFT) coupled with a first node associated with a layer of logic circuitry (e.g., through conductive element 585-*a* coupled with an inhibit node of an inhibit driver) and a second subset of TFTs (e.g., a subset of TFTs including an upper TFT and a lower TFT) coupled with a second node associated with the layer of logic circuitry (e.g., through conductive element 585-*b* coupled with a select node of a select driver). As illustrated with reference to FIG. 5N, each set of TFTs may drive (e.g., activate, inhibit) a single set of array electrodes (e.g., array electrode 550-*a*1 connected with array electrode 550-*d*1 in upper deck, array electrode 550-*a*2 connected with array electrode 550-*d*2 in lower deck). In some cases, two sets of TFTs may be processed differently to tailor their operating characteristics accordingly—e.g., the first subset of TFTs may be processed to provide a low leakage current characteristics within a certain range of operating voltages and the second subset of TFTs may be processed to provide a high drive current characteristics.

FIG. 5M also illustrates current paths (e.g., current path 545-*a*, current path 545-*b*) for TFTs (e.g., upper TFTs of the first set of TFTs 535-*a*). The current paths illustrate how a particular TFT, when the TFT is activated, may couple a node of a layer of logic circuitry with an array electrode to access memory cells in an active array region of array layers. For example, conductive element 585-*b* may be coupled with a select node of a select driver. The conductive element 585-*b* is coupled with the conductive plug 596 that may function as a common source for the TFTs (e.g., an upper TFT and a lower TFT of the second subset of TFTs of the first set of TFTs 535-*a*). The conductive plug 596 is in contact with a semiconductor material 580-*b* through an ohmic material 575-*c*. The semiconductor material 580-*b* may form an active channel for a current to flow based on a voltage applied to the gate electrode 560 (e.g., the gate electrode 560-*b*1 including electrode material 561-*b*1).

Additionally, the semiconductor material 580-*b* is connected to the array electrode 555-*a*1 through the ohmic material 575-*b*1. Array electrode 555-*a*1 may function as a common drain for the upper TFTs of the first set of TFTs 535-*a*. In this manner, the current may flow (e.g., a current path 545-*b*) between the source and the drain of the upper TFT (e.g., the upper TFT of the second subset of TFTs of the first set of TFTs 535-*a*) when the active channel is formed within the semiconductor material (e.g., semiconductor material 580-*b*)—when a voltage applied to the gate electrode (e.g., the gate electrode 560-*b*1 including electrode material 561-*b*1) is greater than a threshold voltage of the upper TFT and when there is a voltage difference between the source (that is coupled with the node of the layer of logic circuitry) and the drain (that is coupled with an array electrode) of the upper TFT.

Similarly, when another current path (e.g., current path 545-*a*) is activated (e.g., when the upper TFT of the first subset of TFTs of the first set of TFTs 535-*a* is activated), the array electrode 555-*a*1 may be coupled with the conductive element 585-*a* that may be coupled with a different node of the layer of logic circuitry (e.g., an inhibit node). In this manner, the array electrode (e.g., array electrode 555-*a*1 in the upper deck) may be coupled with two or more nodes (e.g., inhibit node, select node) of the layer of logic circuitry using the upper TFTs of the first set of TFTs 535-*a*. More generally, one of four TFTs of the first set of TFTs 535-*a* may be activated to couple a node of a layer of logic circuitry (e.g., a select node or an inhibit node connected to the source of the TFTs) with an array electrode (e.g., an array electrode connected to the drain of the TFTs).

The electrical current flowing within the TFTs flows in a manner that wraps around the gate electrode and the TFTs may be referred to as wrap-around TFTs. As illustrated in FIG. 5M, a channel length (e.g., a distance between a source and a drain of a TFT) of a wrap-around TFT may be greater than the channel length of either a vertical TFT (as described with reference to FIG. 3K) or a horizontal TFT (as described with reference to FIG. 4Z). Such an increased channel length may be beneficial for some aspects of the TFT operation—e.g., less prone to experience a leakage current issue related to a channel length.

FIG. 5N illustrates a top-down view of the stack 505 where the socket region includes the two sets of TFTs (e.g., wrap-around TFTs) as described herein. Cross-sectional side views of FIG. 5M may correspond to the socket region where an imaginary line AA extends as shown in FIG. 5N. FIG. 5N illustrates aspects of structural features that have been constructed using the fabrication techniques described herein. For example, FIG. 5N depicts bulk regions 581 for TFTs (e.g., bulk region 581-*a* including semiconductor material 580-*a*). The bulk regions 581 may correspond to the third group of vias (e.g., bulk region 581-*a* corresponding to the third group of vias 540-*c*1) as described with reference to FIGS. 5A and 5F.

FIG. 5N also depicts the fifth group of vias as either squares with horizontal lines (e.g., vias including via 540-*b*1) or squares with vertical lines (e.g., vias including via 540-*b*2). The vias depicted as squares with horizontal lines may correspond to the vias coupled with conductive element 585-*a* or conductive element 585-*d*. The vias depicted as squares with vertical lines may correspond to the vias coupled with conductive element 585-*b* or conductive element 585-*c*. In some cases, conductive element 585-*a* (or conductive element 585-*d*) may be coupled with an inhibit node of an inhibit driver and conductive element 585-*b* (or conductive element 585-*c*) may be coupled with a select node of a select driver. Each via of the fifth group of vias may include a conductive plug (e.g., conductive plug 596 described with reference to FIG. 5M) that is surrounded by insulating material 576 (e.g., the insulating material deposited on the surface of ohmic material 575 at D1 layers as described with reference to FIG. 5J). The conductive plugs, however, may be coupled with corresponding bulk regions 581 at the second layer of the stack through an ohmic material as described with reference to FIG. 5M.

FIG. 5N also depicts the ohmic material (e.g., ohmic material 575-*a*) that is located between the bulk region (e.g., bulk region 581-*a*) and the electrode tabs (e.g., electrode tab 555-*a* that is connected to array electrode 550-*a* and array electrode 550-*d*). The ohmic material provides a low resistance path for an electric current to flow between the bulk region (e.g., where a channel may be formed for an electric current to flow) FIG. and either the electrode tab (e.g., electrode tab 555-*a*) or the conductive plugs (e.g., conductive plug 596).

FIG. 5N also depicts current paths (e.g., current path 545-*c*, current path 545-*f*). The current path 545-*c* may correspond to the current path 545-*a* or the current path 545-*b* described with reference to FIG. 5M. In other words, an electrical current flow that follows the current path 545-*a* (or the current path 545-*b*) may reach the electrode tab 555-*b* and continue to flow using the array electrode 550-*a* and the array electrode 550-*c*. Similarly, the current path 545-*f* may correspond to the current path 545-*c* or the current path 545-*d* described with reference to FIG. 5M.

FIG. 5N also illustrates that more than one TFTs (e.g., wrap-around TFTs) may be concatenated to provide a greater amount of current than a current that a single TFT may provide. For example, FIG. 5N depicts that an array electrode (e.g., array electrode 550-*a*) may be jogged as the array electrode is connected to an electrode tab (e.g., electrode tab 555-*a*) that is further connected to another array electrode (e.g., array electrode 550-*c*). As an example, FIG. 5N depicts five (5) single TFTs concatenated into one TFT (e.g., as indicated by five conductive plugs arranged in a single column that are connected to a single electrode tab 555-*a*) that may supply five times more current than a single TFT. Any number of TFTs may be concatenated to provide any amount of current that may be required or desired as described herein.

The TFT configuration illustrated in FIG. 5N may facilitate providing a dedicated electrical connection to bulk regions 581. Such a dedicated electrical connection to bulk regions may be beneficial to aspects of TFT operations—e.g., avoiding issues related to a floating body of a TFT. For example, the bulk region 581-*b* may be expanded to include additional columns of vias (e.g., including three columns of vias instead of one column of vias between gate electrode 560-*b* and gate electrode 560-*c*) such that one or more vias of the additional vias (e.g., one or more vias of the middle column of the three columns of vias) may be coupled with a node of a layer of logic circuitry using the fabrication techniques described herein. In some cases, one or more holes (e.g., via holes corresponding to the one or more vias) may be formed through the bulk regions (e.g., bulk region 581-*b* including the semiconductor material 580) to a layer of logic circuitry and the one or more holes may be filled with an electrode material (e.g., electrode material 595 described with reference to FIG. 5x) to form a fourth electrode (e.g., a body for TFT) for the transistor. Additionally or alternatively, the bulk region 581-*a* may be expanded to include additional vias (e.g., vias located to the left boundary of the bulk region 581-*a*) and the additional vias may be coupled with the layer of logic circuitry. In this manner, the logic circuitry may provide certain voltages to the bulk regions based on various operating modes of the TFTs—e.g., operating in an inhibit mode or a select mode.

Figure 6A:
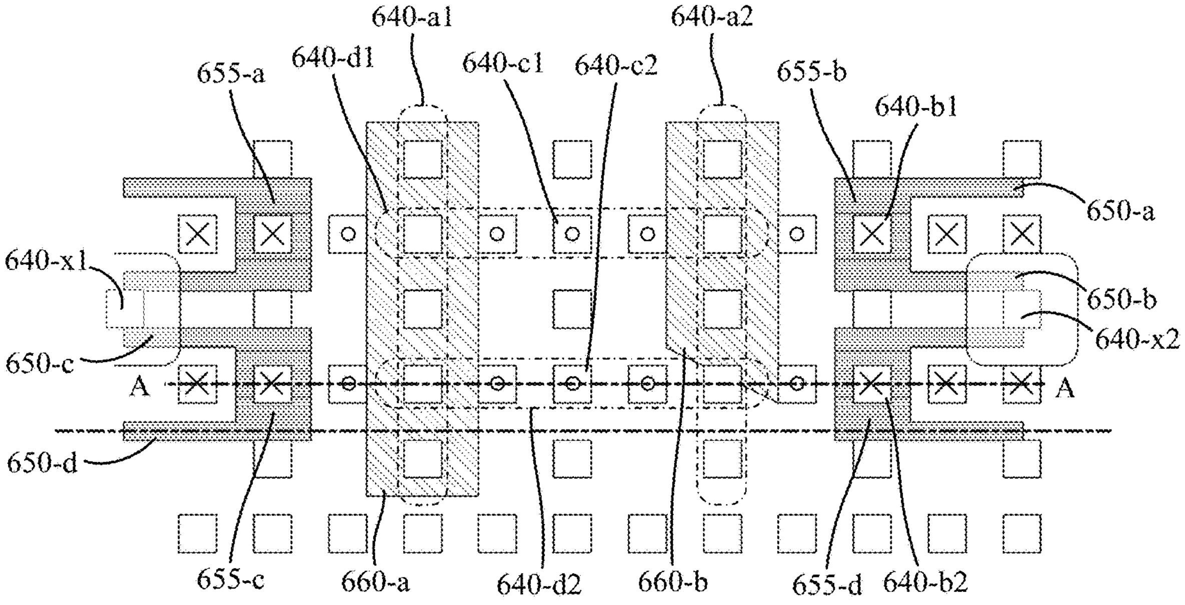
FIGS. 6A-6R illustrate exemplary fabrication techniques that support thin film transistors and related fabrication techniques in accordance with embodiments of the present disclosure.
Figure 6B:
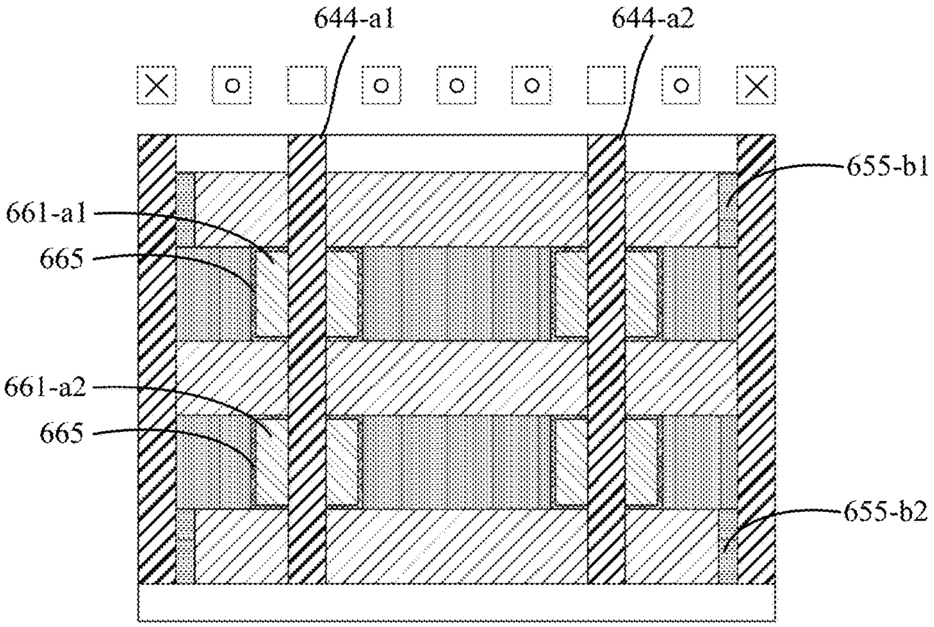
Figure 6C:
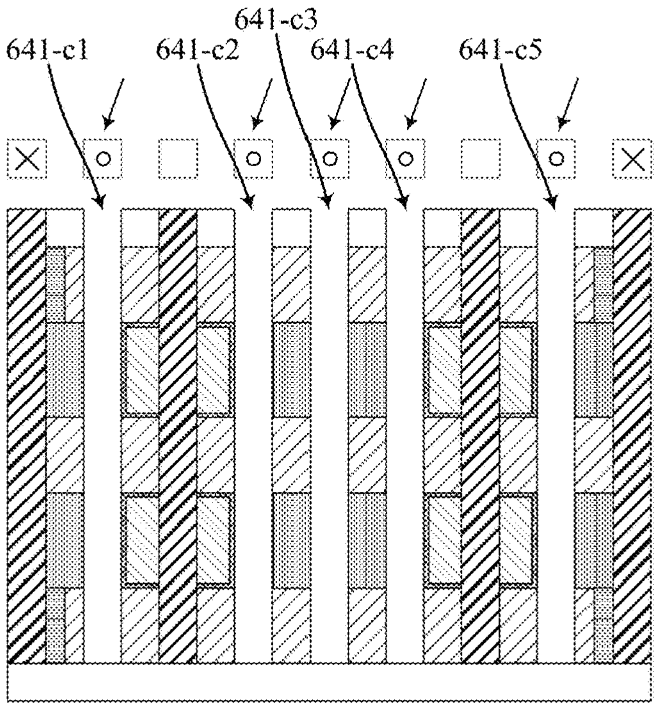
Figure 6D:
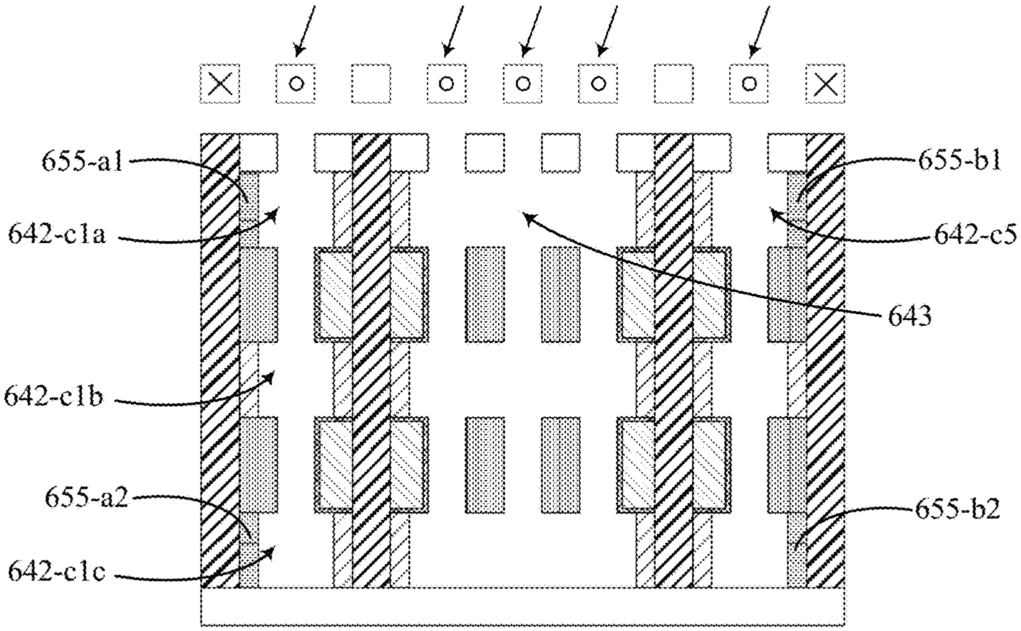
Figure 6E:
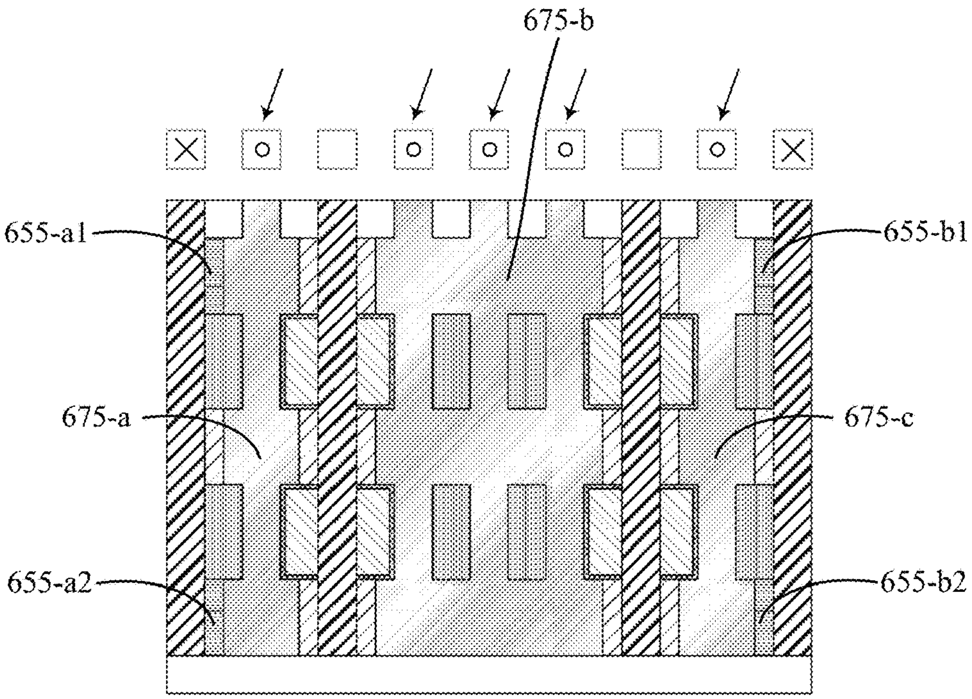
Figure 6F:
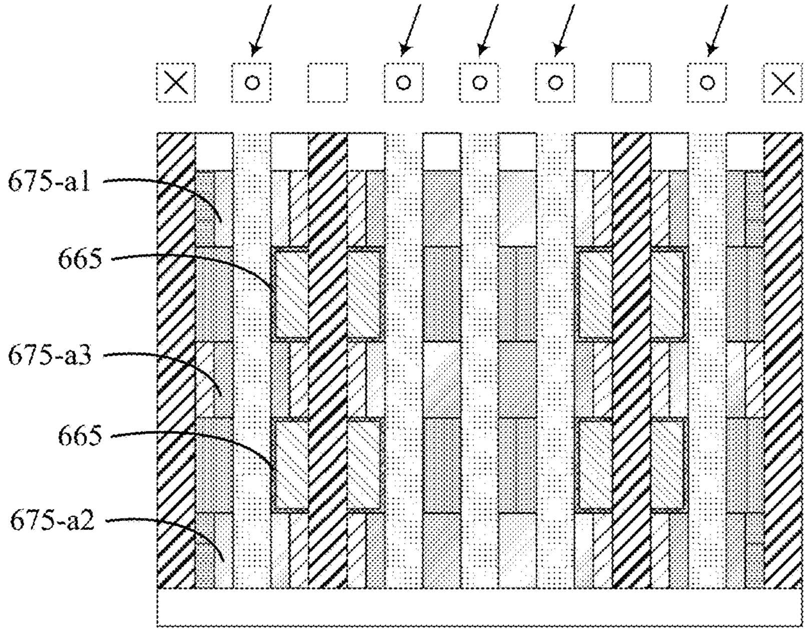
Figure 6G:
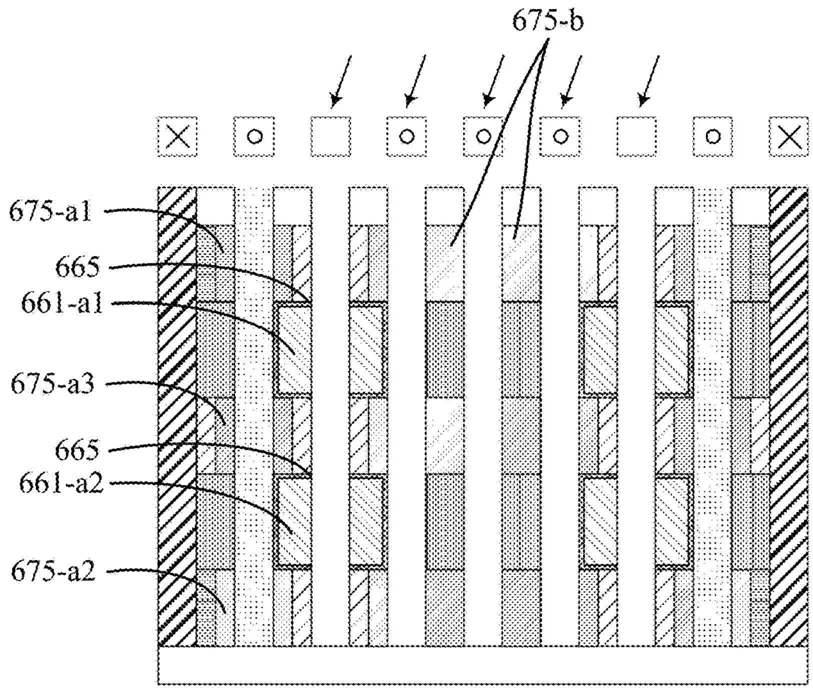
Figure 6H:
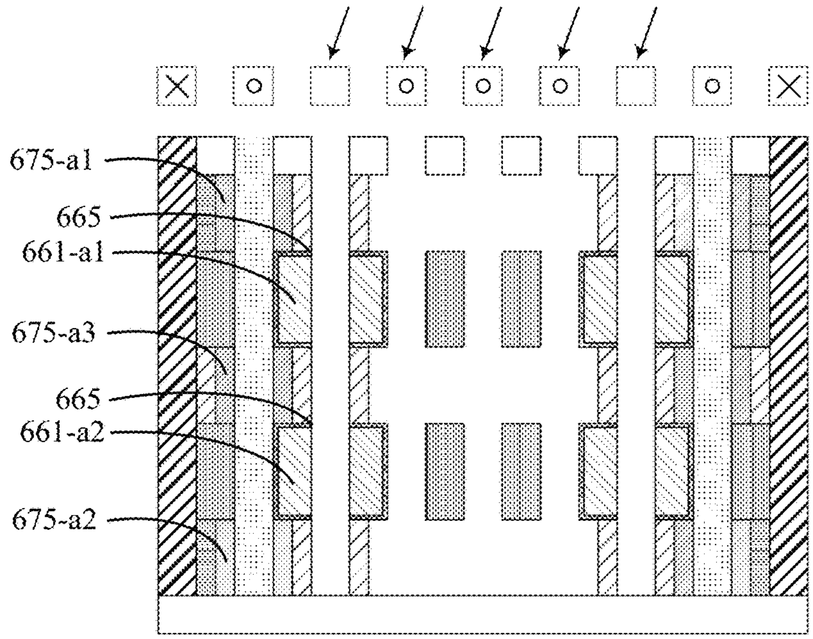
Figure 6I:
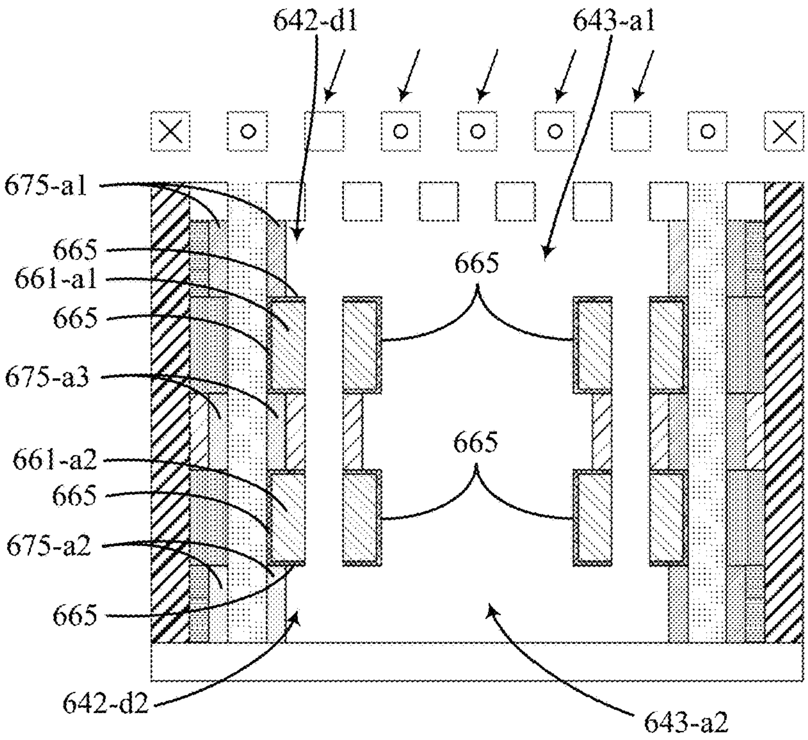
Figure 6J:
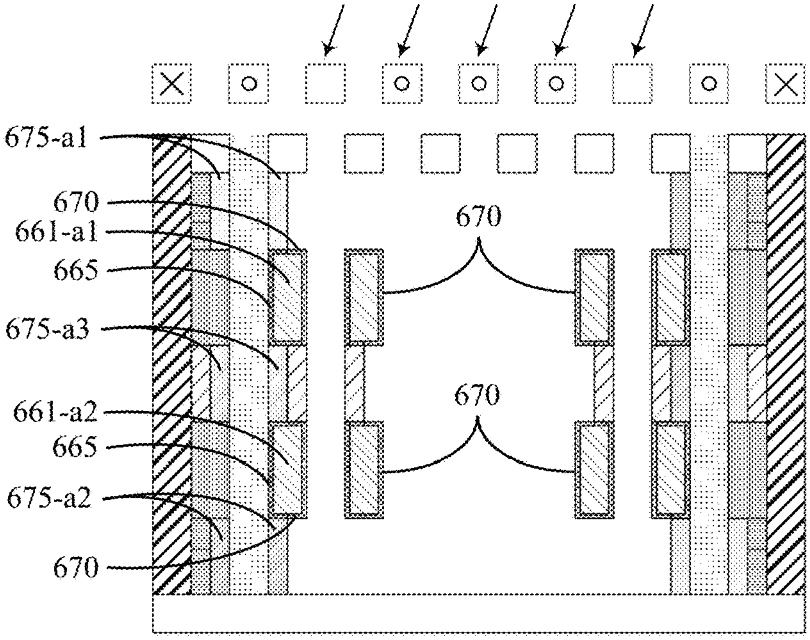
Figure 6K:
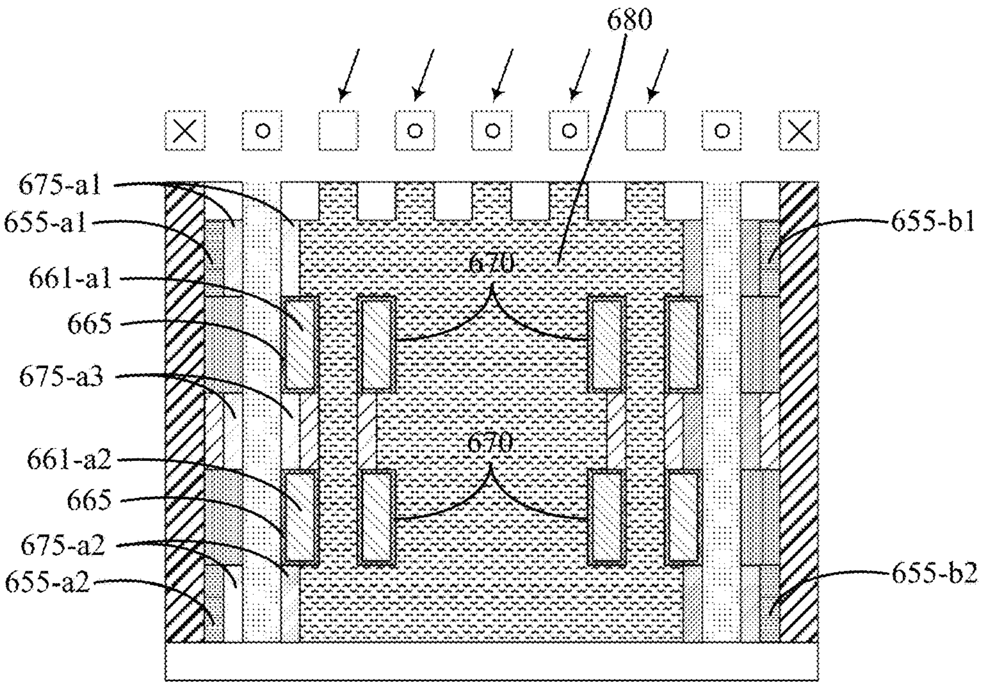
Figure 6L:
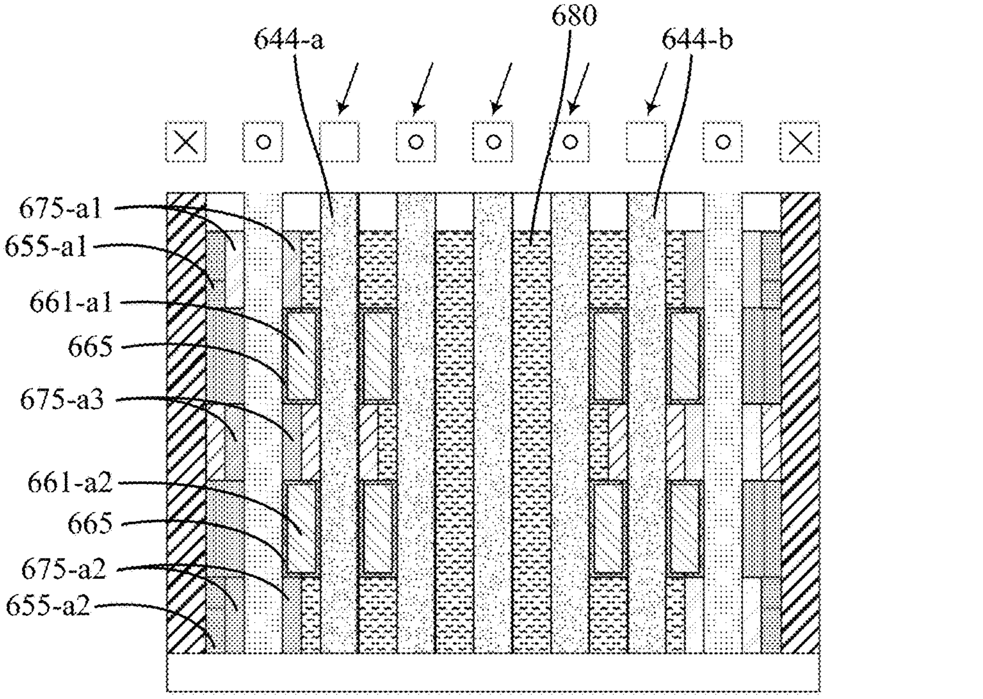
Figure 6M:
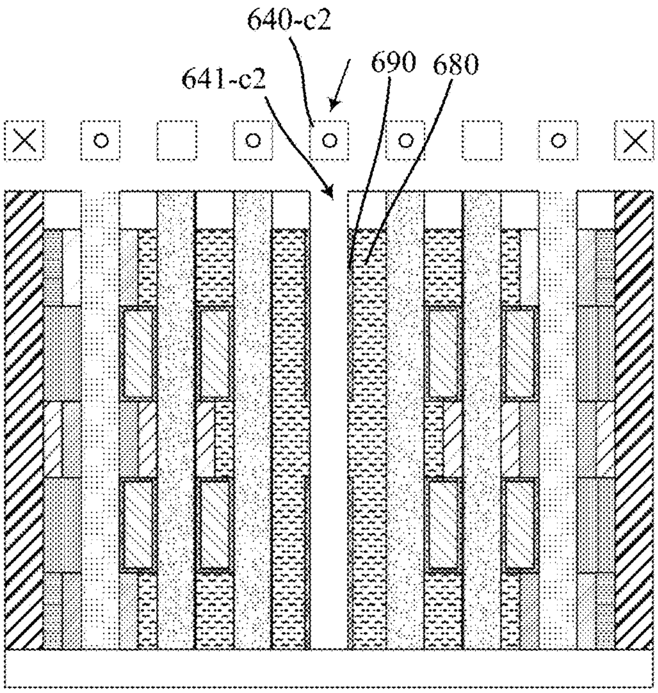
Figure 6N:
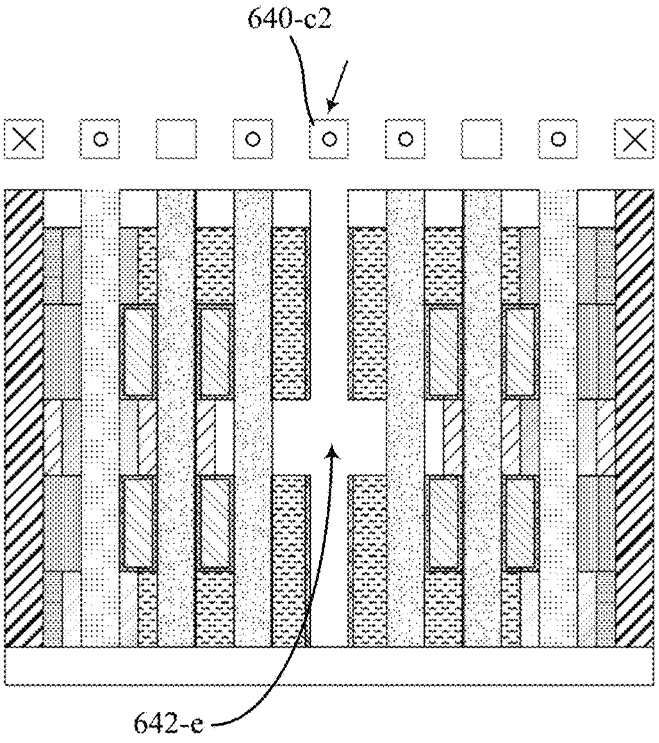
Figure 6O:
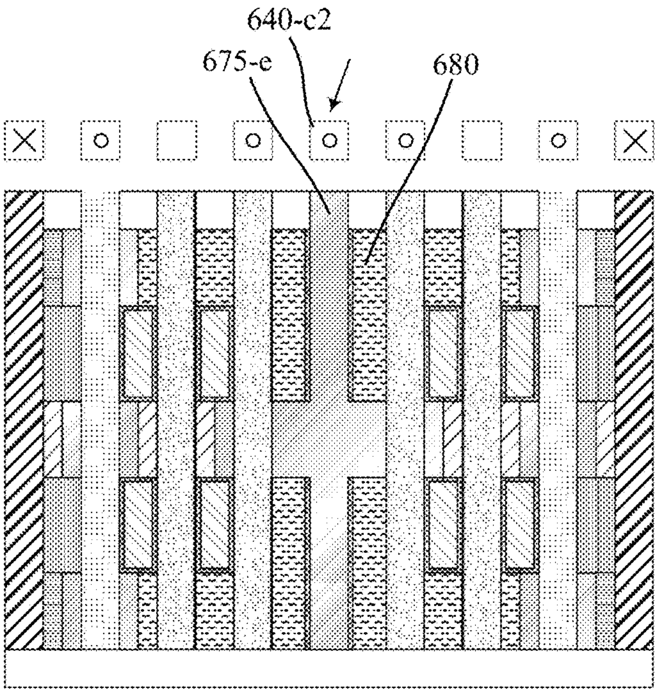
Figure 6P:
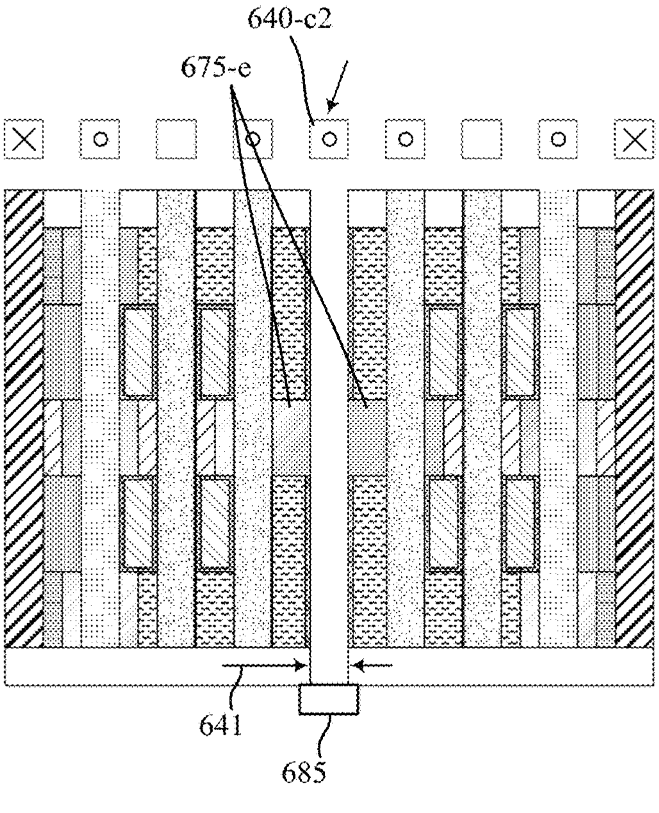
Figure 6Q:
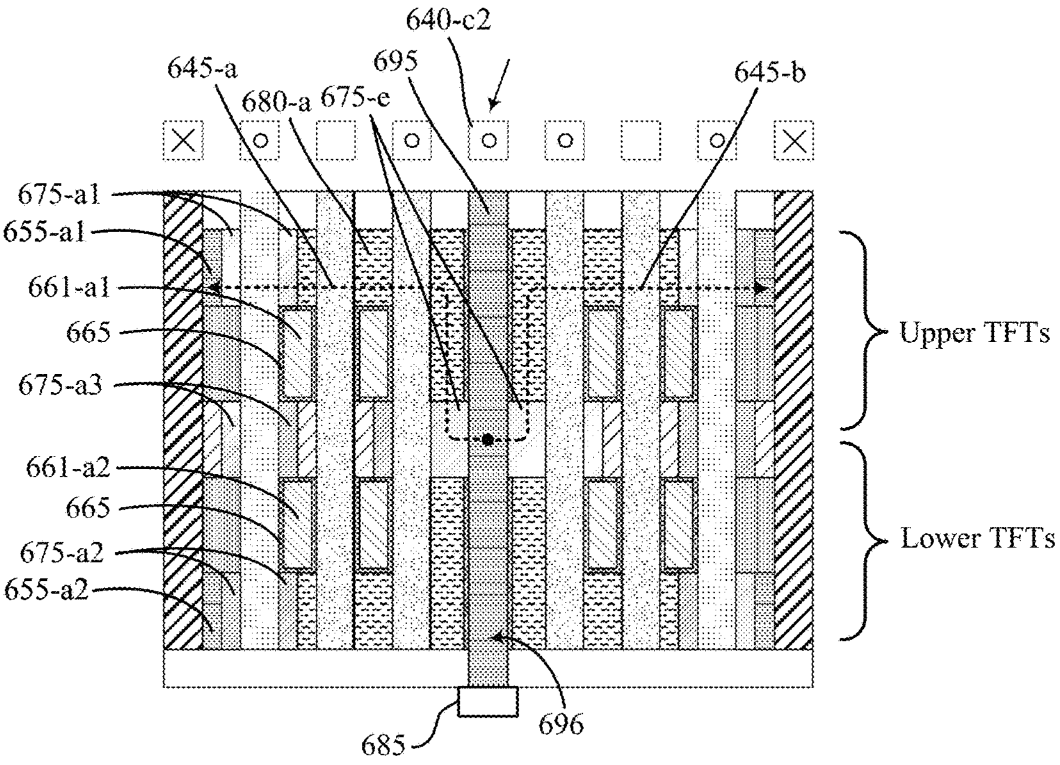
Figure 6R:
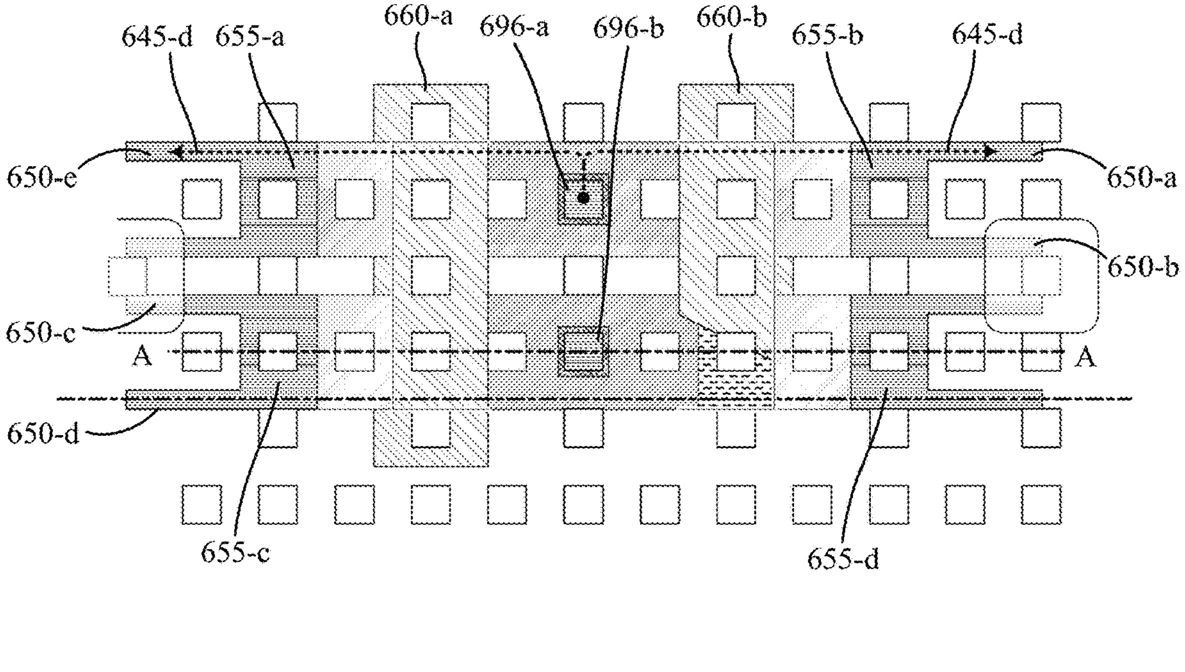

FIGS. 6A-6R illustrate exemplary fabrication techniques in accordance with the present disclosure. FIGS. 6A-6R describe aspects of several process steps for concurrently constructing two or more TFTs (e.g., hybrid TFTs in which an electrical current flows in a combination of vertical and horizontal directions, when the TFT is activated). In some cases, such TFTs may be fabricated in a socket region of array layers as described herein. FIGS. 6A-6R include top-down views of a portion of socket region (e.g., a layout of the socket region) to illustrate that different groups of vias may be used to concurrently construct various structures of the TFTs. FIGS. 6A-6R also include cross-sectional side views of the portion of socket region to illustrate aspects of process features during several process steps for concurrently constructing the TFTs.

FIGS. 6A-6R illustrate exemplary fabrication techniques to construct hybrid TFTs within a composite stack (e.g., the stack 305 for constructing the vertical TFTs as described with reference to FIGS. 3A-3L, the stack 405 for constructing the planar TFTs as described with reference to FIGS. 4A-4AA, the stack 505 for constructing the wrap-around TFTs as described with reference to FIGS. 5A-5N). As such, a composite stack may be used to construct vertical TFTs, planar TFTs, wrap-around TFTs, hybrid TFTs, or any combinations thereof in a socket region of array layers. As described herein, the composite stack may also be used to construct a 3D cross-point array of memory cells and associated electrodes in an active array region of the array layers. In this manner, the composite stack may provide for constructing array layers that each include a deck of memory cells and electrodes, where the electrodes (thus memory cells) may be further coupled with the TFTs (e.g., vertical TFTs, horizontal TFTs, wrap-around TFTs, hybrid TFTs, or any combinations thereof).

FIG. 6A illustrates a top-down view of a stack 605 where a socket region including two or more TFTs (e.g., hybrid TFTs) may be constructed as described herein. As an example, FIG. 6A illustrates four sets of TFTs. Each set of TFTs may drive a single set of array electrodes from one or the other end of the array electrodes. In some cases, two sets of TFTs may drive the single set of array electrodes—e.g., a first set of TFTs from one end and a second set of TFTs from the other end. Further, the first set of TFTs may couple the array electrode with a first node associated with a layer of logic circuitry and the second subset of TFTs may couple the array electrode with a second node associated with the layer of logic circuitry. In some cases, the first node may correspond to a select node and the first circuit may be referred to as a select driver. In some cases, the second node may correspond to an inhibit node and the second circuit may be referred to as an inhibit driver. In some cases, two sets of TFTs may be processed differently to tailor their operating characteristics accordingly—e.g., the first set of TFTs may be processed to provide a high drive current characteristics and the second subset of TFTs may be processed to provide a low leakage current characteristics within a certain range of operating voltages.

The stack 605 may be an example of the stack 305 described with reference to FIGS. 3A-3L. FIG. 6A illustrates a set of vias 640 (depicted as white squares, squares with x, squares with o) in an array pattern. The set of vias 640 may be formed through a top layer (e.g., layer 310 of stack 305, HM layer) of the stack 605 that includes a first layer (e.g., layer 315 of stack 305, D1 layer), a second layer (e.g., layer 320 of stack 305, DM layer), and a third layer (e.g., layer 325 of stack 305, D2 layer). The set of vias 640 may be examples of the set of vias 340 described with reference to FIGS. 3A-3L. FIG. 6A also illustrates various structures that may be concurrently formed within the stack 605 using a different groups of vias. For example, FIG. 6A illustrates a set of gate electrodes 660 (which may be examples of gate electrodes 360 described with reference to FIGS. 3A-3L) for TFTs, a set of array electrodes 650 (which may be examples of array electrodes 350 described with reference to FIGS. 3A-3L), each of which may be formed at different junctures of process sequence to construct the TFTs.

The set of gate electrodes 660 (e.g., gate electrode 660-*a*, gate electrode 660-*b*) may be constructed using a first subset of vias (e.g., a first group of vias 640-*a*) as described herein with reference to FIGS. 3C through 3F. Also, as described elsewhere, the set of array electrodes 650 (e.g., array electrode 650-*a* through array electrode 650-*d*) may be constructed using the vias depicted as squares with x (e.g., a second group of vias). Further, a set of electrode tabs (e.g., electrode tab 655-*a*, electrode tab 655-*b*) may be constructed using a subset of the second group of vias (e.g., via 640-*b*1, via 640-*b*2). As depicted in FIG. 6A, each electrode tab (e.g., electrode tab 655-*b*) may connect with an array electrode (e.g., array electrode 650-*a*) and as such, the set of array electrodes may include the set of electrode tabs.

In some cases, a subset of array electrodes (e.g., array electrode 650-*b*, array electrode 650-*c*) may be severed (e.g., separated, disconnected) from the rest of the array electrode by using a subset of vias (e.g., via 640-*x*) in accordance with fabrication techniques described herein. In some cases, the array electrodes may function as second electrodes for the TFTs. Additionally, a conductive plug may be constructed using a third via (e.g., via 640-*c*1, via 640-*c*2) as described herein with reference to FIGS. 6P and 6Q. In some cases, the conductive plug may function as a third electrode for TFTs and the conductive plug (e.g., the third electrode) may extend through at least the third layer (e.g., layer 325 of stack 305, D2 layer). FIG. 6A also illustrates a third group of vias (e.g., vias depicted as squares with o) formed through the top layer of the stack 605.

Cross-sectional side views of FIGS. 6B through 6Q may correspond to the socket region where an imaginary line AA in FIG. 6A extends through vias. For example, FIG. 6B illustrates nine (9) vias (e.g., vias depicted as white squares, vias depicted as squares with x, vias depicted as squares with o) above a cross-sectional side view of the stack 605 so as to match various structural features (e.g., via holes, via cavities, channels (i.e., adjoined via cavities), dielectric plugs, conductive plugs) formed within the stack 605 using one or more particular vias to form such structural features in the stack 605. In addition, arrows are added to indicate the one or more particular vias used at different junctures of process sequence to construct the TFTs.

FIG. 6B illustrates a cross-sectional side view of the stack 605 as described with reference to FIG. 6A. FIG. 6B illustrates that electrode material 661 (which may be an example of electrode material 361 described with reference to FIGS. 3A-3L) may have been previously formed in the second layer (e.g., DM layers) of the stack 605 as described herein with reference to FIGS. 3C-3F. The electrode material 661 depicted in FIG. 6B corresponds to the gate electrodes 660 depicted in FIG. 6A—e.g., electrode material 661-*a* forming gate electrodes 560-*a*. FIG. 6B illustrates that an insulating layer 665 (which may be an example of the insulating layer 365 described with reference to FIGS. 3A-3L) partially surrounds electrode material 661. FIG. 6B also illustrates that electrode tabs (e.g., electrode tab 655-*b*1, electrode tab 655-*b*2) may have been previously formed in the first layer (e.g., D1 layers) of the stack 605. Further, FIG. 6B illustrates via holes filled with a dielectric material that may be referred to as dielectric plugs (e.g., dielectric plug 644-*a*1, dielectric plug 644-*a*2) that extend through the gate electrodes (e.g., gate electrode 660-*a* that includes electrode material 661-*a*).

FIG. 6C illustrates a cross-sectional side view of the stack 605 after at least an etch process step is performed using the third group of vias—e.g., vias indicated with arrows. In some cases, the etch process step may include an anisotropic etch process that may form via holes (e.g., via hole 641-*c*1 through via hole 641-*c*5) corresponding to the third group of vias as described herein—e.g., vertically removing various materials through the stack 605 and stopping on the bottom layer of the stack 605.

FIG. 6D illustrates a cross-sectional side view of the stack 605 after at least an etch process step is performed to form via cavities 642 using the third group of vias. The via cavities 642 may be concentric with the via holes that have been formed within the stack 605 as described with reference to FIG. 6C. In some cases, the etch recipe may include an isotropic etch process that selectively removes the first dielectric material of the first layer (e.g., D1 layer) and the second dielectric material of the third layer (e.g., D2 layer). The isotropic etch process may leave other materials exposed in the via holes—e.g., placeholder material of the second layer (e.g., DM layer), insulating layer 665, array electrode tab 655. In some cases, via cavities corresponding to two or more via holes (e.g., via hole 641-*c*2 through via hole 641-*c*4) may merge to form via cavities (e.g., via cavity 643). As a result of the isotropic etch process, array electrodes (e.g., electrode tabs 655) are exposed to subsequent process steps. In some cases, the via cavities (e.g., via cavities 642-*c*1*a*, via cavities 642-*c*1*b*, via cavities 642-*c*1*c*) may span the first layer (e.g., D1 layer), second layer (e.g., DM layer), third layer (e.g., D3 layer).

FIG. 6E illustrates a cross-sectional side view of the stack 605 after at least a deposition process step is performed using the third group of vias—e.g., vias indicated with arrows. In some cases, the deposition process step may fill the via holes (e.g., via hole 641-*c*1 through via hole 641-*c*5)

and associated via cavities and channels (e.g., via cavities 642 and channel 643 as described with reference to FIG. 6D) with ohmic material 675 (which may be an example of the ohmic material 375 described with reference to FIGS. 3A-3L). As a result of the deposition process step, the ohmic material 675 may be in contact with the array electrodes 655.

FIG. 6F illustrates a cross-sectional side view of the stack 605 after at least an etch process step and a deposition process step are performed using the third group of vias—e.g., vias indicated with arrows. In some cases, the etch process step may include an anisotropic etch process that may vertically remove the ohmic material 675 in the via holes (e.g., via holes corresponding to the third group of vias), thereby leaving the ohmic material 675 within the via cavities (e.g., ohmic material 675-*a*1, ohmic material 675-*a*2, ohmic material 675-*a*3). The etch process step may leave other materials exposed within the via holes—e.g., placeholder material of the DM layer, insulating layer 665. In some cases, the deposition process step may fill the via holes formed by the etch process step (e.g., the anisotropic etch process that has removed the ohmic material in the via holes) with an insulating material. In some cases, excessive insulating material on top of the stack 605 may be removed using a CMP process or an etch-back process.

FIG. 6G illustrates a cross-sectional side view of the stack 605 after at least an etch process step is performed using a fourth group of vias—e.g., vias indicated with arrows. Referring to FIG. 6A, the fourth group of vias may include vias 640-*d*1 or vias 640-*d*2. In some cases, the fourth group of vias (e.g., vias 640-*d*1) may include a subset of the third group of vias (e.g., the vias depicted as squares with o) as well as a via (e.g., via 640-*c*1) that may form a third electrode for the TFT as described with reference to FIGS. 6P and 6Q. In some cases, the etch process step may include an anisotropic etch process that may vertically remove dielectric material (or insulating material) that may be present within the via holes corresponding to the fourth group of vias. The anisotropic etch process may leave other materials exposed in the via holes substantially unchanged—e.g., ohmic material 675, electrode material 661 that forms gate electrode 660, insulating layer 665, first dielectric material of the first layer (e.g., D1 layers), placeholder material of the second layer (e.g., DM layers), second dielectric material of the third layer (e.g., D2 layers). As a result of the anisotropic etch process, ohmic material 675 (e.g., ohmic material 675-*b* that has filled the channel 643 described with reference to FIG. 6D) may be exposed to a subsequent process step.

FIG. 6H illustrates a cross-sectional side view of the stack 605 after at least an etch process step is performed using the fourth group of vias—e.g., vias indicated with arrows. In some cases, the etch process step may include an isotropic etch process that may selectively remove the ohmic material 675 that has filled the channel (e.g., channel 643 as described with reference to FIG. 6D). The isotropic etch process may leave other materials exposed in the via holes and the channels substantially unchanged—e.g., electrode material 661 that forms gate electrode 660, insulating layer 665, first dielectric material at the first layer (e.g., D1 layers), placeholder material at the second layer (e.g., DM layer), second dielectric material at the third layer (e.g., D2 layer). As a result of the isotropic etch process, the first dielectric material at the first layer (e.g., D1 layers) and the placeholder material at the second layer (e.g., DM layer) may be exposed to a subsequent process step.

FIG. 6I illustrates a cross-sectional side view of the stack 605 after at least an etch process step is performed using the fourth group of vias—e.g., vias indicated with arrows. In some cases the etch process step may include an isotropic etch process that may selectively remove the first dielectric material at the first layer (e.g., D1 layers) and the placeholder material at the second layer (e.g., DM layer). The isotropic etch process may leave other materials exposed in the via holes and the channels substantially unchanged—e.g., electrode material 661 that forms gate electrode 660, insulating layer 665, second dielectric material at the third layer (e.g., D2 layer), ohmic material 675. As a result of the isotropic etch process, some portions of insulating layer 665 may be exposed to a subsequent process step. In some cases, the isotropic etch process, using the fourth group of vias, may form via cavities (e.g., via cavity 642-*d*1, via cavity 642-*d*2) and channels (e.g., channel 643-*a* that includes two or more adjacent via cavities). Such via cavities or channels may span the first layer (e.g., D1 layers), the second layer (e.g., DM layers), and the third layer (e.g., D2 layer).

FIG. 6J illustrates a cross-sectional side view of the stack 605 after at least an etch process step and a deposition process step are performed using the fourth group of vias—e.g., vias indicated with arrows. In some cases, the etch process step may include an isotropic etch process that may selectively remove the exposed portions of insulating layer 665. The isotropic etch process may leave other materials exposed in the via holes and the channels substantially unchanged—e.g., electrode material 661 that forms gate electrode 660, second dielectric material at the third layer (e.g., D2 layer), ohmic material 675. In some cases, the deposition step may form oxide material 670 (which may be an example of the oxide material 370 described with reference to FIGS. 3A-3L) in contact with the electrode material 661 that forms gate electrode 660. In other words, the exposed portions of insulating layer 665 may be replaced with the oxide material 670 as a result of the etch process step and the deposition process step. In some cases, the oxide material 670 may be referred to as gate oxide for the TFTs.

FIG. 6K illustrates a cross-sectional side view of the stack 605 after at least a deposition process step is performed using the fourth group of vias—e.g., vias indicated with arrows. In some cases, the deposition process step may fill the via cavities or the channels (e.g., via cavity 642, channel 643) described with reference to FIG. 6I with semiconductor material 680. Excessive semiconductor material on top of the stack 605 may be removed using a CMP process or an etch-back process. As a result of filling the via cavities or the channels with the semiconductor material 680, the semiconductor material 680 may be in contact with the ohmic material 675 that is further connected to the array electrode (e.g., electrode tab 655, second electrode for the TFTs). Further, the semiconductor material 680 may be in contact with the oxide material 670 that is further connected to the gate electrode 660 (e.g., the gate electrode 660 including the electrode material 661).

FIG. 6L illustrates a cross-sectional side view of the stack 605 after at least an etch process step and a deposition process step are performed using the fourth group of vias—e.g., vias indicated with arrows. In some cases, the etch process step may remove the semiconductor material 680 that has filled the via cavities or the channels described with reference to FIG. 6K to form via holes (e.g., via holes corresponding to the fourth group of vias). In some cases, the deposition process step may fill the via holes with an insulating material (or dielectric material). In some cases, removing the semiconductor material 680 within the via holes corresponding to the fourth group of vias may remove a parasitic current path having a shorter channel length for the TFTs such that primary current paths for the TFTs may have a longer channel length as described with reference to FIG. 6Q. In some cases, the deposition process step may fill the via holes with a dielectric material. In some cases, the via holes filled with the dielectric material may be referred to as dielectric plugs (e.g., dielectric plug 644-*a*, dielectric plug 644-*b*) that extend through the gate electrodes (e.g., gate electrode 660-*a* that includes electrode material 661-*a*). Excessive insulating material on top of the stack 605 may be removed using a CMP process or an etch-back process.

FIG. 6M illustrates a cross-sectional side view of the stack 605 after at least an etch process step and a deposition process step are performed using a fifth group of vias—e.g., vias indicated with arrows. Referring to FIG. 6A, the fifth group of vias may include via 640-*c*1 or via 640-*c*2. In some cases, the etch process step may include an anisotropic etch process that may vertically remove the insulating material that has filled the via holes as described with reference to FIG. 6L, thereby forming the via hole (e.g., via hole 641-*c*2 corresponding to via 640-*c*2) through the first layer (e.g., D1 layers), second layer (e.g., DM layers), and third layer (e.g., D2 layer). The anisotropic etch process using the fifth group of vias may expose semiconductor material 680 in the via hole (e.g., via hole 641-*c*2 corresponding to via 640-*c*2) to a subsequent process step. In some cases, the deposition step may selectively grow insulating material 690 in contact with the semiconductor material 680 at the first layer (e.g., D1 layers) and the second layer (e.g., DM layer).

FIG. 6N illustrates a cross-sectional side view of the stack 605 after at least an etch process step is performed using the fifth group of vias—e.g., vias indicated with arrows. In some cases, the etch process step, using the fifth group of vias (e.g., via 640-*c*2), may laterally remove the semiconductor material 680 at the third layer (e.g., D2 layer) to form cavities (e.g., cavity 642-*c*) at the third layer. The insulating material 690 on the surface of semiconductor material 680 may preserve the semiconductor material 680 at the first layer (e.g., D1 layers) and the second layer (e.g., DM layers). The etch process step may expose portions of the semiconductor material 680 to a subsequent process step.

FIG. 6O illustrates a cross-sectional side view of the stack 605 after at least a deposition process step is performed using the fifth group of vias—e.g., vias indicated with arrows. In some cases, the deposition process step may fill the via holes (e.g., via hole 641-*c*2 described with reference to FIG. 6M) and associated via cavities (e.g., via cavity 642-*e* described with reference to FIG. 6N) with ohmic material 675-*c*.

FIG. 6P illustrates a cross-sectional side view of the stack 605 after at least an etch process step is performed using the fifth group of vias—e.g., vias indicated with arrows. In some cases, the etch process may include an anisotropic etch process that may remove the ohmic material 675-*e* in the via hole (e.g., via hole corresponding to via 640-*c*2). In some cases, the anisotropic etch process may create holes (e.g., hole 641) at the bottom layer of the stack 605 (e.g., layer 330). The holes may be coupled with conductive elements (e.g., conductive element 685) that may be a part of a layer of logic circuitry. In some cases, conductive element 685 may be coupled with an inhibit node of an inhibit driver. In some cases, conductive element 685 may be coupled with a select node of a select driver.

FIG. 6Q illustrates a cross-sectional side view of the stack 605 after at least a deposition process step is performed using the fifth set of vias—e.g., vias indicated with arrows. In some cases, the deposition step may fill the via holes (e.g., via hole corresponding to via 640-*c*2) and the holes (e.g., hole 641 described with reference to FIG. 6P) at the bottom layer with electrode material 695. Excessive electrode material 695 on top of the stack may be removed using a CMP process or an etch-back process. The via holes filled with electrode material 695 may be referred to as conductive plugs (e.g., conductive plug 696). The conductive plugs 696 may couple conductive elements 685 with the semiconductor material (e.g., semiconductor material 680-*a*) of the TFTs through ohmic materials (e.g., ohmic material 675-*c*) and may complete construction of TFTs.

In some cases, TFTs illustrated in FIG. 6Q may include a conductive plug that extends through a stack that comprises a first layer, a second layer, and a third layer, a gate electrode at the second layer, a second electrode at the first layer, and a semiconductor material at the first layer and the second layer, the semiconductor material coupled with the second electrode via a first segment of ohmic material at the first layer and coupled with the conductive plug via a second segment of ohmic material at the third layer. In some cases, the TFTs may include a dielectric plug that extends through the gate electrode.

FIG. 6Q also illustrates current paths (e.g., current path 645-*a*, current path 645-*b*) for TFTs (e.g., upper TFTs). The current paths illustrate how a particular TFT, when the TFT is activated, may couple a node of a layer of logic circuitry with an array electrode to access memory cells in an active array region of array layers. For example, conductive element 685 may be coupled with a select node of a select driver. The conductive element 685 is coupled with the conductive plug 696 that may function as a common source for the TFTs depicted in FIG. 6Q—e.g., both upper TFTs and lower TFTs. The conductive plug 696 is in contact with a semiconductor material 680-*a* through an ohmic material 675-*e*. The semiconductor material 680-*a* may form an active channel for a current to flow based on a voltage applied to the gate electrode 660 (e.g., the gate electrode 660-*a* including electrode material 661-*a*).

Additionally, the semiconductor material 680-*a* is connected to the electrode tab 655-*a*1 through the ohmic material 675-*a*1. Electrode tab 655-*a*1 (hence array electrode 650-*c* as depicted in FIG. 6R) may function as a drain for the TFT (e.g., the left TFT of the upper TFTs). In this manner, the current may flow (e.g., a current path 645-*a*) between the source and the drain of the TFT when the active channel is formed within the semiconductor material (e.g., semiconductor material 680-*a*)—when a voltage applied to the gate electrode (e.g., the gate electrode 660-*a* including electrode material 661-*a*) is greater than a threshold voltage of the TFT and when there is a voltage difference between the source (that is coupled with the node of the layer of logic circuitry) and the drain (that is coupled with an array electrode) of the TFT.

The electrical current flowing within the TFTs flows both in a vertical direction and a horizontal direction (e.g., with respect to a horizontal substrate) and the TFTs may be referred to as hybrid TFTs (e.g., a hybrid of a vertical TFT described with reference to FIG. 3K and a horizontal TFT described with reference to FIG. 4Z). As illustrated in FIG. 6Q, a channel length (e.g., a distance between a source and a drain of a TFT) of a hybrid TFT may be greater than the channel length of either the vertical TFT or the horizontal TFT. Such an increased channel length may be beneficial for some aspects of the TFT operation—e.g., less prone to experience a leakage current issue related to a channel length.

FIG. 6R illustrates a top-down view of the stack 605 where the socket region includes four TFTs (e.g., hybrid TFTs). Cross-sectional side views of FIG. 6Q may correspond to the socket region where an imaginary line AA extends as shown in FIG. 6R. FIG. 6R illustrates aspects of structural features that have been constructed using the fabrication techniques described herein. For example, FIG. 6R depicts array electrodes 650 that may function as a second electrode (e.g., drain) for the TFTs, gate electrodes 660 for the TFTs, and the conductive plugs 596. FIG. 6R also depicts top-down view of current paths (e.g., current path 645-*c*, current path 645-*d*) described with reference to FIG. 6Q.

FIGS. 7A-7D illustrate diagrams of exemplary memory array including an active array region and socket regions that support thin film transistors and related fabrication techniques in accordance with embodiments of the present disclosure. FIGS. 7A-7D describe various aspects of the socket regions where a set of TFTs may be concurrently constructed within a composite stack 705 described with reference to FIG. 7C (e.g., one or more vertically integrated composite stacks 305 described with reference to FIGS. 3A-3L). FIGS. 7A-7D include top-down views of a portion of the socket regions (e.g., a layout of the socket region) to illustrate that subsets of the set of TFTs may be configured to couple nodes of a layer of circuitry (e.g., a row decoder 120 constructed in a substrate 204) with subsets of array electrodes (e.g., access lines, word lines, bit lines) of the active array region where memory cells are located. Additionally, FIGS. 7A-7D include cross-sectional side views of different portions of socket regions to illustrate that the set of TFTs may couple the array electrodes with the nodes of layer of circuitry. In some cases, the layer of circuitry may be a part of a substrate above which the array layers are located.

FIGS. 7A-7D also include circuit representations of the set of TFTs to illustrate that the set of TFTs may facilitate access operations in conjunction with the layer of circuitry. FIGS. 7A-7D depicts the socket regions including a set of vertical TFTs as an illustrative example, but the present disclosure is not so limited—e.g., the socket regions may include other kinds of TFTs or any combinations thereof as described herein. Further, aspects of fabrication techniques and operation of vertical TFTs are described in FIGS. 3A through 3L.

Figure 7A:
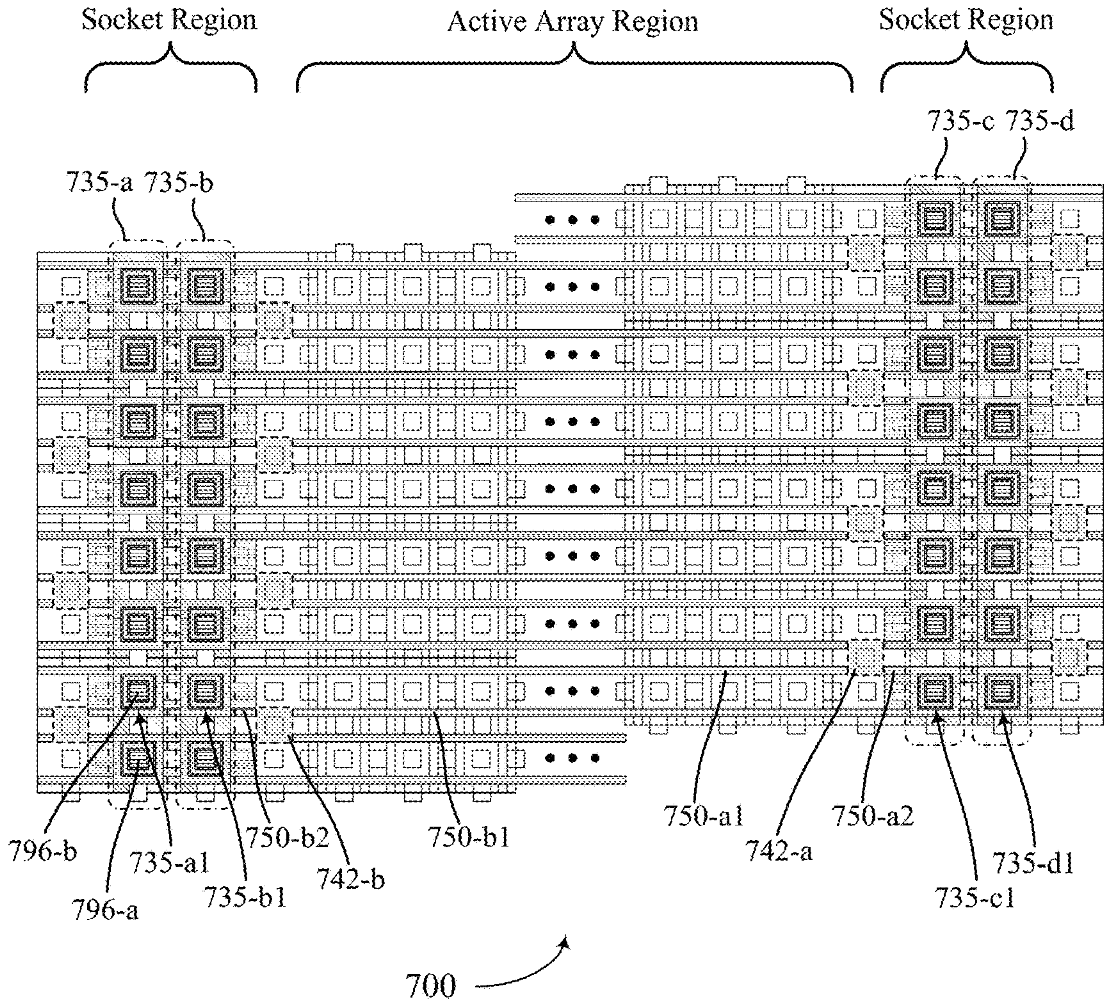
FIGS. 7A-7D illustrate diagrams of exemplary memory array including an active array region and socket regions that support thin film transistors and related fabrication techniques in accordance with embodiments of the present disclosure.
Figure 7A:
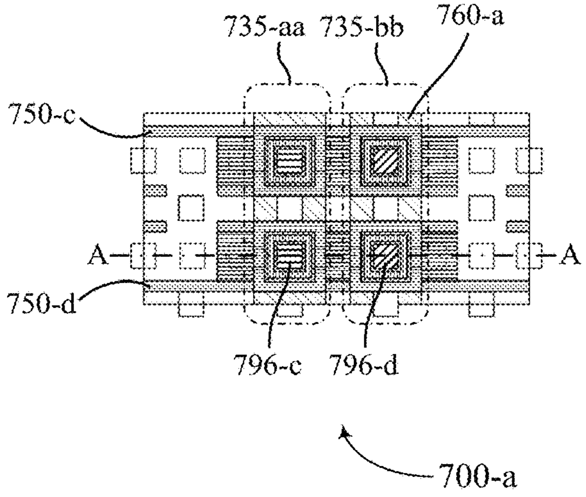
Figure 7A:
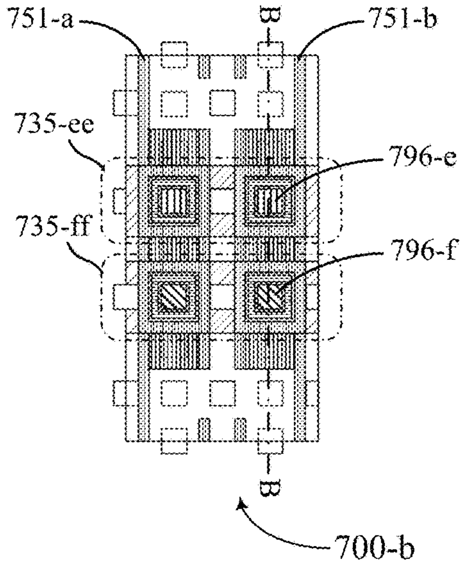

FIG. 7A illustrates a top-down view 700 of array layers including an active array region and two socket regions that each include a set of TFTs. In some cases, the active array region may include a set of decks of memory cells constructed within the composite stack 705. As described herein, the set of TFTs may also be constructed in socket regions of the composite stack 705. In some cases, the set of TFTs may include vertical TFTs as described with reference to FIGS. 3A-3L. As such, each TFT of the set of TFTs may include a conductive plug 796 (e.g., conductive plug 396 as described with reference to FIG. 3L). The set of TFTs may further include a first subset of TFTs (e.g., TFTs 735-*a*, TFTs 735-*c*) and a second subset of TFTs (e.g., TFTs 735-*b*, TFTs 735-*d*). In some case, the first subset of TFTs (e.g., TFTs 735-*a*) may be configured to couple a first node (e.g., a select node) of a layer of circuitry (e.g., row decoder 120 constructed in a substrate 204) with one or more array electrodes 750 (which may also be referred as electrodes, access lines, word lines, or bit lines). Additionally or alternatively, the second subset of TFTs (e.g., TFTs 735-*b*) may be configured to couple a second node (e.g., inhibit node) of the layer of circuitry with one or more array electrodes 750.

Further, the first subset of TFTs and the second subset of TFTs may be constructed differently in some cases based on their operational characteristics. For example, the first subset of TFTs (e.g., TFTs for selection) may be constructed to provide a suitable amount of drive current and the second subset of TFTs (e.g., TFTs for inhibition) may be constructed to provide an acceptable leakage current (e.g., limit leakage current to an acceptable amount). In some cases, the second subset of TFTs may be constructed using a relatively simpler processing steps (e.g., associated with a less quantity of processing steps than the first subset of TFTs) or to facilitate lower voltage operations (e.g., configured to support a lower supply voltage than the first subset of TFTs). In some cases, the first subset of TFTs and the second subset of TFTs may be different types of TFTs (e.g., n-type TFTs, p-type TFTs). In some cases, a body terminal (e.g., fourth terminal for a body of TFT as described with reference to FIG. 5N) may be incorporated into the composite stack 705 such that the body terminal may facilitate controlling threshold voltages for the TFTs.

In some cases, the two socket regions shown in top-down view 700 may illustrate socket regions associated with word lines (which may also be referred to as access line of a first type). Array electrodes 750 may correspond to electrodes (e.g., word lines) at first layers (e.g., D1 layers of stack 305) of the composite stack. In other cases, the two socket regions shown in top-down view 700 may illustrate socket regions associated with bit lines (which may also be referred to as access line of a second type). As such, array electrodes 750 may alternatively correspond to electrodes (e.g., bit lines) at third layers (e.g., D2 layer of stack 305). Memory cells associated with array electrodes (e.g., word lines, access lines of a first type, bit lines, access lines of a second type) may be constructed at second layers (e.g., DM layers of stack 305).

Top-down view 700 also depicts that a first array electrode (e.g., electrode 750-*a*) may be severed into two or more array electrodes (e.g., electrode 750-*a*1, electrode 750-*a*2) using one or more via cavities (e.g., via cavity 742-*a*). Further, a second array electrode (e.g., electrode 750-*b*) may be severed into two or more array electrodes (e.g., electrode 750-*b*1, electrode 750-*b*2) using one or more via cavities (e.g., via cavity 742-*b*). In some cases, a set of vias (e.g., vias located in between the electrode 750-*a* and electrode 750-*b*) may have been used to construct the first array electrode and the second array electrode. In this manner, the first array electrode (e.g., electrode 750-*a*1) may be coupled with a first group of two TFTs (e.g., TFT 735-*a*1, TFT 735-*b*1) and the second array electrode (e.g., electrode 750-*b*1) may be coupled with a second group of two TFTs (e.g., TFT 735-*c*1, TFT 735-*d*1). In some cases, the TFTs (e.g., TFT 735-*a*1, TFT 735-*b*1) may be coupled with the electrode (e.g., electrode 750-*a*1) at a point between two ends (e.g., a midpoint, a central point, within a central region) of the electrode (e.g., electrode 750-*a*1). Similarly, the TFTs (e.g., TFT 735-*c*1, TFT 735-*d*1) may be coupled with the electrode (e.g., electrode 750-*b*1) between (e.g., a midpoint, a central point, within a central region) two ends of the electrode (e.g., electrode 750-*b*1).

In some cases, a first electrode segment (e.g., electrode 750-*b*2) may be at a layer of the deck (e.g., D1 layers) and shorter than an electrode (e.g., electrode 750-*a*1), where the electrode may be an access line of a first type (e.g., word line) and extend in a first direction at the layer of the deck, and where the conductive plug (e.g., conductive plug 796-*b*) may be between the electrode and the first electrode segment. In some cases, a second access line of the first type (e.g., electrode 750-*b*1) may extend in the first direction at the layer of the deck, where the second access line (e.g., electrode 750-*b*1) may be coaxial with the first electrode segment (e.g., electrode 750-*b*2). In some cases, a second electrode segment (e.g., electrode 750-*a*2) may be at the layer of the deck and shorter than the electrode (e.g., electrode 750-*a*1), where the second electrode segment may be coaxial with the electrode.

As such, the set of TFTs may facilitate an access operation (e.g., read operation, write operation) to memory cells that are associated with array electrodes in the active array region. For example, when TFT 735-*a*1 is activated, the select node of a layer of circuitry (e.g., row decoder 120 constructed in a substrate 204) may be coupled with electrode 750-*a*1 (thus, the memory cells associated with electrode 750-*a*1) to perform the access operation. Additionally or alternatively, other TFTs (e.g., TFTs 735-*d*) may be activated to couple the inhibit node to a subset of array electrodes (e.g., electrodes including electrode 750-*b*1 that are not selected during the access operation) to maintain a leakage current level associated with unselected memory cells below an acceptable threshold during the access operation.

FIG. 7A illustrates top-down views 700-*a* and 700-*b* of socket regions that each include a set of TFTs. Top-down view 700-*a* may be a portion of a word line socket region including array electrodes (e.g., electrode 750-*c* in D1 layers of the composite stack 705) that may correspond to word lines that extends in a first direction. Further, top-down view 700-*a* depicts a set of TFTs (e.g., TFTs 735-*aa*, TFTs 735-*bb*) that include conductive plugs (e.g., conductive plug 796-*c*). As described herein, TFTs 735-*aa* may be coupled with a select node of a layer of circuitry, and TFTs 735-*bb* may be coupled with an inhibit node of the layer of circuitry.

Similarly, top-down view 700-*b* may be a portion of a bit line socket region including array electrodes (e.g., electrode 751 in D2 layers of the composite stack 705) that may correspond to bit lines that extends in a second direction (e.g., a second direction that is substantially orthogonal to the first direction). Further, top-down view 700-*b* depicts a set of TFTs (e.g., TFTs 735-*cc*, TFTs 735-*ff*) that include conductive plugs (e.g., conductive plug 796-*c*). As described herein, TFTs 735-*ce* may be coupled with a select node of a layer of circuitry and TFTs 735-*ff* may be coupled with an inhibit node of the layer of circuitry.

In some cases, a socket region of array layers may include a first socket region (e.g., socket region associated with word lines) that includes the conductive plug (e.g., conductive plug 976-*c*), where the electrode (e.g., electrode 750-*c*) may include an access line of a first type (e.g., word line) that extends into the first socket region. In some cases, the socket region of array layers may include a second socket region (e.g., socket region associated with bit lines) that includes the second conductive plug (e.g., second conductive plug 796-*c*), where the second electrode (e.g., electrode 751-*a*) may include an access line of a second type (e.g., bit line) that extends into the second socket region.

Figure 7B:
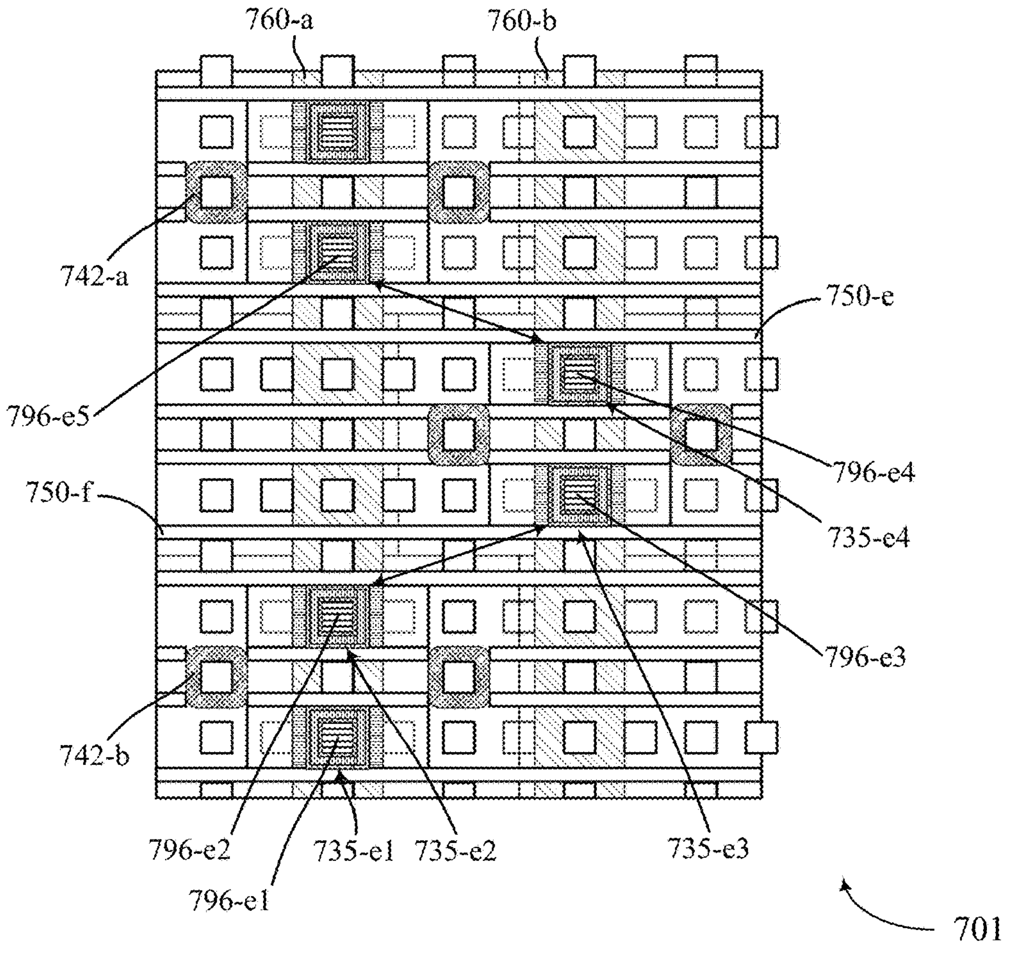
Figure 7B:
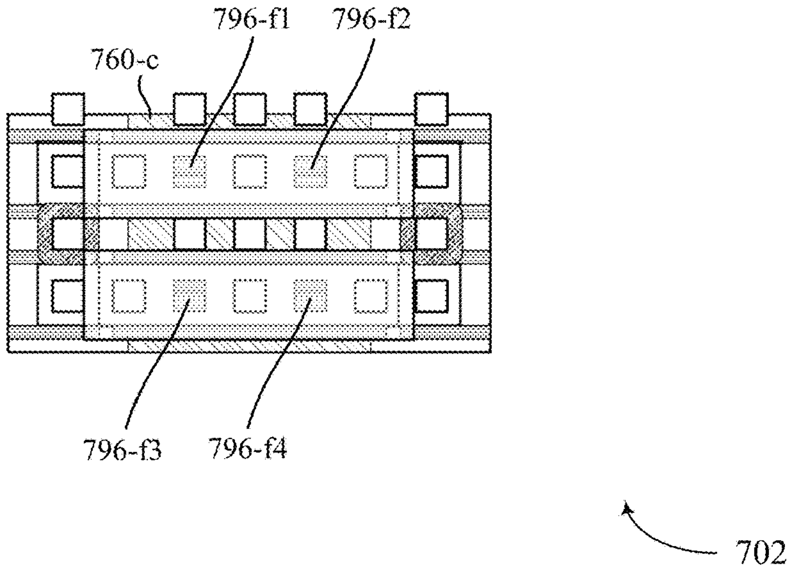

FIG. 7B illustrates a top-down view 701 of a socket region and another top-down view 702 of a vertical TFT that may be included in a socket region. Top-down view 701 depicts a set of array electrodes 750, a set of gate electrodes 760 (which may be examples of gate electrodes 360 described with reference to FIGS. 3A-3L), a set of via cavities 742, and a set of TFTs 735, where each TFT 735 is in contact with a respective conductive plug 796. In some cases, top-down view 701 may be a variation of the socket region depicted in the top-down view 700.

For example, a subset of TFTs (e.g., a group of two TFTs) may be offset from remaining TFTs—e.g., TFT 735-*e*1 and TFT 735-*c*2 offset with respect to TFT 735-*c*3 and TFT 735-*c*4. As a result of offsetting the subset of TFTs in a zig-zag pattern, a distance between conductive plugs (e.g., distance between conductive plug 796-*e*2 and conductive plug 796-*e*3) may be greater in a socket depicted in the top-down view 701 when compared to corresponding distances in a socket depicted in the top-down view 700. Such an increase in distance may facilitate an improved result during a photolithograpy step. In some cases, each TFT (e.g., instead of a group of two TFTs) may be offset from neighboring TFTs such that a minimum distance between conductive plugs may be a diagonal distance between two conductive plugs. For example, though top-down view 701 illustrates an example in which TFTs are offset (zig-zag) in pair-wise fashion (pairs of TFTs offset from one another), it is to be understood that any number of other offset patterns are possible, including a configuration in which each TFT within a socket region is offset from each adjacent (immediately neighboring) TFT within the socket region.

In some cases, a socket region may include a first gate electrode (e.g., gate electrode 760-*b*) that may surround the conductive plug (e.g., conductive plug 796-*e*3, conductive plug 796-*e*4) and a second gate electrode (e.g., gate electrode 760-*a*) that may surround a first additional conductive plug (e.g., conductive plug 796-*e*5) that extends through the set of decks and a second additional conductive plug (e.g., conductive plug 796-*e*2) that extends through the set of decks, where the electrode (e.g., electrode 750-*e*, electrode 750-*f*) may extend between the first additional conductive plug and the second additional conductive plug.

Top-down view 702 of a vertical TFT may depict a variation of vertical TFT depicted in top-down view of 700. For example, gate electrode 760-*c* may be configured to surround more than one conductive plugs (e.g., four conductive plugs 796-*f*1 through 796-*f*4). As a result, the vertical TFT may generate a drive current that may be approximately four (4) times greater that a drive current that individual TFTs (e.g., TFT 735-*a*1, TFT 735-*c*1 as shown in top-down view of 700) may generate. Other features of vertical TFT in the top-down view 702 have been omitted for clarity.

Figure 7C:
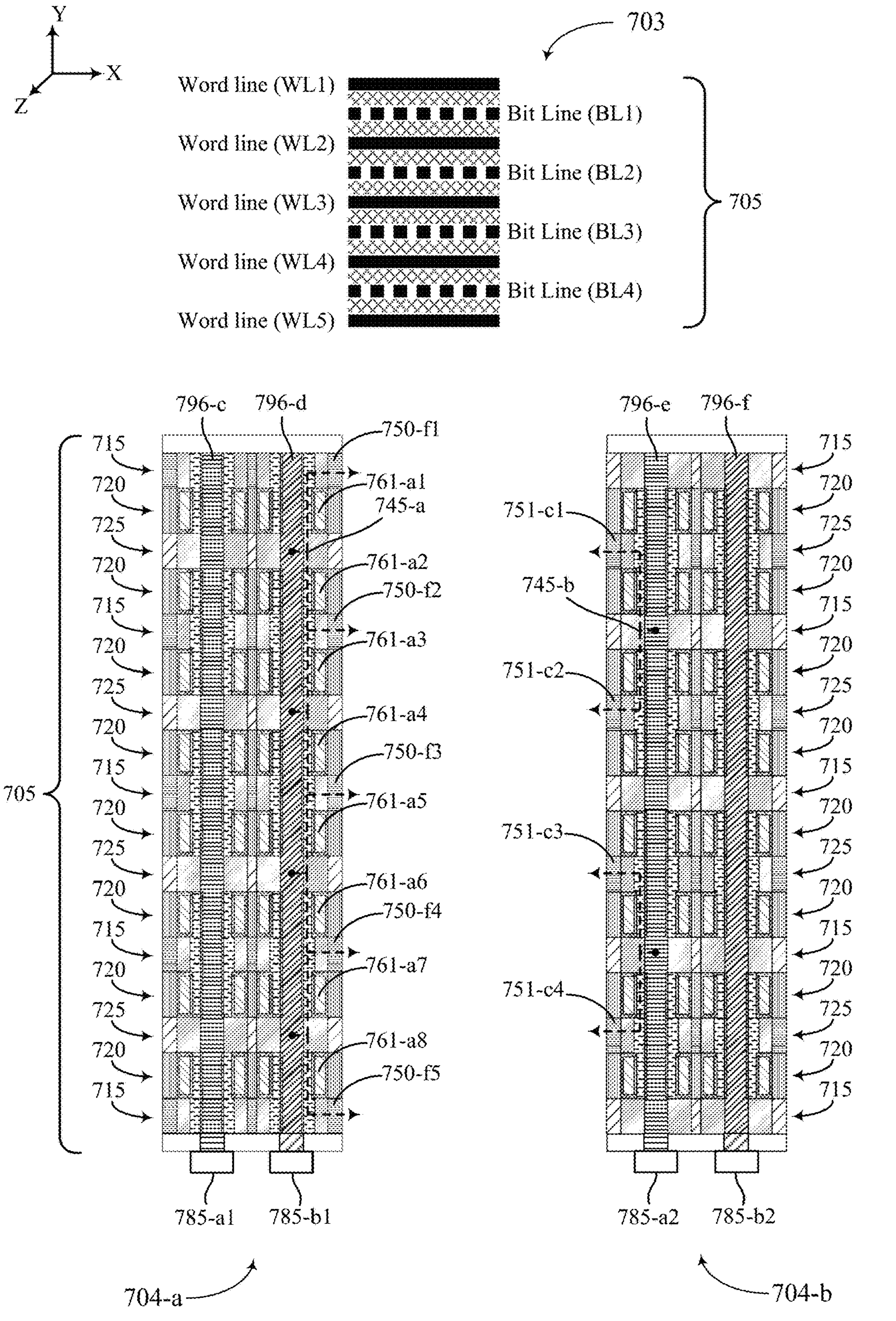

FIG. 7C illustrates an example schematic cross-sectional side view 703 of array layers that includes eight (8) decks of memory cells. In some cases, the eight (8) decks of memory cells my include five (5) sets of word lines that each may extend in a first direction (e.g., x-direction) and four (4) sets of bit lines that each may extend in a second direction (e.g., z-direction). A deck of memory cells (which is depicted as cross-hatched rectangles in cross-sectional side view 703) may be located in between a subset of word lines (e.g., WL1) and a subset of bit lines (e.g., BL1). Some access lines (e.g., word lines, bit lines) may be common to more than one deck of memory cells. For example, WL2 may be common to two decks of memory cells, namely a first deck of memory cells that are located between WL2 and BL1 and a second deck of memory cells that are located between WL2 and with BL2. Similarly, BL4 may be common to two decks of memory cells, namely a third deck of memory cells that are located between BL4 and WL4 and a fourth deck of memory cells that are located between BL4 and WL5.

Cross-sectional side view 703 illustrates various layers of the composite stack 705. For example, cross-sectional side view 703 depicts five (5) first layers 715 (e.g., D1 layers, layer 315 described with reference to FIG. 3A) that each may include a subset of word lines (e.g., WL1), eight (8)

second layers 720 (e.g., DM layers, layer 320 described with reference to FIG. 3A) that each may include a deck of memory cells, and four (4) third layers 725 (e.g., D2 layer, layer 325 described with reference to FIG. 3A).

FIG. 7C also illustrates cross-sectional side views 704 of socket regions of array layers. Cross-sectional side view 704-*a* may correspond to a cross-sectional side view of a word line socket region across an imaginary line AA as shown in the top-down view 700-*a* described with reference to FIG. 7A. Cross-sectional side view 704-*a* may correspond to the composite stack 705 and illustrates five (5) array electrodes 750 (e.g., array electrodes 750-*f*1 through 750-*f*5 at D1 layers, which may be referred to as word lines or access lines of a first type).

Cross-sectional side view 704-*a* also depicts conductive plugs (e.g., conductive plug 796-*c*, conductive plug 796-*d*) that each may be coupled with a conductive element (e.g., conductive element 785-*a*1, conductive element 785-*b*1). Each conductive element may be coupled with a node (e.g., select node, inhibit node) of a layer of circuitry (e.g., a word line select driver, a word line inhibit driver). Cross-sectional side view 704-*a* also depicts eight (8) pairs of gate electrodes (e.g., one pair of gate electrodes at each layer 720) where each gate electrode surrounds a conductive electrode (e.g., conductive plug 796-*c*, conductive plug 796-*d*). As such, cross-sectional side view 704-*a* depicts a total of sixteen (16) vertical TFTs. Further, cross-sectional side view 704-*a* illustrates current paths 745-*a* that the set of TFTs of the word line socket region may activate such that a drive current may flow between the conductive element 785 and the word lines 750 during an access operation.

Similarly, cross-sectional side view 704-*b* may correspond to a cross-sectional side view of a bit line socket region across an imaginary line BB as shown in the top-down view 700-*b* described with reference to FIG. 7A. Cross-sectional side view 704-*b* may also correspond to the composite stack 705 and illustrates four (4) array electrodes 751 (e.g., array electrodes 751-*c*1 through 751-*c*4 at D2 layers, which may be referred to as bit lines or access lines of a second type). Cross-sectional side view 704-*b* also depicts conductive plugs (e.g., conductive plug 796-*e*, conductive plug 796-*f*) that each may be coupled with a conductive element (e.g., conductive element 785-*a*2, conductive element 785-*b*2). Each conductive element may be coupled with a node (e.g., select node, inhibit node) of the layer of circuitry (e.g., a bit line select driver, a bit line inhibit driver). Cross-sectional side view 704-*b* also depicts eight (8) pairs of gate electrodes (e.g., one pair of gate electrodes at each layer 720) where each gate electrode surrounds a conductive electrode (e.g., conductive plug 796-*c*, conductive plug 796-*f*). As such, cross-sectional side view 704-*b* also depicts a total of sixteen (16) vertical TFTs. Further, cross-sectional side view 704-*b* illustrates current paths 745-*b* that the set of TFTs of the bit line socket region may activate such that a drive current may flow between the conductive element 785 and the bit lines 751 during the access operation.

In some cases, a socket region (e.g., word line socket region described with reference to FIG. 7C) of a memory device may include a conductive plug (e.g., conductive plug 796-*c*) that extends through a set of decks of memory cells, and a set of transistors (e.g., eight (8) vertical TFTs in the word line socket region) that each at least partially surround the conductive plug. In some cases, the memory device may include a driver (e.g., a word line select driver) coupled with the conductive plug and configured to be selectively coupled, by a transistor of the set of transistors, with an electrode (e.g., word line 750-*f*1) included in a deck of the set of decks. In some cases, a second socket region (e.g., bit line socket region described with reference to FIG. 7C) of the memory device may include a second conductive plug (e.g., conductive plug 796-*e*) that extends through the set of decks, a second set of transistors (e.g., eight (8) vertical TFTs in the bit line socket region) that each at least partially surround the second conductive plug, and a second driver (e.g., bit line select driver) coupled with the second conductive plug and configured to be selectively coupled, by a transistor of the second set, with a second electrode (e.g., bit line 751-*c*1) included in the deck.

In some cases, the electrode (e.g., word line 750-*f*1) may be at the first layer (e.g., layer 715 of composite stack 705) and the socket region may further include a gate electrode (e.g., gate electrode 760-*a*) for the transistor at a second layer of the deck (e.g., layer 720 of composite stack 705), where the gate electrode at least partially surrounds the conductive plug. In some cases, vertical TFTs of the socket region may be configured to include a gate electrode (e.g., gate electrode 760-*c* described with reference to FIG. 7B) that surrounds a set of conductive plugs (e.g., conductive plugs 796-*f*1 through 796-*f*4 described with reference to FIG. 7B) that extend through the set of decks and are each coupled with the driver (e.g., word line select driver), where the set conductive plugs may include the conductive plug (e.g., conductive plug 796-*c*).

In some cases, the socket region (e.g., word line socket region) may include a third conductive plug (e.g., conductive plug 796-*d*) that extends through the set of decks, and a third set of transistors (e.g., eight (8) TFTs within the word line socket region) that each at least partially surround the third conductive plug. In some cases, the memory device may include a third driver coupled with the third conductive plug and configured to be selectively coupled, by a subset of transistors of the third set, with access lines of the first type included in a subset of decks of the set. In some cases, the socket region (e.g., bit line socket region) may include a fourth conductive plug (e.g., conductive plug 796-*f*) that extends through the set of decks, and a fourth set of transistors (e.g., eight (8) TFTs within the bit line socket region) that each at least partially surround the fourth conductive plug. In some cases, the memory device may include a fourth driver coupled with the fourth conductive plug and configured to be selectively coupled, by a subset of transistors of the fourth set, with access lines of the second type included in a subset of decks of the set.

Figure 7D:
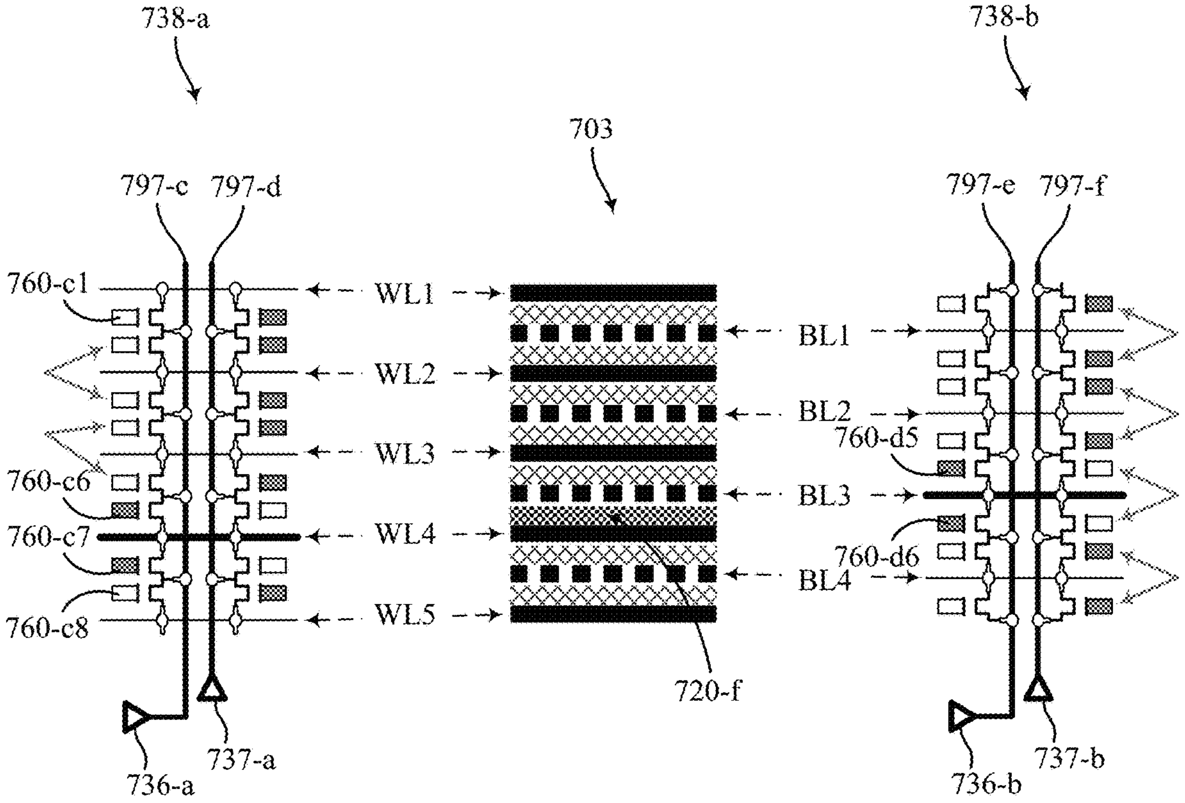

FIG. 7D illustrates circuit diagram 738 along with the schematic cross-sectional side view 703 of array layers described with reference to FIG. 7C. Circuit diagram 738-*a* may correspond to the word line socket region including sixteen (16) TFTs described with reference to the cross-sectional side view 704-*a*. Similarly, circuit diagram 738-*b* may correspond to the bit line socket region including sixteen (16) TFTs described with reference to the cross-sectional side view 704-*b*. Both circuit diagrams 738 depict n-type TFTs for illustration purposes, but the present disclosure is not so limited—e.g., circuit diagrams 738 may include n-type TFTs, p-type TFTs, or any combination thereof. Further, gate of the TFTs in circuit diagrams 738 may indicate whether a TFT is activated or deactivated—e.g., a gate of TFT depicted as a gray rectangle indicating a first gate voltage (e.g., Von) greater than a threshold voltage of the TFT applied to the gate to activate the TFT, a gate of TFT depicted as a white rectangle indicating a second gate voltage (e.g., Voff) less than a threshold voltage of the TFT applied to the gate to deactivate the TFT.

Circuit diagram 738-*a* also depicts common nodes 797 for the TFTs (e.g., node 797-*c* through 797-*f*) that each correspond to a conductive plug 796 described with reference to FIG. 7C, respectively. In some cases, the common node may correspond to a source (or drain) of the TFTs. For example, common node 797-*c* corresponds to conductive plug 796-*c* that is coupled with conductive element 785-*a*1. The conductive element 785-*a*1 may be coupled with a node of a driver (e.g., select node of word line select driver 736-*a*). Similarly, common node 797-*d* corresponds to conductive plug 796-*d* that is coupled with conductive element 785-*b*1. The conductive element 785-*b*1 may be coupled with a node of a driver (e.g., inhibit node of word line inhibit driver 737-*a*). Further, common node 797-*c* corresponds to conductive plug 796-*e* that is coupled with conductive element 785-*a*2. The conductive element 785-*a*2 may be coupled with a node of a driver (e.g., select node of bit line select driver 736-*b*). Similarly, common node 797-*f* corresponds to conductive plug 796-*f* that is coupled with conductive element 785-*b*2. The conductive element 785-*b*2 may be coupled with a node of a driver (e.g., inhibit node of bit line inhibit driver 737-*b*). A person skilled in the art would appreciate that select drivers (e.g., word line select driver 736-*a*, bit line select driver 736-*b*) and inhibit drivers (e.g., word line inhibit driver 737-*a*, bit line inhibit driver 737-*b*) may perform a different function (e.g., word line select driver 736-*a* performing an inhibit function, word line inhibit driver 737-*a* performing a selection function) based on access operations for memory cells or a memory technology (e.g., self-selecting memory, FeRAM, CBRAM).

FIG. 7D illustrate that the TFTs in the word line socket region (e.g., circuit diagram 738-*a*) and the TFTs in the bit line socket region (e.g., circuit diagram 738-*b*) may facilitate an access operation (e.g., read operation, write operation) to a deck of memory cells. For example, an access command may access memory cells at a sixth deck of memory cells (e.g., memory cells located at second layer 720-*f*) that is located between BL3 and WL4 as indicated in the cross-sectional side view 703. Corresponding BL3 and WL4 in circuit diagram 738 are highlighted (e.g., depicted as thickened lines) to indicate which TFTs may be activated.

In some cases, WL4 in circuit diagram 738-*a* may be coupled with a select node of word line select driver 736-*a* by activating the TFT above WL4 (e.g., applying Von to gate electrode 760-*c*6), or the TFT below WL4 (e.g., applying Von to gate electrode 760-*c*7), or both. Similarly, BL3 in circuit diagram 738-*b* may be coupled with a select node of bit line select driver 736-*b* by activating either the TFT above BL3 (e.g., applying Von to gate electrode 760-*d*5), or the TFT below BL3 (e.g., applying Von to gate electrode 760-*d*6), or both. In some cases, a driver (e.g., word line select driver 736-*a*, bit line select driver 736-*b*) may be configured to be selectively coupled with the electrode (e.g., word lines, bit lines) by at least two transistors of the set (e.g., two TFTs in word line socket region, two TFTs in bit line socket region).

Additionally or alternatively, the TFTs coupled with an inhibit node of word line inhibit driver 737-*a* (e.g., TFTs coupled with common node 797-*d*) may be activated or deactivated (e.g., six TFTs are activated and two TFTs are deactivated as depicted in circuit diagram 738-*a*) such that the activated TFTs may couple unselected word lines (e.g., WL1, WL2, WL3, WL5) with the inhibit node of word line inhibit driver 737-*a*. Similarly, the TFTs coupled with an inhibit node of bit line inhibit driver 737-*b* (e.g., TFTs coupled with common node 797-*f*) may be activated or deactivated (e.g., six TFTs are activated and two TFTs are deactivated as depicted in circuit diagram 738-*b*) such that the activated TFTs may couple unselected bit lines (e.g., BL1, BL2, BL4) with the inhibit node of bit line inhibit driver 737-*b*. In this manner, an interference due to unselected word lines or bit lines may be mitigated during the access operation.

In some cases, a pair of gates of TFTs may be configured to electrically connect (e.g., shorted) during decoding of an access command such that two TFTs (instead of one TFT) may provide a larger current drive capability to a selected deck of memory cells. For example, a first subset of access lines (e.g., WL2, WL3, WL4) may be driven by a pair of TFTs instead of a single TFT. Such pairs of TFTs may be located above and below an access line (e.g., word line, bit line) and FIG. 7D illustrates several examples of the pairs of TFTs with double arrows with gray lines. In some cases, some gates of TFTs (e.g., gate electrode 760-*c*1, gate electrode 760-*c*8) may lack a neighboring gate to provide the larger current drive capability. In such cases, a second subset of access lines (e.g., WL1, WL5) may be driven by a single TFT instead of a pair of TFTs. Such a configuration (e.g., electrically connecting two TFTs above and below an access line) may be implemented at a cross-over region as described with reference to FIGS. 10A and 10B.

Figure 8A:
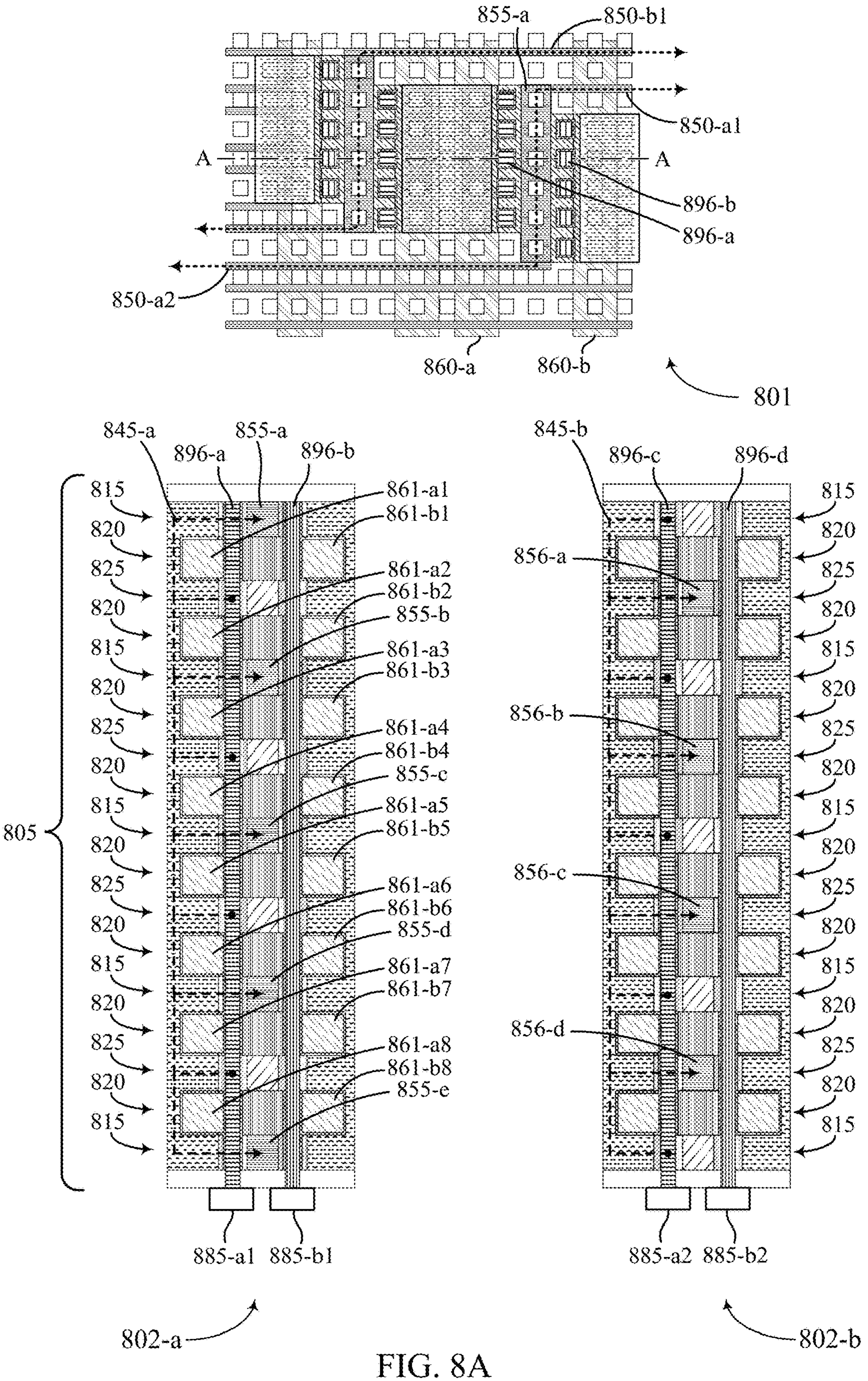
FIGS. 8A-8C illustrate diagrams of exemplary socket regions and decoding schemes that support thin film transistors and related fabrication techniques in accordance with embodiments of the present disclosure.
Figure 8B:
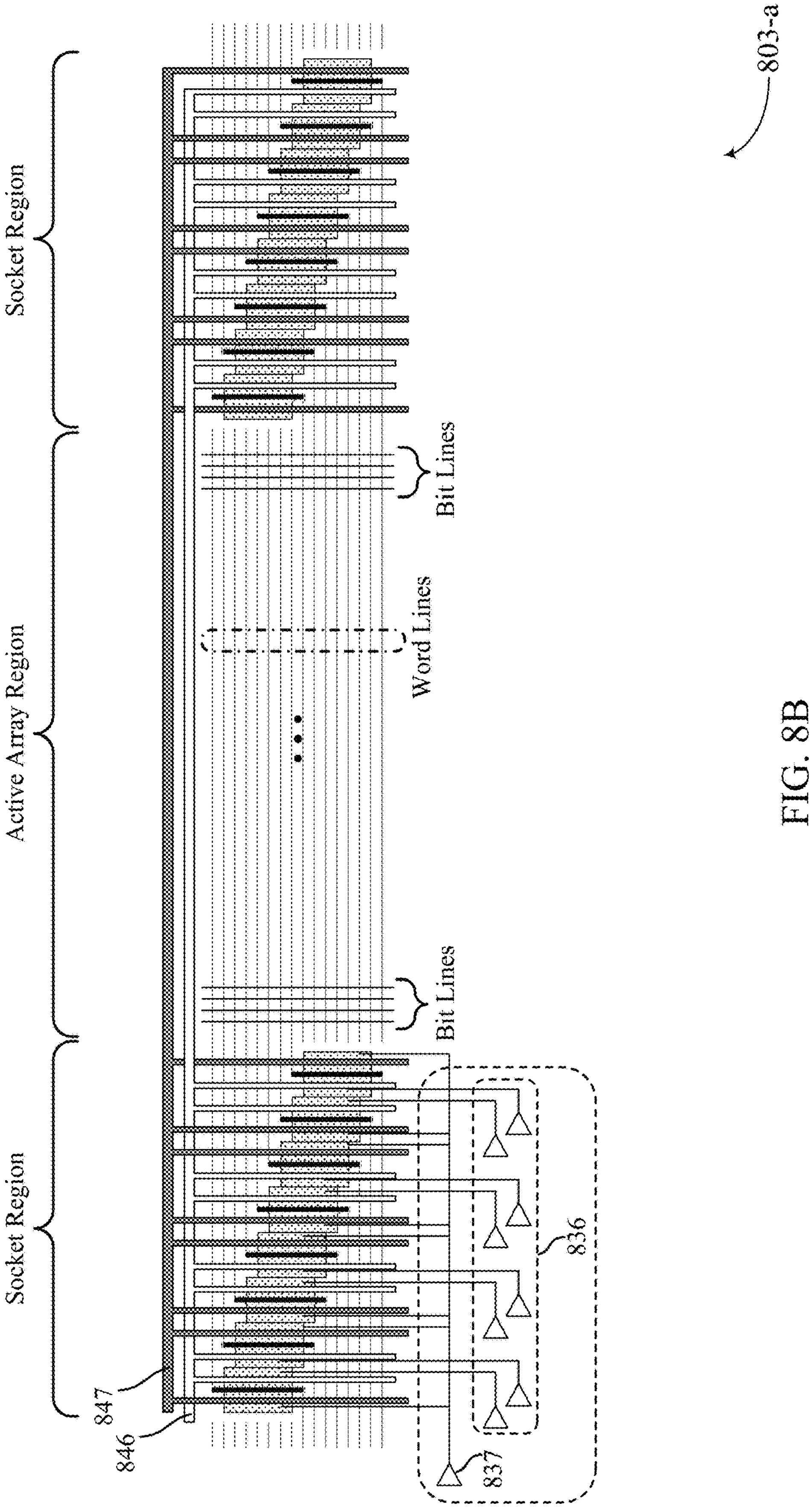
Figure 8C:
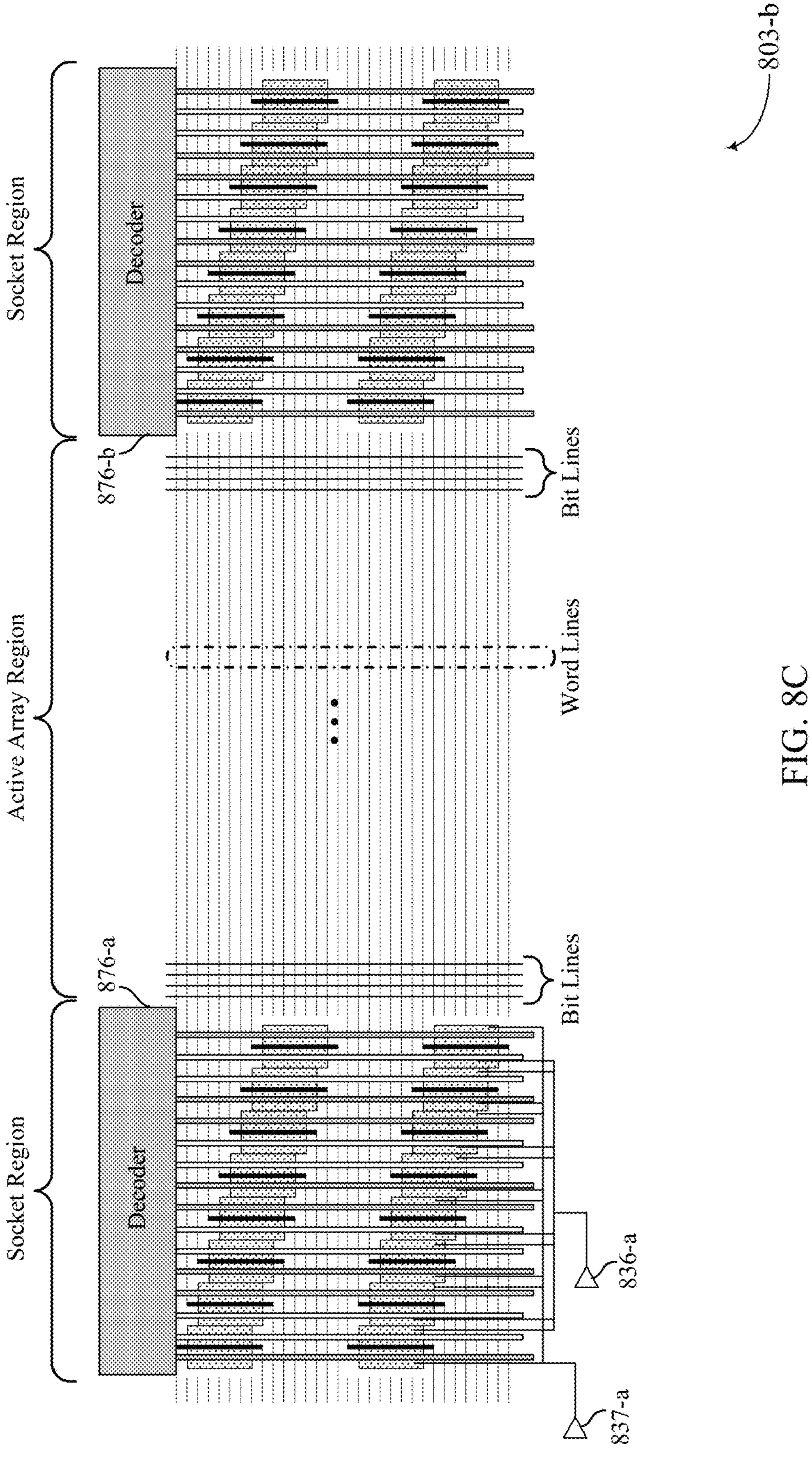

FIGS. 8A-8C illustrate diagrams of exemplary socket regions and decoding schemes that support thin film transistors and related fabrication techniques in accordance with embodiments of the present disclosure. FIGS. 8A-8C describe various aspects of the socket regions where a set of TFTs may be concurrently constructed within a composite stack 805 (e.g., one or more vertically integrated composite stacks 305 as described with reference to FIGS. 3A-3L) as described herein. FIGS. 8A-8C include top-down views of a portion of the socket regions (e.g., a layout of the socket region) to illustrate that subsets of the set of TFTs may be configured to couple with subsets of array electrodes (e.g., access lines, word lines, bit lines) of the active array region where memory cells are located.

Additionally, FIGS. 8A-8C include cross-sectional side views of different portions of socket regions to illustrate that the set of TFTs may couple the array electrodes with a layer of circuitry (e.g., row decoder 120 constructed in a substrate 204). In some cases, the layer of circuitry may be a part of a substrate above which the array layers are located. Further, the set of TFTs described in FIGS. 8A-8C may operate in accordance with the circuit representations of the set of TFTs described with reference to FIGS. 7A-7D during an access operation. FIGS. 8A-8C depicts the socket regions including a set of wrap-around TFTs as an illustrative example, but the present disclosure is not so limited—e.g., the socket regions may include other kinds of TFTs or any combinations thereof as described herein. Aspects of fabrication techniques and operation of wrap-around TFTs are described in FIGS. 5A through 5N.

FIG. 8A illustrates a top-down view 801 of a socket region including two sets of wrap-around TFTs. Top-down view 801 may be a portion of a word line socket region including array electrodes (e.g., electrode 850-*a* in D1 layers of the composite stack 805) that may correspond to a word line. Additionally, top-down view 801 depicts a first conductive plug 896-*a* and a second conductive plug 896-*b*. In some cases, the first conductive plug may be coupled with a first node of a first driver (e.g., select node of word line select driver) and the second conductive plug may be coupled with a second node of a second driver (e.g., inhibit node of word line select driver). Top-down view 801 also depicts gate electrodes 860 at the second layer of the composite stack 805 (e.g., gate electrode 860-*a* that includes electrode material 861-*a*, gate electrode 860-*b* that includes electrode material 861-*b*).

In some cases, an electrode (e.g., electrode 850-*a*) may include a first portion (e.g., electrode tab 855-*a*) that extends between the conductive plug (e.g., conductive plug 896-*a*) and the second conductive plug (e.g., conductive plug 896-*b*) in a first direction, a second portion (e.g., electrode 850-*a*1) coupled with an end of the first portion that extends in a second direction, and a third portion (e.g., electrode 850-*a*2) coupled with a second end of the first portion that extends in the second direction. In some cases, the first portion (e.g., electrode tab 855-*a*) may be wider than the second portion (e.g., electrode 850-*a*1) and the third portion (e.g., electrode 850-*a*2).

FIG. 8A also illustrates cross-sectional side views 802 of socket regions of array layers. Cross-sectional side view 802-*a* may correspond to a cross-sectional side view of a word line socket region across an imaginary line AA as shown in the top-down view 801. Cross-sectional side view 802-*a* omits dielectric plugs for clarity—e.g., dielectric plug in between conductive plug 896-*a* and conductive plug 896-*b*, dielectric plugs that are surrounded by gate electrodes. Cross-sectional side view 802-*a* illustrates the composite stack 805 that includes five (5) array electrodes (e.g., word lines, array electrodes that includes electrode tabs 855 at layer 815).

Cross-sectional side view 802-*a* also depicts conductive plugs (e.g., conductive plug 896-*a*) that each may be coupled with a conductive element (e.g., conductive elements 885-*a*1). The conductive plugs may function as a common node (e.g., source or drain) for the set of TFTs. Each conductive element may be coupled with a node (e.g., select node, inhibit node) of a layer of circuitry (e.g., a word line select driver, a word line inhibit driver). Cross-sectional side view 802-*a* also depicts eight (8) pairs of gate electrodes (e.g., one pair of gate electrodes at each layer 820). As such, cross-sectional side view 802-*a* depicts a total of sixteen (16) wrap-around TFTs. Further, cross-sectional side view 802-*a* illustrates current paths 845-*a* that the set of TFTs of the word line socket region may activate such that a drive current may flow between the conductive element 885 and the word lines 850 during an access operation.

Similarly, cross-sectional side view 802-*b* may correspond to a cross-sectional side view of a bit line socket region. A top-down view of the bit-line socket region may be identical to the top-down view 801 depicting the word line socket region except that the top-down view of the bit-line socket region may be approximately 90-degree rotated with respect to the top-down view 801 depicting the word line socket region 801 because bit lines may extend in a direction that may be substantially orthogonal to word lines. Cross-sectional side view 802-*b* may also correspond to the composite stack 805 and illustrates four (4) array electrodes (e.g., bit lines, array electrodes that includes electrode tabs 856 at layer 825).

Cross-sectional side view 802-*b* also depicts conductive plugs (e.g., conductive plug 896-*c*) that each may be coupled with a conductive element (e.g., conductive elements 885-*a*2). Each conductive element may be coupled with a node (e.g., select node, inhibit node) of the layer of circuitry (e.g., a bit line select driver, a bit line inhibit driver). Cross-sectional side view 802-*b* also depicts eight (8) pairs of gate electrodes (e.g., one pair of gate electrodes at each layer 720). As such, cross-sectional side view 802-*b* also depicts a total of sixteen (16) wrap-around TFTs. Further, cross-sectional side view 802-*b* illustrates current paths 845-*b* that the set of TFTs of the bit line socket region may activate such that a drive current may flow between the conductive element 885 and the bit lines 851 (e.g., bit lines including electrode 856 at layer 825) during the access operation.

In some cases, a socket region (e.g., word line socket region described with reference to FIG. 8A) of a memory device may include a conductive plug (e.g., conductive plug 896-*a*) that extends through a set of decks of memory cells, and a set of transistors (e.g., wrap-around TFTs that may be coupled with a select node) that each has a source or a drain in contact with the conductive plug. In some cases, the memory device may include a driver (e.g., word line select driver) coupled with the conductive plug and configured to be selectively coupled, by a transistor of the set of transistors, with an electrode (e.g., word line 850) included in a deck of the set of decks.

In some cases, the socket region may include a second conductive plug (e.g., conductive plug 896-*b*), that extends through the set of decks, and a second set of transistors (e.g., wrap-around TFTs that may be coupled with an inhibit node) that each has a source or a drain in contact with the conductive plug. In some cases, the memory device may include a second driver (e.g., word line inhibit driver) coupled with the second conductive plug and configured to be selectively coupled, by a subset of transistors of the second set, with access lines of the first type included in a subset of decks of the set of decks.

In some cases, the socket region may include a first set of gate electrodes (e.g., gate electrode 860-*a*) for the set of transistors (e.g., wrap-around TFTs that may be coupled with the select node) and a second set of gate electrodes (e.g., gate electrode 860-*b*) for the second set of transistors (e.g., wrap-around TFTs that may be coupled with the inhibit node), where the conductive plug (e.g., conductive plug 896-*a*) and the second conductive plug (e.g., conductive plug 896-*b*) may be between the first set of gate electrodes (e.g., gate electrode 860-*a*) and the second set of gate electrodes (e.g., gate electrode 860-*b*).

FIG. 8B illustrates a diagram 803-*a* of array layers including an active array region and two socket regions (e.g., word line socket regions) that each include a set of TFTs. Diagram 803-*a* depicts some aspects of top-down views of the array layers such as access lines and structural features of the set of TFTs, with other aspects omitted for visual clarity. In some cases, the active array region may include a set of decks of memory cells constructed within the composite stack 805. As described herein, the set of TFTs may also be constructed in socket regions of the composite stack 805. In some cases, the set of TFTs may include wrap-around TFTs as described with reference to FIGS. 5A-5N. Word lines (e.g., electrodes for word lines) depicted in the diagram 803-*a* are jogged (e.g., each word line is associated with a wider portion that is shorter than a narrower portion extending into the active array region as described with reference to FIGS. 5A and 8A) to create spaces for the wrap-around TFT construction. For example, the wider portion of a word line expands over eight (8) word lines—e.g., group of eight (8) configuration. In some cases, the TFTs may be located approximately at the center of word line (e.g., center-tapped array electrodes).

Diagram 803-*a* includes sixteen (16) word lines as an example and thus sixteen (16) sets of wrap-around TFTs, namely eight (8) on one side of the active array region and another eight (8) on the opposite side. Further, diagram 803-*a* depicts an inhibit driver 837 (which may be an example of word line inhibit driver 737) that may be a word line inhibit driver. In some cases, the inhibit driver 837 may be common to the eight (8) sets of wrap-around TFTs. In other cases, each set of wrap-around TFT may be coupled with separate inhibit drivers, respectively. Diagram 803-*a* also depicts a group of eight (8) select drivers 836 (which may be examples of word line select driver 736). Each select driver may be a word line select driver coupled with one of eight (8) sets of wrap-around TFTs. In some cases, the inhibit driver 837 and the group of eight (8) select drivers 836 may be located below (or above) the set of decks of memory cells. In some cases, inhibit drivers (e.g., inhibit driver 837) and select drivers (e.g., select driver 736) may perform a different function (e.g., inhibit driver 837 performing a selection function, select driver 736 performing an inhibit function) based on access operations for memory cells or a memory technology (e.g., self-selecting memory, FeRAM, CBRAM).

Diagram 803-*a* also includes common deck-select line 846 and common deck-inhibit line 847 that may control gate electrodes of the wrap-around TFTs (e.g., gate electrodes 860 at layers 820 within the composite stack 805). Common deck-select line 846 may be configured to couple (e.g., short) all gate electrodes for the wrap-around TFTs that are associated with the select signal (e.g., wrap-around TFTs configured to couple with the select node of word line select driver) for the deck. Further, common deck-select line 846 may be coupled with a first common gate driver that is located below (or above) the set of decks of memory cells. Similarly, common deck-inhibit line 847 may be configured to couple (e.g., short) all gate electrodes for the wrap-around TFTs that are associated with the inhibit signal (e.g., wrap-around TFTs configured to couple with the inhibit node of word line inhibit driver) for the deck. Further, common deck-inhibit line 847 may be coupled with a second common gate driver that is located below (or above) the set of decks of memory cells. In some cases, the common gate drivers (which may be referred to as a deck select driver) may be located in a location different than socket regions. In some cases, the common gate drivers may be shared among a set of socket regions, where a portion of a memory array includes the set of socket regions and one or more active array regions. In some cases, the socket region may include a set of gate electrodes (e.g., gate electrodes 860) included in the deck and coupled with one another (e.g., common deck-select line 846, common deck-inhibit line 847) and with a common gate driver that is below (or above) the set of decks of memory cells. In some cases, the set of gate electrodes includes a gate electrode for the transistor (e.g., wrap-around TFTs in the socket region).

FIG. 8C illustrates diagram 803-*b* of array layers including an active array region and two socket regions (e.g., word line socket regions) that each include a set of TFTs. Diagram 804-*b* depicts some aspects of a top-down view of the array layers such as access lines and structural features of the set of TFTs (e.g., wrap-around TFTs). Diagram 803-*b* includes word line select driver 836-*a* (which may be an example of word line select driver 736-*a*) and word line inhibit driver 837-*a* (which may be an example of word line inhibit driver 737-*a*). Additionally, diagram 803-*b* depicts decoder circuitry 876. In some cases, word line select driver 836-*a*, word line inhibit driver 837-*a*, and decoder circuitry 876 may be located below (or above) the set of decks of memory cells. Diagram 803-*b* may depict an alternative configuration for controlling the gate electrodes of the wrap-around TFTs (e.g., gate electrodes 860 at layer 820 within the composite stack 805) in comparison to diagram 803-*a*. For example, instead of coupling all gate electrodes for the wrap-around TFTs (e.g., using common deck-select line 846 and common deck-inhibit line 847 described with reference to diagram 803-*a*), decoder circuitry 876 may be configured to decode control signals for each gate electrode. In the example depicted in diagram 803-*b*, each of the sixty-four (64) TFTs in both socket regions may be coupled with a driver for the gate electrode. In some cases, a memory device including the socket region may include decoder circuitry below the set of decks and configured to activate the transistor based on selecting a gate electrode for the transistor from a set of gate electrodes included in the deck.

Figure 9:
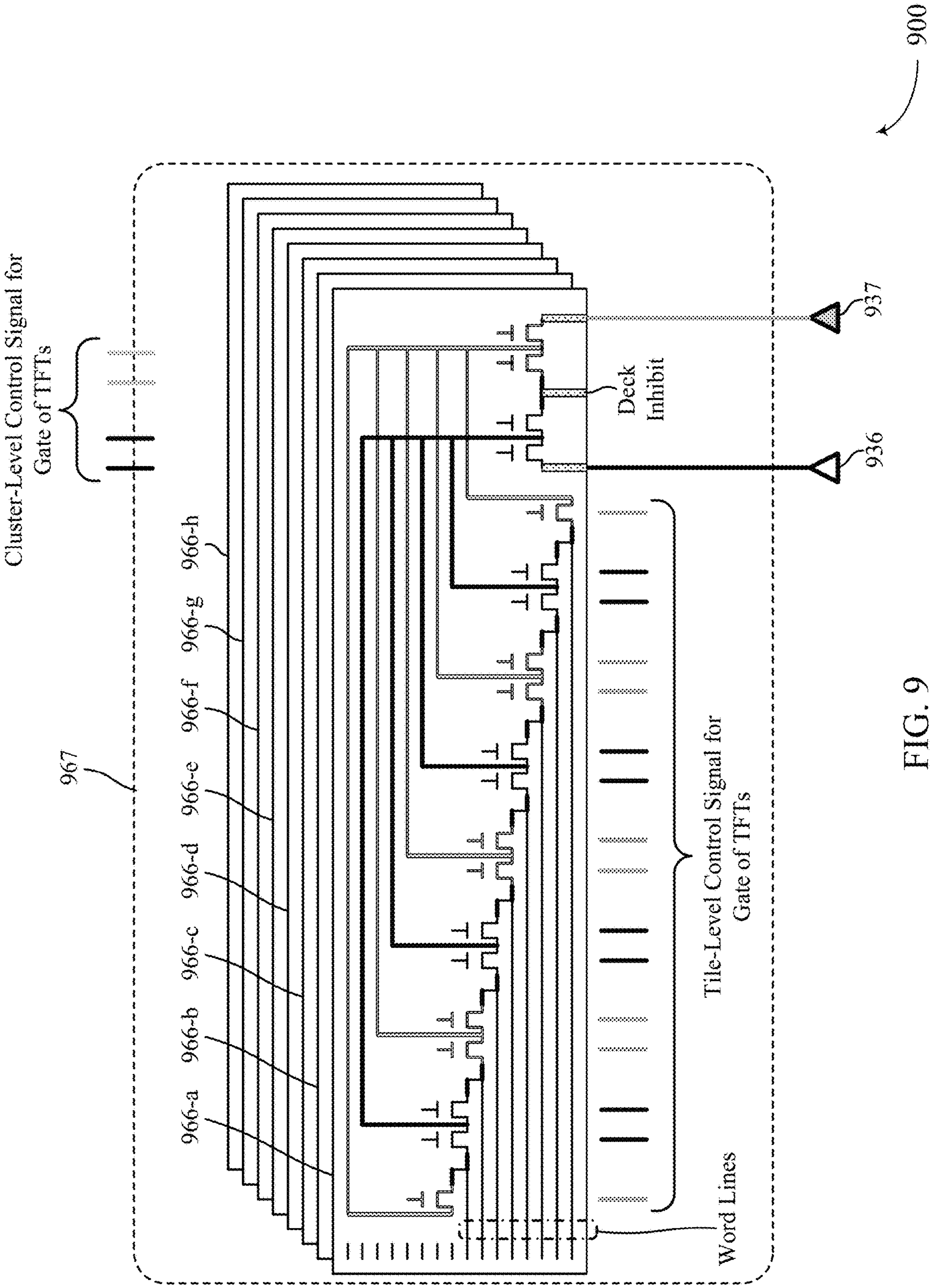
FIG. 9 illustrates a diagram of exemplary decoding scheme that supports thin film transistors and related fabrication techniques in accordance with embodiments of the present disclosure.

FIG. 9 illustrates a diagram 900 of exemplary decoding scheme that supports thin film transistors and related fabrication techniques in accordance with embodiments of the present disclosure. TFT-based decoder circuitry depicted in diagram 900 may be constructed within a composite stack (e.g., composite stack 305, composite stack 705, composite stack 805). Such decoder circuitry constructed within a composite stack may perform at least a part of decoding functions that may otherwise be performed by a layer of logic circuitry. For example, the decoder circuitry may perform additional functions than selecting a deck out of a set of decks of memory cells. In some cases, the layer of logic circuitry may be located within a substrate over which the set of decks of memory cells may be constructed. In this manner, the logic circuitry within the substrate may be simplified to reduce an area corresponding to the logic circuitry or may support additional decks of memory arrays.

Diagram 900 depicts decoder circuitry that may include planar TFTs for illustration purposes, but the present disclosure is not so limited—e.g., the decoder circuitry within a composite stack may include other types of TFTs as described herein, or any combinations thereof. FIGS. 4A-4AA describes aspects of fabrication techniques and operation of planar TFTs. Further, diagram 900 depicts a single-ended driver scheme—e.g., TFTs providing a drive current to an access line (e.g., word line) located at one end of the access line. A person skilled in the art would appreciate a different driver scheme (e.g., TFTs providing the drive current located between two ends of the access line) or a more complex driver circuitry may be used without losing any functionality.

Diagram 900 depicts a cluster of decks located on top of each other (e.g., cluster 967 that includes eight (8) decks, namely deck 966-*a* through deck 966-*h*), where each deck may include one or more tiles. Diagram 900 depicts a set of TFTs to perform a decoding function within a tile—e.g., activating an access line (e.g., word line) from a set of access lines (e.g., eight (8) word lines) within the tile. In a context of decoder circuitry described herein, a cluster may refer to a group of tiles and a tile may refer to a unit of array decoding. Further, diagram 900 depicts select driver 936 (which may be an example of word line select driver 736-*a*) and inhibit driver 937 (which may be an example of word line inhibit driver 737-*a*). In some cases, select driver 936 and inhibit driver 937 may be located within the layer of logic circuitry.

In some cases, electrode layers (e.g., layers including access lines such as word lines and bit lines) within a deck (e.g., deck 966-*a* through deck 966-*h*) may include a first set of TFTs providing control signals for gates of a second set of TFTs (e.g., pairs of TFTs coupled with word lines as shown in FIG. 9), where sources or drains of the first set of TFTs may be coupled with a third set of TFTs that may be constructed at the electrode layers within the deck.

For example, the diagram 900 depicts that the decoder circuitry may perform one of eight (8) decoding within a tile within a deck 966 (e.g., deck 966-*a* through deck 966-*h*)— e.g., one of eight TFT pairs (e.g., two TFTs in series configuration) may be activated to activate one of eight access lines (e.g., word lines) within the tile. Further, diagram 900 depicts that the decoder circuitry may perform one of sixty-four (64) decoding in conjunction with a deck level decoder that may perform deck level decoding—e.g., the deck level decoder may select (or activate) one of eight decks (e.g., one of deck 966-*a* through deck 966-*h*) within the cluster 967.

Figure 10A:
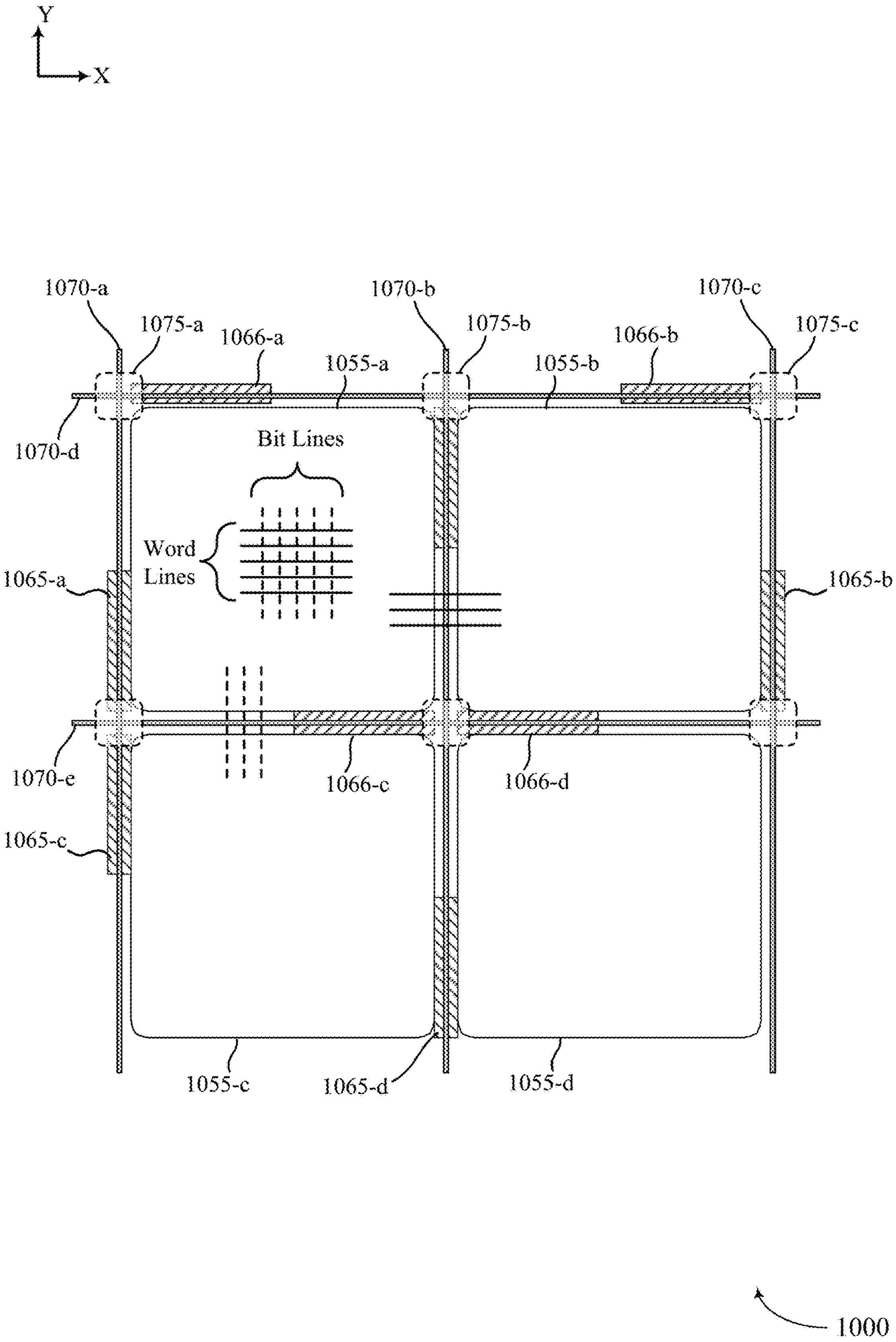
FIGS. 10A and 10B illustrate diagrams of exemplary cross-over regions that support thin film transistors and related fabrication techniques in accordance with embodiments of the present disclosure.
Figure 10B:
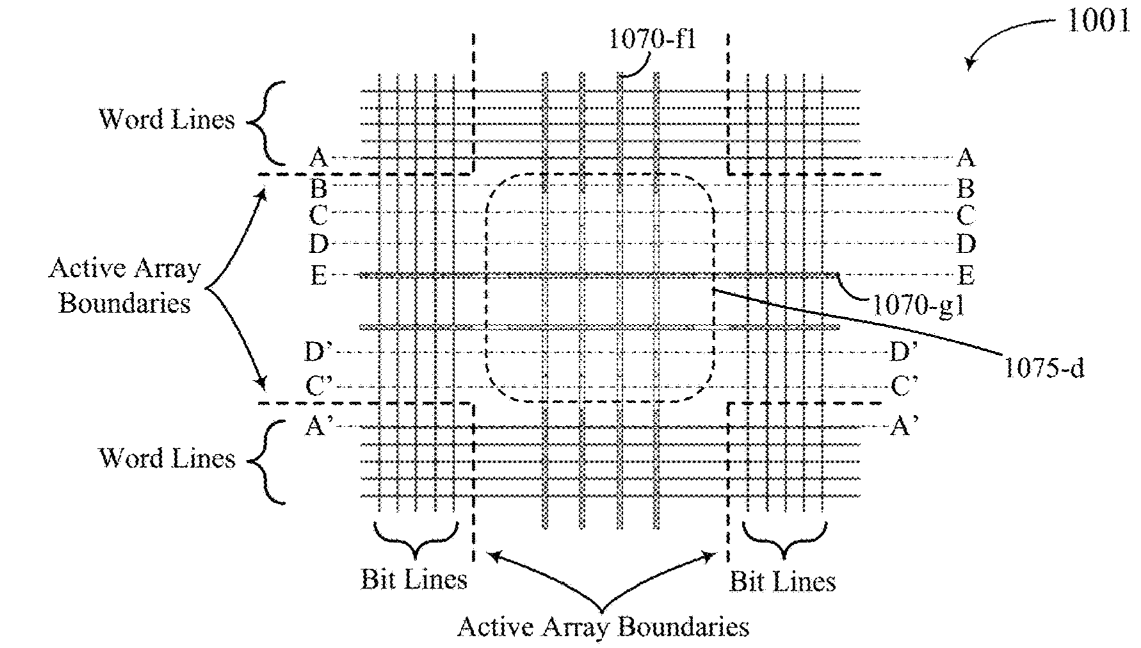

FIGS. 10A and 10B illustrate diagrams of exemplary cross-over regions that support thin film transistors and related fabrication techniques in accordance with embodiments of the present disclosure.

FIG. 10A illustrates a diagram 1000 depicting a top-down view of array layers that includes active array regions (e.g., active array 1055-*a* through active array 1055-*d*) and socket regions (e.g., socket regions 1065, socket regions 1066) where sets of TFTs may be constructed as described herein. Diagram 1000 may include some aspects of an example of memory device 100 described with reference to FIG. 1. In some cases, diagram 1000 may be a portion of a 3D memory device that includes two or more decks of memory cells constructed within a composite stack 1005 (which may be an example of composite stack 705 described with reference to FIG. 7C) as depicted in FIG. 10B. In some examples, diagram 1000 may be an example of the quilt architecture as described herein. The sets of TFTs may be constructed within the composite stack 1005 and may include vertical TFTs constructed in described with reference to FIGS. 3A-3L, planar TFTs described with reference to FIGS. 4A-4AA, wrap-around TFTs described with reference to FIGS. 5A-5N, or hybrid TFTs described with reference to FIGS. 6A-6R, or any combinations thereof.

Further, diagram 1000 depicts that active arrays 1055 may include a first set of access lines of a first type (e.g., word lines) extending in a first direction and a second set of access lines of a second type (e.g., bit lines) extending in a second direction that may be substantially orthogonal to the first direction. The first set of access lines may be located at first layers (e.g., D1 layers, layers 1015 described with reference to FIG. 10B) of the composite stack 1005. Similarly, the second set of access lines may be located at third layers (e.g., D2 layers, layers 1025 described with reference to FIG. 10B) of the composite stack 1005. Diagram 1000 depicts that the first set of access lines (e.g., word lines) may cross boundaries of active arrays (e.g., boundaries of active array 1055-*a* and active array 1055-*b*). Similarly, the second set of access lines (e.g., bit lines) may cross boundaries of active arrays (e.g., boundaries of active array 1055-*a* and active array 1055-*c*).

Additionally, TFTs in socket regions 1065 may be configured to couple with the first set of access lines (e.g., word lines) and TFTs in socket regions 1066 may be configured to couple with the second set of access lines (e.g., bit lines). In this manner, TFTs in socket regions 1065 (e.g., word line sockets) may couple a node (e.g., select node, inhibit node) of a layer of circuitry with one or more word lines of active arrays 1055. Similarly, TFTs in socket regions 1066 (e.g., bit line sockets) may couple a node (e.g., select node, inhibit node) of the layer of circuitry with one or more bit lines of active arrays 1055.

Further, deck-select lines 1070 may be defined in the socket regions (e.g., socket regions 1065, socket regions 1066) at the second layers (e.g., DM layers, layers 1020 described with reference to FIG. 10B) of the composite stack 1005. In some cases, the deck-select lines 1070 may be coupled with gate electrodes of the TFTs that are also constructed at the second layer (e.g., DM layers, layers 1020) as described herein for various kinds of TFTs. As such, the deck-select lines 1070 may be coupled with the gate electrodes of the TFTs and may be referred to as control lines for gates of TFTs within the socket regions.

The deck-select lines 1070 for both sets of access lines (e.g., word lines and bit lines) may be constructed at the second layers (e.g., DM layers, layers 1020 of composite stack 1005) and cross-over regions 1075 may be defined so as to avoid shorting of the deck-select lines 1070 where two deck-select lines may cross (e.g., cross-over region 1075-*a* where deck-select line 1070-*a* crosses deck-select line 1070-*d*, cross-over region 1075-*b* where deck-select line 1070-*b* crosses deck-select line 1070-*d*). Such cross-over regions may be located at various locations based on a configuration of active array arrangement (e.g., quilt architecture). As an example, diagram 1000 depicts the cross-over regions at the corners of active arrays 1055.

FIG. 10B illustrates a diagram 1001 depicting an enlarged top-down view of the cross-over region and a diagram 1002 depicting cross-sectional side views of the cross-over region across various locations within the cross-over region. Diagram 1001 includes a cross-over region 1075-*d* where a first set of deck-select lines (e.g., deck-select lines including deck-select line 1070-*f*1) may cross a second set of deck-select lines (e.g., deck-select lines including deck-select line 1070-*g*1). The first set of deck-select lines may be associated with the word line sockets (e.g., socket regions 1065) and may be control lines for gates of TFTs within the word line sockets (e.g., TFTs configured to couple with word lines). Similarly, the second set of deck-select lines may be associated with the bit line sockets (e.g., socket regions 1066) and may be control lines for gates of TFTs within the bit line sockets (e.g., TFTs configured to couple with bit lines).

FIG. 10B also illustrates diagram 1002 depicting cross-sectional side views of a deck-select line (e.g., deck-select line 1070-*f*1) across imaginary lines as shown in diagram 1001—e.g., imaginary line AA through imaginary line EE for the deck-select line 1070-*f*1 transitioning into the cross-over region 1075-*d*. Diagram 1002 depicts composite stack 1005 that includes first layers (e.g., D1 layers, layers 1015), second layers (e.g., DM layers, layers 1020), and third layers (e.g., D2 layers, layers 1025).

Cross-sectional diagram 1002-*a* across imaginary line AA depicts array electrodes 1050 constructed at D1 layers (e.g., layers 1015). The imaginary line AA corresponds to a word line and array electrodes 1050 depicted in cross-sectional diagram 1002-*a* may be coupled with the word line. Cross-sectional diagram 1002-*a* also depicts gate electrodes (e.g., gate electrodes including electrode material 1061) constructed at DM layers (e.g., layers 1020). Gate electrodes depicted in cross-sectional diagram 1002-*a* may be part of deck-select line 1070-*f*1 (e.g., control lines for gates of TFTs within the word line socket region 1065).

Cross-sectional diagram 1002-*b* across imaginary line BB depicts similar structures of cross-sectional diagram 1002-*a* except that array electrodes 1050 are absent because a first portion of the cross-over region that includes the imaginary line BB is away from the word line depicted in cross-sectional diagram 1002-*a*.

Cross-sectional diagram 1002-*c* across imaginary line CC depicts that the gate electrodes (e.g., gate electrodes including electrode material 1061) may be constructed across both D1 layers (e.g., layers 1015) and DM layers (e.g., layers 1020) in a second portion of the cross-over region that includes the imaginary line CC—e.g., electrode material 1061 spans D1 layer and DM layer. In this manner, a pair of inner gate electrodes (e.g., electrode corresponding to electrode material 1061-*b* and electrode corresponding to electrode material 1061-*c*) may be connected (e.g., electrically shorted) as indicated with gray arrows.

Cross-sectional diagram 1002-*d* across imaginary line DD depicts that the gate electrodes (e.g., gate electrodes including electrode material 1061) may be constructed at D1 layers (e.g., layers 1015) in a third portion of the cross-over region that includes the imaginary line DD. In this manner, gate electrodes (e.g., control lines for gates of TFTs within the word line socket region 1065) may be converted from gate electrodes at eight (8) DM layers (e.g., layers 1020) to gate electrodes at five (5) D1 layers (e.g., layers 1015) while transitioning from the first portion of the cross-over region to the third portion of the cross-over region. As described herein, pairs of inner electrodes may be electrically connected during the transition. The pairs of inner gate electrodes may correspond to the pairs of gates for TFTs as described with reference to circuit diagram 738-*a* of FIG. 7D (e.g., pairs of gates denoted with gray arrows).

Similarly, deck-select line 1070-*g*1 (e.g., control lines for gates of TFTs within the bit line socket regions 1066) may be constructed to have different structural configurations through different portions of the cross-over region 1075-*d*. In this manner, gate electrodes (e.g., control lines for gates of TFTs within the bit line socket region 1066) may be converted from gate electrodes at eight (8) DM layers (e.g., layers 1020) to gate electrodes at four (4) D2 layers (e.g., layers 1025) within the cross-over region 1075-*d*—e.g., for the deck-select line 1070-*g*1 transitioning into the cross-over region 1075-*d* in an orthogonal direction with respect to the imaginary lines AA through EE. During the transition, pairs of inner gate electrodes may be electrically connected because electrode material 1062 of the gate electrodes may be constructed across both DM layers (e.g., layers 1020) and D2 layers (e.g., layers 1025)—e.g., electrode material 1062 spans DM layer and D2 layer at a portion of the cross-over region 1075-*d* that corresponds the second portion of the cross-over region including the imaginary line CC for the deck-select line 1070-*f*1. The pairs of inner gate electrodes may correspond to the pairs of gates for TFTs as described with reference to circuit diagram 738-*b* of FIG. 7D (e.g., pairs of gates denoted with gray arrows).

In this manner, cross-sectional diagram 1002-*e* across imaginary line EE depicts that the gate electrodes (e.g., gate electrodes including electrode material 1061-*a*, electrode material 1061-*i*, electrode material 1061-*j*, electrode material 1061-*k*, electrode material 1061-*h*) for the deck-select line 1070-*f*1 may be constructed at layers 1015 and the gate electrodes (e.g., gate electrodes including electrode material 1062-*a*, electrode material 1062-*b*, electrode material 1062-*c*, electrode material 1062-*d*) for the deck-select line 1070-*g*1 may be constructed at layers 1025. As such, the deck-select line 1070-*f*1 and the deck-select line 1070-*g*1 may cross without electrically shorting each other.

The cross-sectional diagrams of diagram 1002 may also represent cross-sectional side views for the deck-select line 1070-*f*1 transitioning out of the cross-over region 1075-*d*. In other words, cross-sectional diagram 1002-*d* across imaginary line DD may be identical to a cross-sectional diagram across imaginary line D'D'. Similarly, cross-sectional diagram 1002-*c* across imaginary line CC may be identical to a cross-sectional diagram across imaginary line C'C'. Further, cross-sectional diagram across imaginary line A'A' is identical to a cross-sectional diagram 1002-*a* across imaginary line AA.

In some cases, a memory device (e.g., memory device 100 described with reference to FIG. 1, 3D memory device) may include a set of decks of memory cells that each include a first layer (e.g., D1 layer), a second layer (e.g., DM layer), a third layer (e.g., D2 layer), and a set of memory arrays, a set of first electrodes extending in a first direction, a set of second electrodes extending in a second direction that intersects the first direction. In some cases, within a region (e.g., cross-over regions 1075) between memory arrays of the set of memory arrays, each first electrode of the set of first electrodes includes a first portion at the second layer, a second portion at the first layer, and a third portion at the second layer, and each second electrode of the set of second electrodes includes a first portion at the second layer, a second portion at the third layer, and a third portion at the second layer.

In some cases, each first electrode of the set of first electrodes further includes, within the region, a fourth portion that spans at least the second layer and the first layer, and each second electrode of the set of second electrodes further includes, within the region, a fourth portion that spans at least the second layer and the third layer. In some cases, the fourth portion of at least two first electrodes of the set of first electrodes may be common to the at least two first electrodes, and the fourth portion of at least two second electrodes of the set of second electrodes may be common to the at least two second electrodes.

In some cases, each first electrode of the set of first electrodes further includes, within the region, a fifth portion that spans at least the first layer and the second layer, and each second electrode of the set of second electrodes further includes, within the region, a fifth portion that spans at least two of the third layer and the second layer. In some cases, at least a subset of the first electrodes of the set of first electrodes may be coupled together within the region, and at least a subset of the second electrodes of the set of second electrodes may be coupled together within the region.

In some cases, the memory device may include a first set of transistors within the memory arrays of the set and configured to select access lines of a first type, where the first electrodes of the set may be coupled with gates of the first set of transistors. In some cases, the memory device may include a second set of transistors within the memory arrays of the set and configured to select access lines of a second type, where the second electrodes of the set may be coupled with gates of the second set of transistors. In some cases, the first set of transistors and the second set of transistors may be within the decks of the set.

Figure 10B:
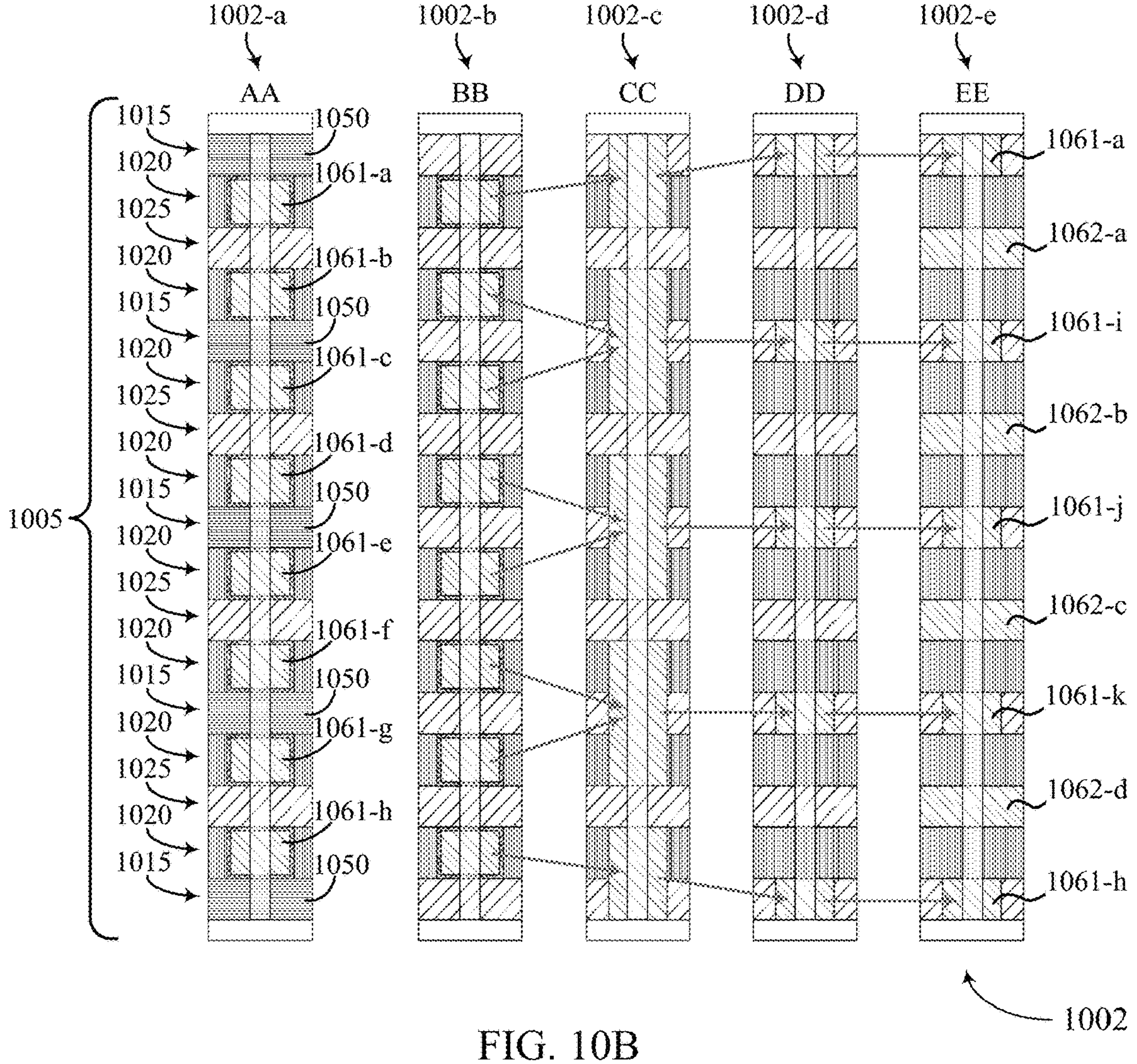
Figure 11:
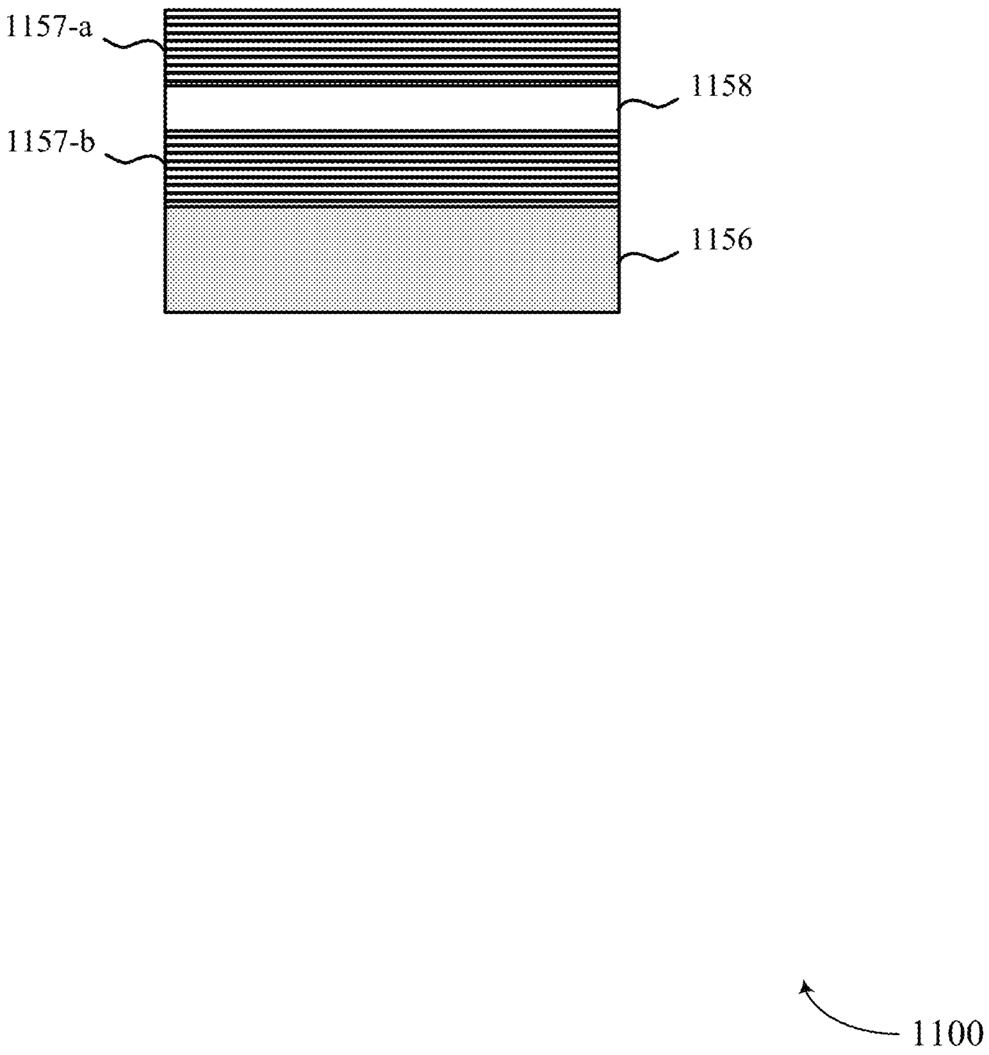
FIG. 11 illustrates a diagram of exemplary memory device that supports thin film transistors and related fabrication techniques in accordance with embodiments of the present disclosure.

FIG. 11 illustrates a diagram 1100 of exemplary memory device that supports thin film transistors and related fabrication techniques in accordance with embodiments of the present disclosure. In some cases, the memory device may include two or more decks of memory cells as described with reference to FIGS. 1 and 2. Diagram 1100 include a substrate 1156, one or more sets of array layers 1157 that each include an active array region and a socket region, and a layer of TFT circuit 1158. The substrate 1156 may be an example of a substrate 204 as described with reference to FIG. 2. In some cases, the substrate 1156 may include a layer of logic circuitry. Array layers 1157 may be an example of array layers described with reference to FIGS. 7, 8, and 10. The array layers 1157 may include a composite stack (e.g., composite stack 705 described with reference to FIG. 7C, composite stack 805 described with reference to FIG. 8A, composite stack 1005 described with reference to FIG. 10B). Further, array layers 1157 may include a set of decks of memory cells in an active array region as well as socket regions where a set of TFTs are located. In some cases, each array layer (e.g., array layer 1157-*a*, array layer 1157-*b*) may include a quantity of decks of memory cells (e.g., eight (8) decks, sixteen (16) decks, thirty-two (32) decks, sixty-four (64) decks). The set of TFT may include vertical TFTs, planar TFTs, wrap-around TFTs, or hybrid TFTs, or any combinations thereof. The layer of TFT circuit 1158 may be an example of TFT-based decoder circuitry described with reference to FIG. 9.

In some cases, a memory device may include a memory array including a set of electrodes at a first layer (e.g., first layer 715 described with reference to FIG. 7C) and a set of memory cells at a second layer (e.g., second layer 720 described with reference to FIG. 7C). The memory device may also include a set of transistors configured to select electrodes from the set of electrodes, the set of transistors each including a gate electrode at the second layer, a semiconductor material at the first layer. In some cases, the memory array may be at a first deck (e.g., a first deck of memory cells of array layer 1157-*a*) of the memory device. In some cases, the memory device may also include a second deck (e.g., a second deck of memory cells of array layer 1157-*b*), where the second deck may include a second memory array including a second set of electrodes at a first layer of the second deck and a second set of memory cells at a second layer of the second deck, and a second set of transistors configured to select electrodes from the second set of electrodes, the second set of transistors each including gate electrode at the second layer of the second deck and a semiconductor material at the first layer of the second deck.

In some cases, the first deck of the memory device may be included in a first set of decks (e.g., a first deck of memory cells of array layer 1157-*a* that may include a quantity of decks of memory cells) and the second deck of the memory device may be included in a second set of decks (e.g., a second deck of memory cells of array layer 1157-*b* that may include a quantity of decks of memory cells). In some cases, the memory device may further include decoder circuitry (e.g., a layer of TFT circuit 1158) between the first set of decks (e.g., array layer 1157-*a*) and the second set of decks (e.g., array layer 1157-*b*), where the decoder circuitry may be configured to select one or more decks among the decks of the first set (e.g., array layer 1157-*a*) and the decks of the second set (e.g., array layer 1157-*b*).

In some cases, the memory array may be at a deck included in a set of decks (e.g., a deck of memory cells of array layer 1157-*a* that may include a quantity of decks of memory cells) of the memory device and the memory device may further include decoder circuitry (e.g., decoder circuitry described with reference to FIG. 9) included in the deck and configured to activate a transistor of the set of transistors based on selecting a gate electrode for the transistor from a corresponding set of gate electrodes included in the deck.

Figure 12:
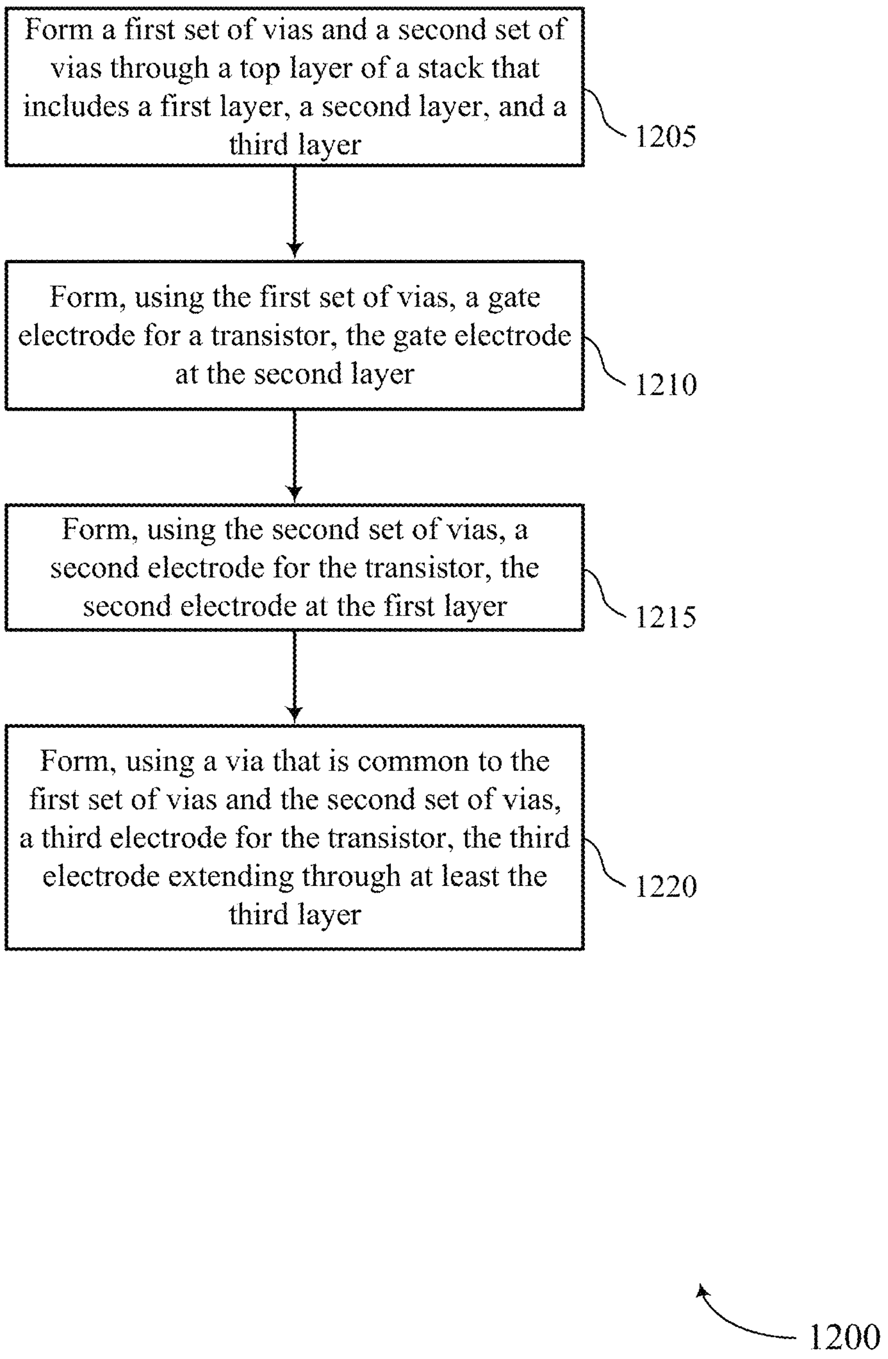
FIGS. 12 through 14 illustrate methods that support thin film transistors and related fabrication techniques in accordance with embodiments of the present disclosure.

FIG. 12 illustrates a method 1200 that supports thin film transistors and related fabrication techniques in accordance with embodiments of the present disclosure. The operations of method 1200 may be implemented by the method described herein, for example with reference to FIGS. 3A through 3L.

At block 1205 a first set of vias and a second set of vias may be formed through a top layer of a stack that includes a first layer, a second layer, and a third layer. The operations of block 1205 may be performed according to the methods described herein. In certain examples, aspects of the operations of block 1205 may be performed as part of one or more processes as described with reference to FIGS. 3A through 3L.

At block 1210 a gate electrode for a transistor may be formed using the first set of vias, the gate electrode at the second layer. The operations of block 1210 may be performed according to the methods described herein. In certain examples, aspects of the operations of block 1210 may be performed as part of one or more processes as described with reference to FIGS. 3A through 3L.

At block 1215 a second electrode for the transistor may be formed using the second set of vias, the second electrode at the first layer. The operations of block 1215 may be performed according to the methods described herein. In certain examples, aspects of the operations of block 1215 may be performed as part of one or more processes as described with reference to FIGS. 3A through 3L.

At block 1220 a third electrode for the transistor may be formed using a via that is common to the first set of vias and the second set of vias, the third electrode extending through at least the third layer. The operations of block 1220 may be performed according to the methods described herein. In certain examples, aspects of the operations of block 1220 may be performed as part of one or more processes as described with reference to FIGS. 3A through 3L.

In some examples of the method 1200 described herein, forming the gate electrode for the transistor may include forming a channel at the second layer that is aligned with the first set of vias, forming an insulating material that conforms to the channel, and filling the channel with an electrode material based on forming the insulating material. In some cases, the method 1200 may also include removing, using the via, a portion of the gate electrode to form a cavity at the second layer, and forming, using the via, oxide material in the cavity at the second layer and in contact with the gate electrode. In some cases, the method 1200 may also include removing, using the via, a portion of the second electrode to form a cavity at the first layer, and forming, using the via, ohmic material in the cavity at the first layer and in contact with the second electrode. In some cases, the method 1200 may also include forming, using the via, a cavity that spans the first layer and the second layer, and forming, using the via, semiconductor material in the cavity that spans the first layer and the second layer.

In some cases, the method 1200 may also include forming, using the via, an insulating material in contact with the semiconductor material. In some cases, the method 1200 may also include forming, using the via, a cavity at the third layer and forming, using the via, ohmic material in the cavity at the third layer and in contact with the third electrode. In some examples of the method 1200 described herein, forming the third electrode for the transistor may include forming, using the via, a hole through the stack to a layer of logic circuitry and filling the hole with an electrode material. In some examples of the method 1200 described herein, forming the second electrode for the transistor may include forming a channel at the first layer that is aligned with the second set of vias, where the second set of vias forms a second row of vias that intersects a first row of vias formed by the first set of vias, filling the channel at the first layer with an electrode material, and forming a set of dielectric plugs corresponding to the second set of vias, where the dielectric plugs extend through the electrode material in the channel at the first layer.

Figure 13:
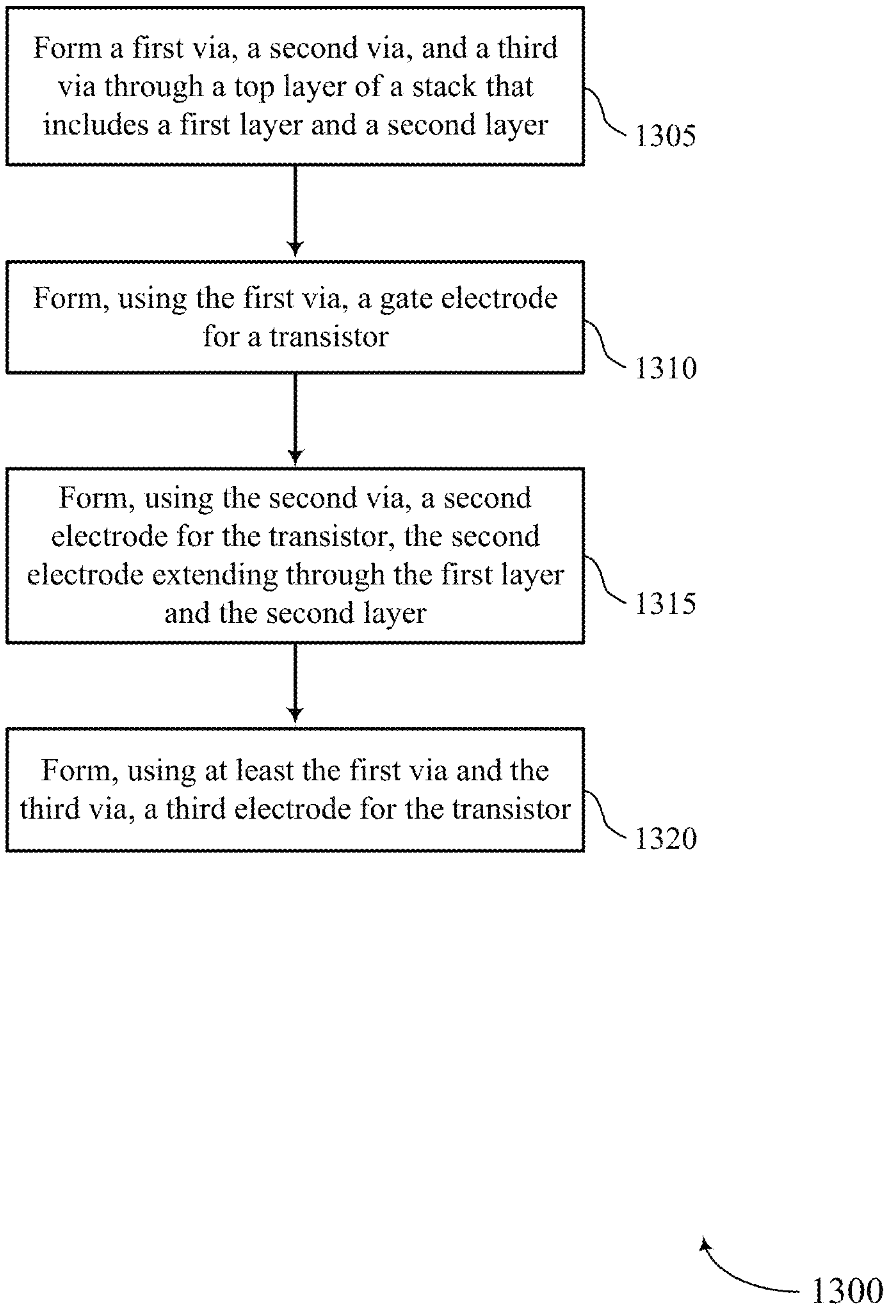

FIG. 13 illustrates a method 1300 that supports thin film transistors and related fabrication techniques in accordance with embodiments of the present disclosure. The operations of method 1300 may be implemented by the method described herein, for example with reference to FIGS. 4A through 4AA.

At block 1305 a first via, a second via, and a third via may be formed through a top layer of a stack that includes a first layer and a second layer. The operations of block 1305 may be performed according to the methods described herein. In certain examples, aspects of the operations of block 1305 may be performed as part of one or more processes as described with reference to FIGS. 4A through 4AA.

At block 1310 a gate electrode for a transistor may be formed using the first via. The operations of block 1310 may be performed according to the methods described herein. In certain examples, aspects of the operations of block 1310 may be performed as part of one or more processes as described with reference to FIGS. 4A through 4AA.

At block 1315 a second electrode for the transistor may be formed using the second via, the second electrode extending through the first layer and the second layer. The operations of block 1315 may be performed according to the methods described herein. In certain examples, aspects of the operations of block 1315 may be performed as part of one or more processes as described with reference to FIGS. 4A through 4AA.

At block 1320 a third electrode for the transistor may be formed using at least the first via and the third via. The operations of block 1320 may be performed according to the methods described herein. In certain examples, aspects of the operations of block 1320 may be performed as part of one or more processes as described with reference to FIGS. 4A through 4AA.

In some examples of the method 1300 described herein, forming the gate electrode for the transistor may include forming a channel at the second layer using a set of vias that includes the first via, forming an insulating material that is conformal with the channel at the second layer, and filling the first channel with an electrode material that contacts the insulating material. In some cases, the method 1300 may also include forming, using the first via, a cavity at the first layer to expose at least a portion of the gate electrode, forming, using the first via, an oxide material in contact with the gate electrode based on forming the cavity, and forming, using the first via, a semiconductor material in the cavity at the first layer and in contact with the oxide material.

In some cases, the method 1300 may also include forming, using at least the second via, a second cavity at the first layer to expose at least a portion of the third electrode and the semiconductor material, forming, using the third via, a third cavity at the first layer to expose the semiconductor material, and filling the second cavity and the third cavity at the first layer with an ohmic material. In some examples of the method 1300 described herein, forming the third electrode for the transistor may include forming a first channel at the first layer using the at least the first via and the third via, filling the first channel at the first layer with an electrode material, forming, in the electrode material within the first channel at the first layer, a second channel that is narrower than the first channel, and filling the second channel with a dielectric material. In some examples of the method 1300 described herein, forming the second electrode for the transistor may include forming, using the second via, a hole through the stack to a layer of logic circuitry and filling the hole with an electrode material.

Figure 14:
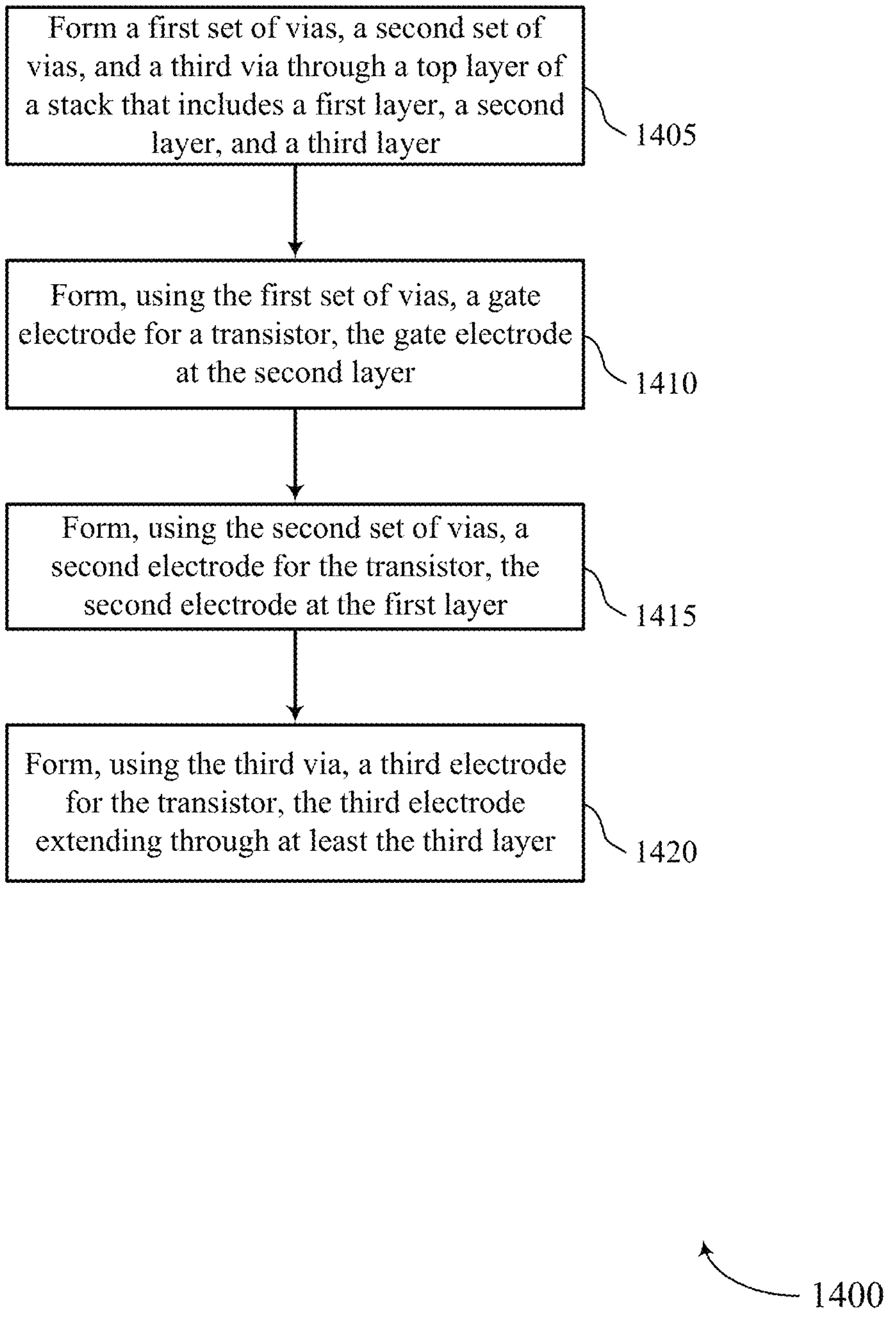

FIG. 14 illustrates a method 1400 that supports thin film transistors and related fabrication techniques in accordance with embodiments of the present disclosure. The operations of method 1400 may be implemented by the method described herein, for example with reference to FIGS. 5A through 5N or FIGS. 6A through 6R.

At block 1405 a first set of vias, a second set of vias, and a third via may be formed through a top layer of a stack that comprises a first layer, a second layer, and a third layer. The operations of block 1405 may be performed according to the methods described herein. In certain examples, aspects of the operations of block 1405 may be performed as part of one or more processes as described with reference to FIGS. 5A through 5N or FIGS. 6A through 6R.

At block 1410 a gate electrode for a transistor may be formed using the first set of vias, the gate electrode at the second layer. The operations of block 1410 may be performed according to the methods described herein. In certain examples, aspects of the operations of block 1410 may be performed as part of one or more processes as described with reference to FIGS. 5A through 5N or FIGS. 6A through 6R.

At block 1415 a second electrode for the transistor may be formed using the second set of vias, the second electrode at the first layer. The operations of block 1415 may be performed according to the methods described herein. In certain examples, aspects of the operations of block 1415 may be performed as part of one or more processes as described with reference to FIGS. 5A through 5N or FIGS. 6A through 6R.

At block 1420 a third electrode for the transistor may be formed using the third via, the third electrode extending through at least the third layer. The operations of block 1420 may be performed according to the methods described herein. In certain examples, aspects of the operations of block 1420 may be performed as part of one or more processes as described with reference to FIGS. 5A through 5N or FIGS. 6A through 6R.

In some examples of the method 1400 described herein, forming the gate electrode for the transistor may include forming a channel at the second layer that using the first set of vias, forming an insulating material in contact with the channel at the second layer, filling the channel at the second layer with an electrode material, and forming, using the first set of vias, a corresponding set of holes that extend through the electrode material. In some cases, the method 1400 may also include forming a third set of vias through the top layer of the stack and forming, using the third set of vias, a cavity that spans the first layer, the second layer, and the third layer, where the cavity that spans the first layer, the second layer, and the third layer exposes an insulating material conformal with the gate electrode.

In some cases, the method 1400 may also include removing, using the third set of vias, a portion of the insulating material in contact with the gate electrode, forming, using the third set of vias, an oxide material in contact with the gate electrode after removing the portion of the insulating material, and filling the cavity that spans the first layer, second layer, and third layer with a semiconductor material in contact with the oxide material. In some cases, the method 1400 may also include forming a hole through the semiconductor material to a layer of logic circuitry and filling the hole with an electrode material to form a fourth electrode for the transistor.

In some cases, the method 1400 may also include forming, using the third via, a cavity at the first layer to expose the semiconductor material and the second electrode, filling, using the third via, the cavity at the first layer with an ohmic material, the ohmic material in contact with the semiconductor material and the second electrode, removing, using the third via, a portion of the ohmic material, forming, using the third via, an insulating material in contact with the ohmic material, and forming, using the third via, the ohmic material at the third layer and in contact with the semiconductor material.

In some cases, the method 1400 may also include filling the cavity that spans the first layer, second layer, and third layer with an ohmic material, forming, using a subset of the third set of vias and the third via, a second cavity that spans the first layer, the second layer, and the third layer, and filling the second cavity that spans the first layer, second layer, and third layer with a semiconductor material. In some cases, the method 1400 may also include forming, using the third via, a hole through the first layer, second layer, and third layer, forming, using the third via, an insulating material in contact with the semiconductor material at the first layer and the second layer, forming, using the third via, a cavity at the third layer, and filling the cavity at the third layer with the ohmic material. In some examples of the method 1400 described herein, forming the third electrode for the transistor may include forming, using the third via, a hole through the stack to a layer of logic circuitry, and filling the hole with an electrode material.

Figure 15:
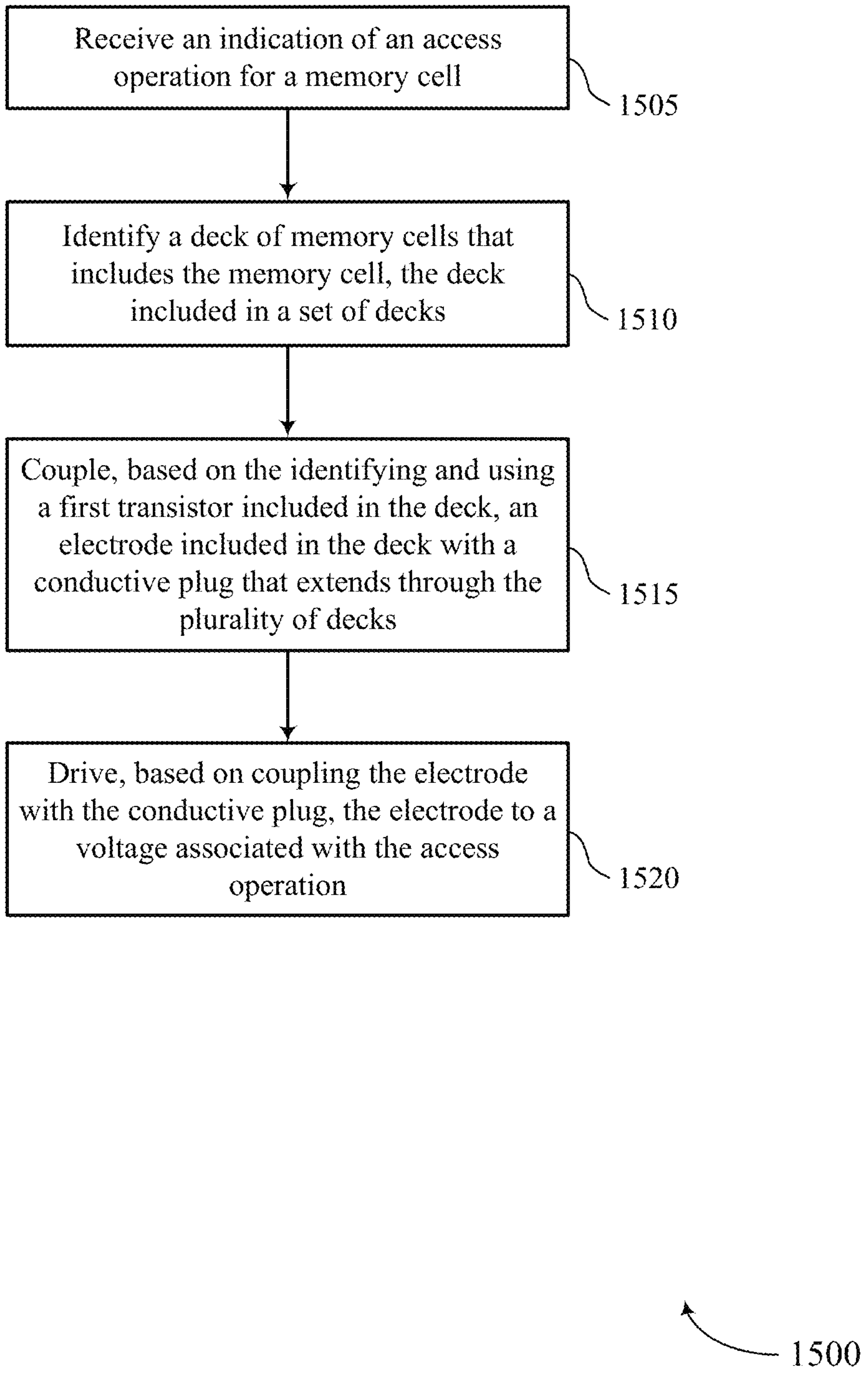
FIGS. 15 and 16 illustrate methods that support thin film transistors and related fabrication techniques in accordance with embodiments of the present disclosure.

FIG. 15 illustrates a method 1500 that supports thin film transistors and related fabrication techniques in accordance with embodiments of the present disclosure. The operations of method 1500 may be implemented by a controller or its components as described herein. For example, the operations of method 1500 may be performed by a controller (e.g., memory controller 140 described with reference to FIG. 1). In some examples, a controller may execute a set of instructions to control the functional elements of the memory array to perform the functions described herein. Additionally or alternatively, a controller may perform aspects of the functions described herein using special-purpose hardware.

At block 1505 the controller may receive an indication of an access operation for a memory cell. The operations of block 1505 may be performed according to the methods described herein. In certain examples, aspects of the operations of block 1505 may be performed as part of one or more processes as described with reference to FIGS. 7C, 7D, 8A-8C, and 9.

At block 1510 the controller may identify a deck of memory cells that includes the memory cell, the deck included in a set of decks. The operations of block 1510 may be performed according to the methods described herein. In certain examples, aspects of the operations of block 1510 may be performed as part of one or more processes as described with reference to FIGS. 7C, 7D, 8A-8C, and 9.

At block 1515 the controller may couple, based on the identifying and using a first transistor included in the deck, an electrode included in the deck with a conductive plug that extends through the set of decks. The operations of block 1515 may be performed according to the methods described herein. In certain examples, aspects of the operations of block 1515 may be performed as part of one or more processes as described with reference to FIGS. 7C, 7D, 8A-8C, and 9.

At block 1520 the controller may drive, based on coupling the electrode with the conductive plug, the electrode to a voltage associated with the access operation. The operations of block 1520 may be performed according to the methods described herein. In certain examples, aspects of the operations of block 1520 may be performed as part of one or more processes as described with reference to FIGS. 7C, 7D, 8A-8C, and 9.

An apparatus for performing a method or methods, such as the method 1500, is described. The apparatus may include means for receiving an indication of an access operation for a memory cell, means for identifying a deck of memory cells that includes the memory cell, the deck included in a set of decks, means for coupling, based on the identifying and using a first transistor included in the deck, an electrode included in the deck with a conductive plug that extends through the set of decks, and means for driving, based on coupling the electrode with the conductive plug, the electrode to a voltage associated with the access operation.

Another apparatus for performing a method or methods, such as the method 1500, is described. The apparatus may include a memory array and a memory controller in electronic communication with the memory array, where the memory controller may be operable to receive an indication of an access operation for a memory cell, identify a deck of memory cells that includes the memory cell, the deck included in a set of decks, couple, based on the identifying and using a first transistor included in the deck, an electrode included in the deck with a conductive plug that extends through the set of decks, and drive, based on coupling the electrode with the conductive plug, the electrode to a voltage associated with the access operation.

Some examples of the method 1500 and apparatuses described herein may further include processes, features, means, or instructions for coupling, based on the identifying and using a second transistor included in the deck, a second electrode included in the deck with a second conductive plug that extends through the set of decks. Some examples of the method 1500 and apparatuses described herein may further include processes, features, means, or instructions for driving, based coupling the second electrode with the second conductive plug, the second electrode to a second voltage associated with the access operation. Some examples of the method 1500 and apparatuses described herein may further include processes, features, means, or instructions for coupling, based on the identifying and using a third transistor included in a second deck of the set of decks, the electrode included in the deck with the conductive plug. Some examples of the method 1500 and apparatuses described herein may further include processes, features, means, or instructions for coupling, based on the identifying and using a fourth transistor included in a third deck of the set of decks, the second electrode included in the deck with the second conductive plug, where the deck may be between the second deck and the third deck.

In some examples of the method 1500 and apparatuses described herein, the electrode may include an access line of a first type. Some examples of the method 1500 and apparatuses described herein may further include processes, features, means, or instructions for coupling, based on the identifying and using transistors included in a subset of the decks of the set of decks, access lines of the first type included in each deck of the subset with a third conductive plug that extends through the set of decks, where the subset excludes the deck. Some examples of the method 1500 and apparatuses described herein may further include processes, features, means, or instructions for driving, based on coupling the access lines of the first type included in each deck of the subset with the third conductive plug, the access lines of the first type included in each deck of the subset to a third voltage associated with the access operation.

Figure 16:
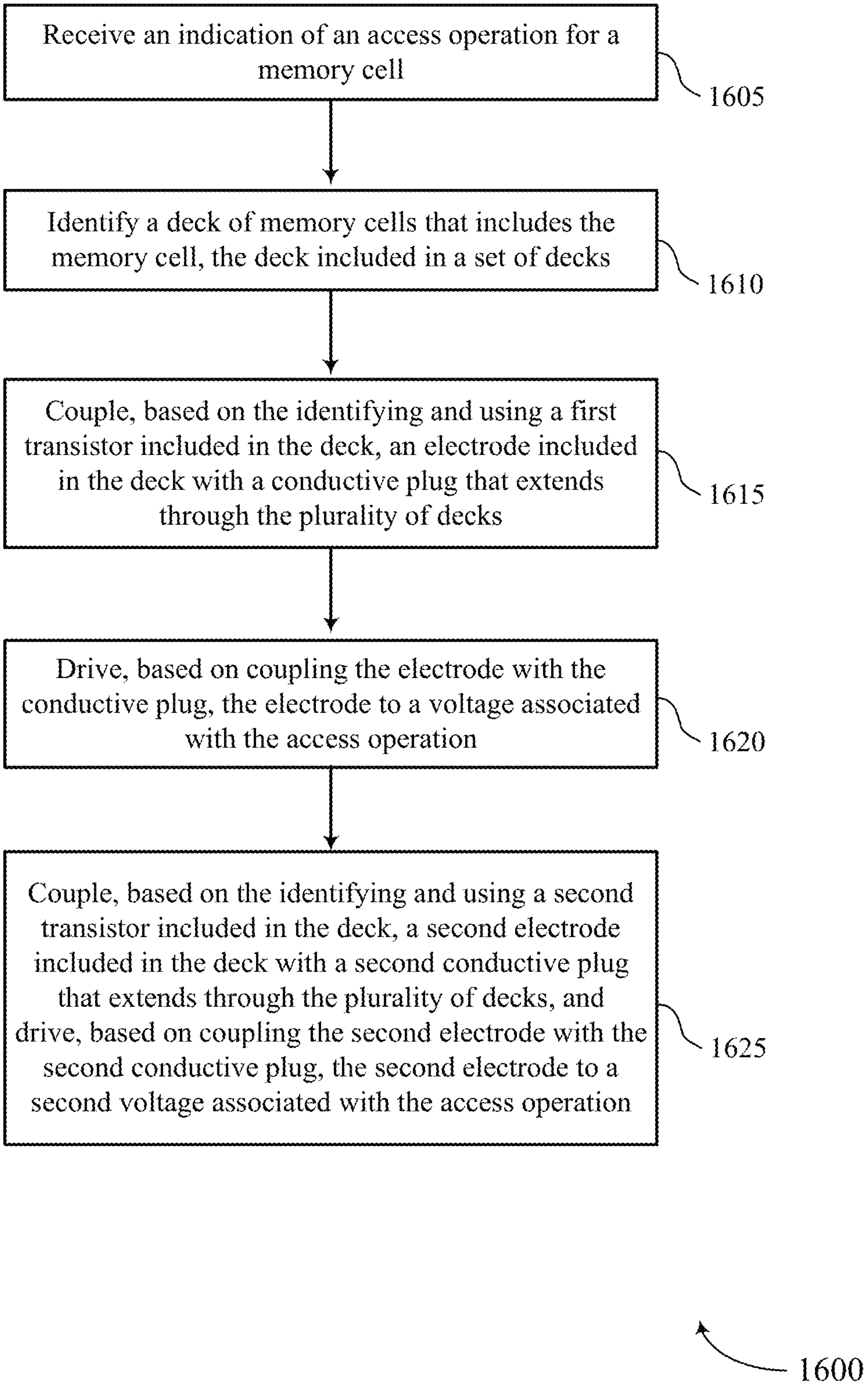

FIG. 16 illustrates a method 1600 that supports thin film transistors and related fabrication techniques in accordance with embodiments of the present disclosure. The operations of method 1600 may be implemented by a controller or its components as described herein. For example, the operations of method 1600 may be performed by a controller (e.g., memory controller 140 described with reference to FIG. 1). In some examples, a controller may execute a set of instructions to control the functional elements of the memory array to perform the functions described herein. Additionally or alternatively, a controller may perform aspects of the functions described herein using special-purpose hardware.

At block 1605 the controller may receive an indication of an access operation for a memory cell. The operations of block 1605 may be performed according to the methods described herein. In certain examples, aspects of the operations of block 1605 may be performed as part of one or more processes as described with reference to FIGS. 7C, 7D, 8A-8C, and 9.

At block 1610 the controller may identify a deck of memory cells that includes the memory cell, the deck included in a set of decks. The operations of block 1610 may be performed according to the methods described herein. In certain examples, aspects of the operations of block 1610 may be performed as part of one or more processes as described with reference to FIGS. 7C, 7D, 8A-8C, and 9.

At block 1615 the controller may couple, based on the identifying and using a first transistor included in the deck, an electrode included in the deck with a conductive plug that extends through the set of decks. The operations of block 1615 may be performed according to the methods described herein. In certain examples, aspects of the operations of block 1615 may be performed as part of one or more processes as described with reference to FIGS. 7C, 7D, 8A-8C, and 9.

At block 1620 the controller may drive, based on coupling the electrode with the conductive plug, the electrode to a voltage associated with the access operation. The operations of block 1620 may be performed according to the methods described herein. In certain examples, aspects of the operations of block 1620 may be performed as part of one or more processes as described with reference to FIGS. 7C, 7D, 8A-8C, and 9.

An apparatus for performing a method or methods, such as the method 1600, is described. The apparatus may include means for receiving an indication of an access operation for a memory cell, means for identifying a deck of memory cells that includes the memory cell, the deck included in a set of decks, means for coupling, based on the identifying and using a first transistor included in the deck, an electrode included in the deck with a conductive plug that extends through the set of decks, means for driving, based on coupling the electrode with the conductive plug, the electrode to a voltage associated with the access operation, means for coupling, based on the identifying and using a second transistor included in the deck, a second electrode included in the deck with a second conductive plug that extends through the set of decks, and means for driving, based on coupling the second electrode with the second conductive plug, the second electrode to a second voltage associated with the access operation.

Another apparatus for performing a method or methods, such as the method 1600, is described. The apparatus may include a memory array and a memory controller in electronic communication with the memory array, where the memory controller may be operable to receive an indication of an access operation for a memory cell, identify a deck of memory cells that includes the memory cell, the deck included in a set of decks, couple, based on the identifying and using a first transistor included in the deck, an electrode included in the deck with a conductive plug that extends through the set of decks, drive, based on coupling the electrode with the conductive plug, the electrode to a voltage associated with the access operation, couple, based on the identifying and using a second transistor included in the deck, a second electrode included in the deck with a second conductive plug that extends through the set of decks, and drive, based on coupling the second electrode with the second conductive plug, the second electrode to a second voltage associated with the access operation.

It should be noted that the methods described herein describe possible implementations, and that the operations and the steps may be rearranged or otherwise modified and that other implementations are possible. Further, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory device 100.

Chalcogenide materials may be materials or alloys that include at least one of the elements S, Se, and Te. Chalcogenide materials may include alloys of S, Se, Te, Ge, As, Al, Si, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Embodiments are not limited to a particular variable resistance material or materials associated with the memory components of the memory cells. For example, other examples of variable resistance materials can be used to form memory components and may include chalcogenide materials, colossal magnetoresistive materials, or polymer-based materials, among others.

The term "isolated" refers to a relationship between components in which electrons are not presently capable of flowing between them; components are isolated from each other if there is an open circuit between them. For example, two components physically connected by a switch may be isolated from each other when the switch is open.

The devices discussed herein, including a memory device 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a four terminal device including a source, drain, gate, and body (or substrate). The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel that may be part of the body. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an ASIC, a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such a configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, read only memory (ROM), electrically erasable programmable ROM (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
- a conductive plug that extends through a stack that comprises a first layer, a second layer, and a third layer;
- a gate electrode at the second layer;
- a second electrode at the first layer; and
- a semiconductor material at the first layer and the second layer, the semiconductor material coupled with the second electrode via a first segment of ohmic material at the first layer and coupled with the conductive plug via a second segment of ohmic material at the third layer.

2. The apparatus of claim 1, wherein the semiconductor material at the first layer and the second layer extends into the third layer.

3. The apparatus of claim 1, further comprising:
- a dielectric plug that extends through the gate electrode.

4. The apparatus of claim 3, wherein the dielectric plug extends through the first layer, the second layer, the third layer, and at least a portion of the semiconductor material.

5. The apparatus of claim 1, wherein the gate electrode is of a thin-film-transistor (TFT) and the second electrode is of the TFT, the apparatus further comprising:
- a gate electrode, of a second TFT, that is at a fourth layer below the third layer, wherein the semiconductor material is coupled with the gate electrode of the second TFT at the fourth layer; and
- a second electrode, of the second TFT, that is at a fifth layer below the fourth layer, wherein the semiconductor material is coupled with the second electrode of the second TFT at the fifth layer.

6. The apparatus of claim 1, wherein conductive plug extends through the third layer of the stack.

7. The apparatus of claim 1, wherein the gate electrode comprises an electrode material formed within the second layer of the stack, the apparatus further comprising:
- an insulating material in contact with a first side the gate electrode.

8. The apparatus of claim 7, further comprising:
- an oxide material in contact with a second side of the gate electrode that is opposite the first side.

9. The apparatus of claim 7, further comprising:
- a first segment of an insulating material in contact with the first segment of ohmic material; and
- a second segment of an insulating material in contact with the second segment of ohmic material.

10. The apparatus of claim 1, further comprising:
- an insulating material in contact with the semiconductor material at the first layer and the second layer.

11. An apparatus, comprising:
- a conductive element coupled with a node of a driver;
- a conductive plug that is coupled with the conductive element and that extends through a stack that comprises a first layer, a second layer, and a third layer, the second layer between the first layer and the third layer;
- a gate electrode at the second layer;
- a second electrode at the first layer; and
- a semiconductor material at the first layer and the second layer, the semiconductor material coupled with the second electrode via a first segment of ohmic material at the first layer and coupled with the conductive plug via a second segment of ohmic material at the third layer.

12. The apparatus of claim 11, wherein the semiconductor material at the first layer and the second layer extends into the third layer, the apparatus further comprising:
- a dielectric plug that extends through the gate electrode, wherein the dielectric plug extends through the first layer, the second layer, the third layer, and at least a portion of the semiconductor material.

13. The apparatus of claim 11, wherein the gate electrode is of a thin-film-transistor (TFT) and the second electrode is of the TFT, the apparatus further comprising:
- a gate electrode, of a second TFT, that is at a fourth layer below the third layer, wherein the semiconductor material is coupled with the gate electrode of the second TFT at the fourth layer; and
- a second electrode, of the second TFT, that is at a fifth layer below the fourth layer, wherein the semiconductor material is coupled with the second electrode of the second TFT at the fifth layer.

14. The apparatus of claim 11, wherein the gate electrode comprises an electrode material formed within the second layer of the stack, the apparatus further comprising:
- an insulating material in contact with a first side the gate electrode; and
- an oxide material in contact with a second side of the gate electrode that is opposite the first side.

15. The apparatus of claim 11, wherein the gate electrode comprises an electrode material formed within the second layer of the stack, the apparatus further comprising:
- an insulating material in contact with a first side the gate electrode;
- a first segment of an insulating material in contact with the first segment of ohmic material; and
- a second segment of an insulating material in contact with the second segment of ohmic material.

16. An apparatus, comprising:
- a conductive plug that extends through a stack that comprises a first layer, a second layer, and a third layer;
- an insulating material at the second layer, the insulating material between the conductive plug and a gate electrode that is at the second layer;

a second electrode at the first layer; and a semiconductor material at the first layer and the second layer, the semiconductor material coupled with the second electrode at the first layer and coupled with the conductive plug at the third layer.

17. The apparatus of claim 16, wherein the semiconductor material at the first layer and the second layer extends into the third layer, the apparatus further comprising:

a dielectric plug that extends through the gate electrode, wherein the dielectric plug extends through the first layer, the second layer, the third layer, and at least a portion of the semiconductor material.

18. The apparatus of claim 16, wherein the gate electrode is of a thin-film-transistor (TFT) and the second electrode is of the TFT, the apparatus further comprising:

a gate electrode, of a second TFT, that is at a fourth layer below the third layer, wherein the semiconductor material is coupled with the gate electrode of the second TFT at the fourth layer; and a second electrode, of the second TFT, that is at a fifth layer below the fourth layer, wherein the semiconductor material is coupled with the second electrode of the second TFT at the fifth layer.

19. The apparatus of claim 16, wherein the gate electrode comprises an electrode material formed within the second layer of the stack, the apparatus further comprising:

an insulating material in contact with a first side the gate electrode; and an oxide material in contact with a second side of the gate electrode that is opposite the first side.

20. The apparatus of claim 16, wherein the gate electrode comprises an electrode material formed within the second layer of the stack, the apparatus further comprising:

an insulating material in contact with a first side the gate electrode;

a first segment of an insulating material in contact with the first segment of ohmic material; and a second segment of an insulating material in contact with the second segment of ohmic material.

* * * * *